United States Patent
De et al.

(10) Patent No.: US 12,431,333 B2
(45) Date of Patent: Sep. 30, 2025

(54) SYSTEMS, DEVICES, AND METHODS FOR ALIGNING A PARTICLE BEAM AND PERFORMING A NON-CONTACT ELECTRICAL MEASUREMENT ON A CELL AND/OR NON-CONTACT ELECTRICAL MEASUREMENT CELL VEHICLE USING A REGISTRATION CELL

(71) Applicant: PDF SOLUTIONS, INC., Santa Clara, CA (US)

(72) Inventors: Indranil De, Alameda, CA (US); Jeremy Cheng, San Jose, CA (US); Thomas Sokollik, Santa Clara, CA (US); Yoram Schwarz, Santa Clara, CA (US); Stephen Lam, Fremont, CA (US); Xumin Shen, Santa Clara, CA (US)

(73) Assignee: PDF SOLUTIONS, INC., Santa Clara, CA (US)

( * ) Notice: Subject to any disclaimer, the term of this patent is extended or adjusted under 35 U.S.C. 154(b) by 0 days.

(21) Appl. No.: 18/663,041

(22) Filed: May 13, 2024

(65) Prior Publication Data
US 2024/0304414 A1    Sep. 12, 2024

Related U.S. Application Data

(63) Continuation of application No. 18/108,583, filed on Feb. 11, 2023, now Pat. No. 12,020,897, which is a (Continued)

(51) Int. Cl.
*G01R 31/265*    (2006.01)
*G01R 31/306*    (2006.01)
(Continued)

(52) U.S. Cl.
CPC ...... *H01J 37/3175* (2013.01); *G01R 31/2653* (2013.01); *G01R 31/306* (2013.01); *H01J 37/3005* (2013.01); *H01J 2237/31762* (2013.01)

(58) Field of Classification Search
CPC ............ G01R 31/2653; G01R 31/2884; G01R 31/305; G01R 31/307; G01R 31/311; G01R 31/66
See application file for complete search history.

(56) References Cited

U.S. PATENT DOCUMENTS 3,761,721 A    9/1973    Altshuler et al.
5,298,755 A    3/1994    Wuest et al.
(Continued)

OTHER PUBLICATIONS

E. Menzel, "Electron Beam Testing Techniques," Microelectronic Engineering 16, Elsevier, 1992.
(Continued)

*Primary Examiner* — Tung X Nguyen
(74) *Attorney, Agent, or Firm* — Resonance IP Law, PC

(57) ABSTRACT

Systems, devices, and methods for performing a non-contact electrical measurement (NCEM) on a NCEM-enabled cell included in a NCEM-enabled cell vehicle may be configured to perform NCEMs while the NCEM-enabled cell vehicle is moving. The movement may be due to vibrations in the system and/or movement of a movable stage on which the NCEM-enabled cell vehicle is positioned. Position information for an electron beam column producing the electron beam performing the NCEMs and/or for the moving stage may be used to align the electron beam with targets on the NCEM-enabled cell vehicle while it is moving.

5 Claims, 31 Drawing Sheets

Related U.S. Application Data continuation of application No. 17/739,063, filed on May 6, 2022, now Pat. No. 11,605,526, which is a continuation of application No. 17/061,401, filed on Oct. 1, 2020, now Pat. No. 11,328,899.

(60) Provisional application No. 62/945,558, filed on Dec. 9, 2019, provisional application No. 62/909,046, filed on Oct. 1, 2019.

(51) Int. Cl.
*H01J 37/30* (2006.01)
*H01J 37/317* (2006.01)

(56) References Cited

U.S. PATENT DOCUMENTS

| | | | |
|---|---|---|---|
| 5,716,742 | A | 2/1998 | Doran |
| 6,040,583 | A | 3/2000 | Onoda |
| 6,541,759 | B1 | 4/2003 | Hill |
| 6,771,077 | B2 | 8/2004 | Hamamura et al. |
| 6,856,402 | B2 | 2/2005 | Hill |
| 7,109,483 | B2 | 9/2006 | Nakasuji et al. |
| 7,683,317 | B2 | 3/2010 | Shemesh |
| 8,211,596 | B2 | 7/2012 | Holmes |
| 8,384,048 | B2 | 2/2013 | Wiesner |
| 8,946,628 | B2 | 2/2015 | Harada et al. |
| 9,000,395 | B2 | 4/2015 | Ren et al. |
| 9,443,696 | B2 | 9/2016 | Jiang et al. |
| 2002/0093350 | A1* | 7/2002 | Yamada ............... G01R 31/307 324/754.22 |
| 2006/0218517 | A1 | 9/2006 | Siegler et al. |
| 2008/0267489 | A1* | 10/2008 | Xiao ..................... G06T 7/001 382/147 |
| 2009/0102501 | A1 | 4/2009 | Guldi et al. |
| 2010/0006896 | A1 | 1/2010 | Uemura |
| 2010/0258798 | A1 | 10/2010 | Sokel et al. |
| 2011/0072407 | A1 | 3/2011 | Keinert et al. |
| 2012/0116703 | A1 | 5/2012 | Pavillon et al. |
| 2013/0300454 | A1 | 11/2013 | DiMarzio et al. |
| 2014/0299767 | A1 | 10/2014 | Bizen et al. |
| 2016/0276128 | A1 | 9/2016 | Ikeda et al. |

OTHER PUBLICATIONS

E. Wolfgang, "Electron beam testing," Microelectronic Engineering 4, North-Holland, 1986.

FJ Hohn, et al., "Electron Beam Testing And Its Application To Packaging Modules For Very Large Scale Integrated (VLSI) Chip Arrays," Proc. SPIE 0333, Submicron Lithography I, Jun. 30, 1982.

Hess, Christopher et al. "Logic Characterization Vehicle to Determine Process Variation Impact on Yield and Performance of Digital Circuits", IEEE 2002 Int. Conference on Microelectronic Test Structures, vol. 15, Apr. 2002.

Huber et al. "Characterization of Printed Circuit Board Material & Manufacturing Technology for High Frequency", IPC Apex Expo Conference Proceedings, 2015.

International Search Report for PCT/US2016/067050, Published Dec. 11, 2017.

JTL Thong, ed., "Electron Beam Testing Technology," Springer, 1993.

M. Bolorizadeh, "The Effects of Fast Secondary Electrons on Low Voltage Electron Beam Lithography," PhD diss., University of Tennessee, 2006.

McDermott et al. "Long Term Thermal Reliability of Printed Circuit Board Materials", IPC Apex Expo Conference Proceedings.

Qi et al. "Effects of Printed Circuit Board Materials on Lead-free Interconnect Durability", 5th International Conference on Polymers and Adhesives in Microelectronics and Photonics, 2005.

Rakov, Aleksei. "Wideband characterization of printed circuit board materials up to 50 GHz." Missouri University of Science and Technology—Master's Thesis, 2013.

SCJ Garth, "Electron beam testing of ultra large scale integrated circuits," Microelectronic Engineering 4, North-Holland, 1986.

\* cited by examiner

501

Detected Electron Intensity as a Function of Displacement along the X-axis

502

Detected Electron Intensity as a Function of Displacement along the X-axis

800

805 Receive a first indication of a time between emission of a first compound beam and receipt of a reflection of the first compound beam the first compound beam having been incident on a first mirror of a stage and a first mirror of an electron beam column

810 Determine a path length for the first compound beam signal

815 Determine a position of the first mirror of the electron beam column relative to the first mirror of the stage in a first dimension

820 Receive a second indication of a time between emission of a second compound beam and receipt of a reflection of the second compound beam the second compound beam having been incident on a second mirror of a stage and a second mirror of an electron beam column

825 Determine a path length for the second compound beam signal

830 Determine a position of the second mirror of the electron beam column relative to the second mirror of the stage in a first dimension

```
┌─────────────────────────────────────────────────────────────────────────────┐
│ Receive a recipe for a NCEM-enabled cell vehicle and/or parameters for a    │
│ movable stage and/or electron beam column                                   │
│                                 905                                         │
└─────────────────────────────────────────────────────────────────────────────┘
                                     ↓
┌─────────────────────────────────────────────────────────────────────────────┐
│ Determine an expected position of a tile, registration cell, and/or         │
│ components included within a registration cell as the tile moves along      │
│ with the stage                                                              │
│                                 910                                         │
└─────────────────────────────────────────────────────────────────────────────┘
                                     ↓
┌─────────────────────────────────────────────────────────────────────────────┐
│ Receive position and motion information for an electron beam column and/or  │
│ the stage on which NCEM-enabled cell vehicle is positioned over time        │
│                                 915                                         │
└─────────────────────────────────────────────────────────────────────────────┘
                                     ↓
┌─────────────────────────────────────────────────────────────────────────────┐
│ Direct an electron beam toward the registration NCEM-enabled cell for a     │
│ time period sufficient to test the registration NCEM-enabled cell           │
│                                 920                                         │
└─────────────────────────────────────────────────────────────────────────────┘
                                     ↓
┌─────────────────────────────────────────────────────────────────────────────┐
│ Receive an indication of a response of the NCEM-enabled registration cell   │
│ to the electron beam and/or a detector image                                │
│                                 925                                         │
└─────────────────────────────────────────────────────────────────────────────┘
                                     ↓
┌─────────────────────────────────────────────────────────────────────────────┐
│ Determine an actual position of the NCEM-enabled registration cell and/or   │
│ components included within the NCEM-enabled registration cell               │
│                                 930                                         │
└─────────────────────────────────────────────────────────────────────────────┘
                                     ↓
┌─────────────────────────────────────────────────────────────────────────────┐
│ Determine an actual position of the tile, NCEM-enabled cell vehicle,        │
│ and/or NCEM-enabled cells                                                   │
│                                 935                                         │
└─────────────────────────────────────────────────────────────────────────────┘
                                     ↓
┌─────────────────────────────────────────────────────────────────────────────┐
│                         Align the electron beam                             │
│                                 940                                         │
└─────────────────────────────────────────────────────────────────────────────┘
                                     ↓
┌─────────────────────────────────────────────────────────────────────────────┐
│                                 945                                         │
└─────────────────────────────────────────────────────────────────────────────┘
```

FIG. 9A

SYSTEMS, DEVICES, AND METHODS FOR ALIGNING A PARTICLE BEAM AND PERFORMING A NON-CONTACT ELECTRICAL MEASUREMENT ON A CELL AND/OR NON-CONTACT ELECTRICAL MEASUREMENT CELL VEHICLE USING A REGISTRATION CELL

RELATED APPLICATIONS

This application is a CONTINUATION patent application of U.S. application Ser. No. 18/108,583, filed 11 Feb. 2023, which is a CONTINUATION patent application of U.S. application Ser. No. 17/739,063, filed 6 May 2022 which is a CONTINUATION patent application of U.S. application Ser. No. 17/061,401, filed 1 Oct. 2020 which is a NON-PROVISIONAL patent application of and claims priority to U.S. Provisional Application No. 62/909,046, filed 1 Oct. 2019, and entitled "SYSTEMS, DEVICES, AND METHODS FOR ALIGNING A NON-CONTACT ELECTRICAL MEASUREMENT WHILE INSPECTING A CHIP, WAFER, DIE, OR LOGIC PORTION THEREOF USING A REGISTRATION FILL CELL" and is a NON-PROVISIONAL patent application of and claims priority to U.S. Provisional Application No. 62/945,558, filed on 9 Dec. 2019 and entitled "SYSTEMS, DEVICES, AND METHODS FOR ALIGNING AN PARTICLE BEAM AND PERFORMING A NON-CONTACT ELECTRICAL MEASUREMENT ON A CELL AND/OR NON-CONTACT ELECTRICAL MEASUREMENT CELL VEHICLE USING A REGISTRATION CELL," both of which are incorporated, in their entireties, by reference herein.

FIELD OF INVENTION

The present invention is directed to systems, devices, and methods for performing a non-contact electrical measurement (NCEM) on a NCEM-enabled cell included in a NCEM-enabled cell vehicle. The systems, devices, and methods may be configured to verify a position of a testing target and/or NCEM cell vehicle and/or align a particle beam conducting the NCEM using a registration cell. At times, the NCEM-enabled cell vehicle may be moving due to its positioning on a moving stage and the NCEM measurement may be performed while the NCEM-enabled cell vehicle is moving.

BACKGROUND

During a particle beam and/or electron beam inspection process, a semiconductor wafer or a device under test (DUT) may be exposed to a particle and/or electron beam so that different regions of the wafer/DUT may be exposed to and/or tested using the particle/electron beam. Often times, the wafer/DUT is positioned on a movable stage configured to move the wafer/DUT so that different areas of the wafer/DUT may be positioned under an electron beam column for testing. This movement of the stage may introduce uncertainty into testing process and, more specifically, may make it difficult to precisely determine a position of the wafer/DUT and/or a portion thereof before, during, and/or after movement of the stage which can cause throughput delays and/or errors in the testing process.

SUMMARY

Systems, devices, and methods for performing a non-contact electrical measurement (NCEM) on a NCEM-enabled cell included in a NCEM-enabled cell vehicle are herein described. The NCEM-enabled cell vehicle may be any semiconductor device (e.g., wafer, chip, memory, etc.) and an NCEM-enabled cell may be any electrically-responsive cell positioned within the NCEM-enabled cell vehicle. The NCEM measurements may be performed using a particle beam, such as an electron beam, that is projected toward a target on the NCEM-enabled cell vehicle. A response of the target to the particle beam may be detected and analyzed to determine, for example, whether the target's response to the particle beam is correct and/or indicates whether the target is operational and/or defective. At times, the NCEM-enabled cell vehicle may be moving underneath the particle beam due to its positioning on a moving stage to facilitate, for example, incidence of the particle beam on different targets on the NCEM-enabled cell vehicle. At times, the NCEM measurement may be performed while the NCEM-enabled cell vehicle is moving. The movement may be continuous while a column or swath of discrete portions of the NCEM-enabled cell vehicle (also referred to herein as "tiles") is moved under an electron beam column so that the electron beam may test different tiles. Alternatively, the movement may be variable so that, for example, a stage moves incrementally to position a tile so that it is centered, or nearly centered, within an electron beam's point of view. The tile may remain in this position (or may be slowing moving toward and/or away the center of the field of view of the electron beam column) until all test sites (e.g., NCEM-enabled cells) within the tile are exposed to the electron beam. Then, the stage may move the NCEM-enabled cell vehicle so that a subsequent tile may be centered within the field of view of the electron beam column so that it may be exposed to the electron beam. Measurements provided by the systems described herein may be, for example, voltage contrast measurements and/or images.

In some embodiments, a recipe for an NCEM-enabled cell vehicle, die, NCEM-enabled cell, and/or set of NCEM-enabled cells included in a wafer or NCEM-enabled cell vehicle may be received by a processor and/or computer. The NCEM-enabled cell vehicle, die, NCEM-enabled cell, and/or set of NCEM-enabled cells may be divided into a plurality of regions, or tiles, and each tile may include a registration cell and a plurality of non-contact electronic measurement (NCEM)-enabled cells. In some instances, tile size may be responsive to, for example, a path length for the electron beam column, a size and/or shape of a field of view of the electron beam column, and/or a feature of the wafer (e.g., chip size, arrangement of components, etc.). The recipe may include information (e.g., type, position, dimensions, etc.) regarding, for example, contents of the tiles, NCEM-enabled cell vehicle, die, NCEM-enabled cell, and/ or set of NCEM-enabled cells and/or system parameters (e.g., beam drift, stage velocity, vibrations in the system, movement parameters for components of the system, etc.) for a system performing the NCEM on the NCEM-enabled cell vehicle, die, NCEM-enabled cell, and/or set of NCEM-enabled cells.

An expected position of a registration cell included in a tile of the plurality of tiles may then be determined using, for example, the recipe. In some embodiments, the registration cell may include a plurality of features (e.g., NCEM-enabled cells, product standard cells, lines, circuits, etc.) and determination of an expected position of the registration cell may include determining an expected position of one or more of the plurality of features.

An electron beam column may then be instructed to scan a region of the tile corresponding to the expected position of the registration cell using an electron beam emanating from an electron beam column.

An indication of a response of the region of the tile corresponding to the expected location of the registration cell to the electron beam may then be received. The indication of a response may be a signal from an electron detector that has detected electrons emanating from the region of the tile corresponding to the expected location of the registration cell (e.g., an electron count and/or grey level), a voltage contrast measurement, and/or an image of the region of the tile corresponding to the expected location of the registration cell. In some embodiments, the indication of the response of the NCEM-enabled cell to the aligned electron beam may be a voltage contrast measurement and/or an image. Additionally, or alternatively, the indication of the response of the NCEM-enabled cell to the aligned electron beam is a detector current that indicates a measure of detected electron intensity. In some instances, the detector current may be converted into a grey level.

The indication of the response and/or image may then be analyzed to determine an actual position of the registration cell by, for example, comparing a position of features of the expected location of the registration cell as indicated by the recipe and a position of features of the scanned area.

The operation of the electron beam column and/or a deflection of the electron beam emanating therefrom may then be aligned and/or recalibrated using the actual position of the registration cell. Then, the aligned electron beam may be sequentially directed toward each of targets (e.g., target NCEM-enabled cells) included in the tile. A response (e.g., an electron count, an image, a voltage contrast measurement, a grey level, etc.) of each of the targets to the aligned electron beam may then be received and an indication of the response may be provided to a processor.

At times, more than one tile may be tested and/or a response of the tile to an electron beam may be received and this process may be repeated for some, or all, tiles included in an NCEM-enabled cell vehicle. In some embodiments, a difference between the expected and actual position of for a plurality of scanned registration cells may be determined. These differences may be used to determine an amount of electron beam drift, or movement of an electron beam column generating the electron beam over time as successive registration cells are scanned. The electron beam drift may then be used to align the electron beam when it is directed toward a subsequent target (e.g., a registration cell or an NCEM-enabled cell).

On some occasions, the NCEM-enabled cell vehicle may be positioned on a stage that moves while the registration cell is exposed to the electron beam and position information for the stage (and consequently the wafer) as it moves may be received by, for example, the processor or computer. The position information may be received from, for example, position assessment hardware, an interferometer, and/or an optical encoder. The deflection angle of the electron beam may then be adjusted while scanning the registration cell so that the scanning may be responsive to and/or correspond with the movement of the stage and/or the position information for the stage so that the scan of the registration cell may be completed while the stage, and consequently the wafer, is moving.

Additionally, or alternatively, position information for an electron beam column that generates the electron beam may be received along with position information for the stage as the wafer moves along with the moving stage. A position of the stage relative to the electron beam column may then be determined and a deflection angle of the electron beam on the registration cell may be adjusted while scanning the registration cell. The adjustment of the deflection angle may be responsive to the position of the stage relative to the electron beam column so that the scan of the registration cell may be completed while the wafer is moving to collect a registration image.

In some embodiments, absolute and/or relative position information (e.g., in the X- and/or Y-direction) for the stage and/or electron beam column that generates the electron beam may be received. The position information for the stage and/or electron beam column may be received from by, for example, an interferometer and/or an optical encoder. Relative position between the stage and the electron beam column may then be determined using, for example, absolute position information of the stage and the electron beam column and/or via analysis of a compound beam that is incident on both the stage and electron beam column.

A deflection angle of the electron beam as it exits the electron beam column and is directed toward the registration cell may then be adjusted while scanning the registration cell responsively to the relative position between the stage and the electron beam column. At times, the wafer may be positioned on a moving stage and the position information for the stage and electron beam column may be received over a time interval (e.g., a length of time needed to scan the registration cell).

The position of the stage and/or the electron beam column may be continuously and/or sequentially determined over the time interval using the absolute and/or relative position information for the stage and the electron beam column received over the time interval. The deflection angle of the electron beam as it exits the electron beam column and is directed toward the registration cell may then be adjusted over the time interval while scanning the registration cell responsively to the relative position between the stage and the electron beam column so that the scan of the registration cell may be completed while the wafer is moving. In some embodiments, the position information may be continuously and/or periodically (e.g., every 0.1 or 1 microsecond) received while the stage is moving.

In some embodiments, the registration cell may include a plurality of features like NCEM-enabled cells, NCEM-enabled fill cells, memory cells, and/or product standard cells, and determining the expected position of the registration cell comprises determining an expected position for two or more of the plurality of features and determining the actual position of the registration cell comprises determining an actual position for the two or more features of the plurality of features using the image. In these embodiments, the expected and actual position for each of the two or more features of the registration cell may be compared with one another to, for example, determine a difference therebetween. This difference may be used to, for example, determine an amount of beam drift and/or align the electron beam.

BRIEF DESCRIPTION OF THE FIGURES

The present invention is illustrated by way of example, and not limitation, in the figures of the accompanying drawings in which:

FIG. 8 provides a flowchart illustrating an exemplary process for determining a position of a stage relative to an electron beam column, in accordance with some embodiments of the present invention;

FIGS. 9A and 9B provide a flowchart illustrating an exemplary process for registering a position of a tile using a NCEM-enabled registration cell and performing a test on one or more NCEM-enabled fill included within the tile as the tile moves on a stage and is exposed to non-contact electronic measurement via an electron beam or electron beam, in accordance with some embodiments of the present invention;

Figure 1A:
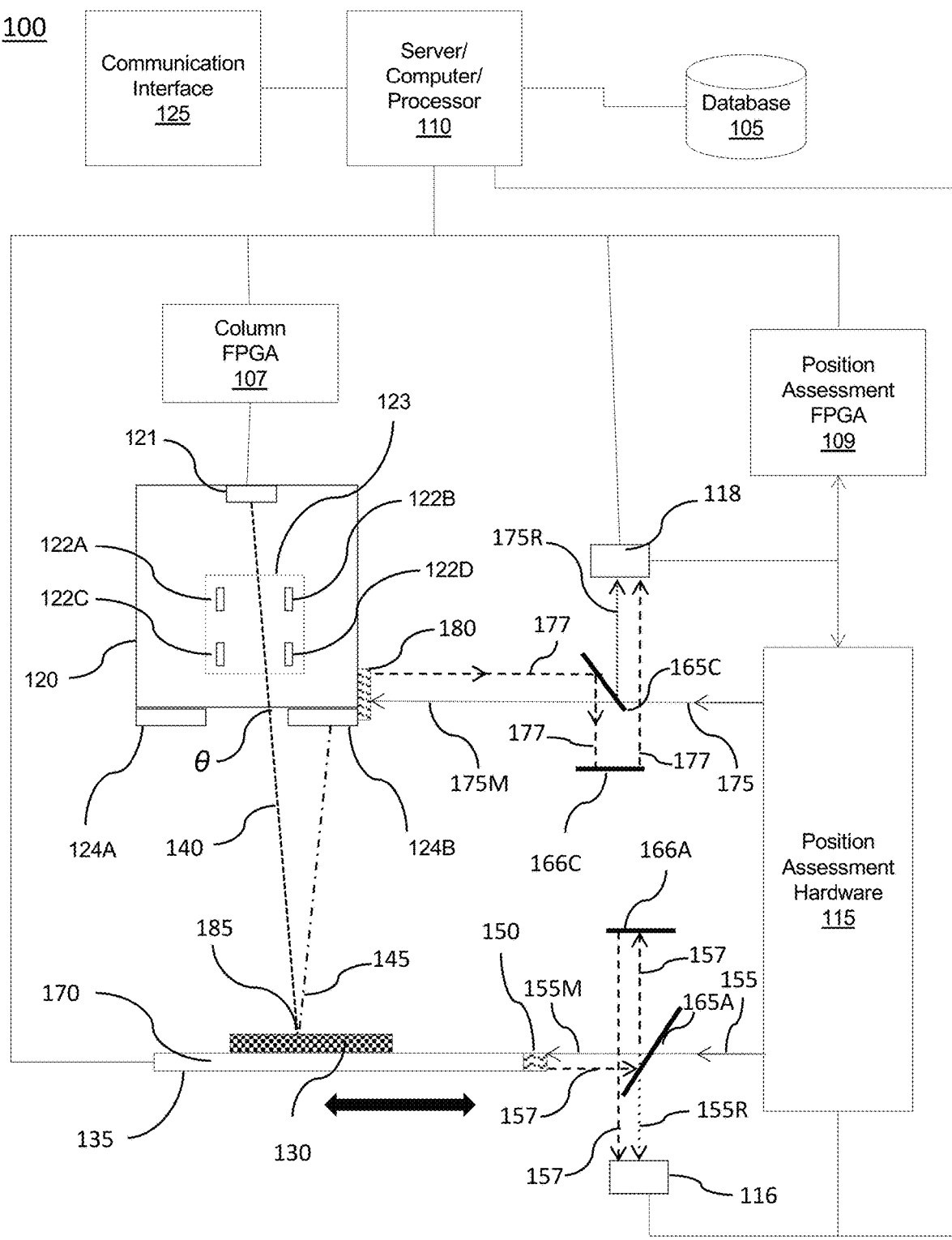
FIG. 1A provides a side view of a first exemplary system for testing a NCEM-enabled cell vehicle using a non-contact electronic measurement (NCEM) using a first exemplary type of position assessment, in accordance with some embodiments of the present invention.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims. Features shown within the drawings are not drawn to scale.

WRITTEN DESCRIPTION

The present invention is directed to systems, devices, and methods for performing a non-contact electrical measurement on a non-contact electronic measurement (NCEM) enabled cell included in a NCEM-enabled cell vehicle. An NCEM-enabled cell may be any cell that may respond to a non-contact electronic measurement such as a voltage contrast measurement. Typically, NCEM-enabled cells have a metal contact by which to conduct the NCEM. Devices that include NCEM-enabled cells may be any semiconductor device including, not limited to, a chip, wafer, die, logic block (e.g., a logic portion of a chip, wafer, reticle, or die), test chip, a test structure, and/or a memory pad in a memory product. These devices may be collectively referred to herein as a NCEM-enabled cell vehicles. Non-contact electrical measurements may be performed using a non-contact electrical measurement tool that may be a charged particle (electrons or ions) column that projects a beam of charged particles toward an area of interest or target (e.g., a registration area and/or a NCEM-enabled cell). An electrical response of an NCEM-enabled cell or group of NCEM-enabled cells to the charged particle beam may be detected by, for example, an electron detector, and processed to provide, for example, a detected electron count, a grey level, a voltage contrast measurement, and/or an image of the target. The response may then be used to determine whether the area of interest is properly operational or defective.

In some cases, a NCEM-enabled cell vehicle may include one or more NCEM-enabled fill cells that may be configured to occupy space between necessary components of a NCEM-enabled cell vehicle (e.g., product standard cells or memory cells) that may otherwise not be functional or NCEM-enabled. Exemplary NCEM-enabled fill cells include one or more test components or circuits that may be responsive to a non-contact electronic measurement.

At times, the NCEM-enabled cell vehicle may be affixed to, and move along with, a stage that positions the NCEM-enabled cell vehicle under a particle beam column. Movement of the NCEM-enabled cell vehicle may be achieved via movement of a stage that the NCEM-enabled cell vehicle is affixed to. The stage (and thereby the NCEM-enabled cell vehicle) may move to facilitate inspection of the NCEM-enabled cell vehicle via a non-contact electrical measurement tool as part of an inspection and/or error analysis process. The non-contact electrical measurement tool may be a charged particle column that projects a beam of charged particles (e.g., electrons or ions) toward an area of interest (e.g., a NCEM-enabled cell) for the purpose of determining an electrical response of the area of interest to the charged particle beam. The response may then be used to determine whether the area of interest is properly operational or defective. At times, the non-contact electronic measurement process may utilize voltage contrast measurements.

In some embodiments, a non-contact electronic measurement may be conducted on a moving NCEM-enabled cell vehicle and the configuration of the present invention that enables the testing of NCEM-enabled cells while a NCEM-enabled cell vehicle they are included in is moving with the stage provides an opportunity to test NCEM-enabled cell vehicle on-the-fly, which may save time and/or processing power.

In some cases, exposure of a cell to a charged particle beam results in destruction of the exposed component. In some embodiments, an NCEM-enabled cell vehicle may include one or more NCEM-enabled fill cells. These NCEM-enabled fill cells may not be configured to perform a function or otherwise effect an operation of an NCEM-enabled cell vehicle and exposure of the NCEM-enabled fill cells. Because the NCEM-enabled cells do not perform any functions necessary for the operation of the a NCEM-enabled cell vehicle, exposure of these NCEM-enabled cells to a charged particle beam, and the damage these NCEM-enabled cells will suffer as a result, may not adversely impact the operation of the NCEM-enabled cell vehicle that is being tested using non-contact electrical measurements. Thus, in some cases, a NCEM-enabled cell vehicle may be tested using NCEM-enabled fill cells without impacting other components of a NCEM-enabled cell vehicle. Thus, NCEM-enabled cell vehicles may be still be operable following a NCEM testing process as described herein. This may achieve a reduction in yield loss caused by inspection of NCEM-enabled cell vehicles using non-contact electronic measurements.

The present invention is also directed to systems, devices, and methods for aligning non-contact electrical measurement tools inspecting a NCEM-enabled cell vehicle using registration NCEM-enabled cells. Registration NCEM-enabled cells may be NCEM-enabled cells configured to have characteristics (e.g., position, width, length, height, etc.) that are relatively easy to recognize and/or identify via, for example, voltage contrast and/or imaging techniques. Because, for example, it may be easy to identify the precise dimensions of a registration NCEM-enabled cell, these dimensions may be used to determine a precise position of the registration NCEM-enabled cell (and therefore the NCEM-enabled cell vehicle). This position information may be used to align the non-contact electronic measurement tools (e.g., charged particle beam and/or stage) to perform electronic measurements at precise positions (e.g., NCEM-enabled cells) on the NCEM-enabled cell vehicle. This may assist with, for example, properly directing and/or focusing a charged particle beam on a NCEM-enabled cell vehicle and/or NCEM-enabled cell so as to improve accuracy and/or decrease a likelihood that a portion of the NCEM-enabled cell vehicle is incorrectly exposed to the charged particle beam.

In embodiments where movement of the stage is continuous along a row or column of sequentially arranged portions of a NCEM-enabled cell vehicle (a portion of an NCEM-enabled cell vehicle is sometimes referred to herein as a "tile"), the systems, devices, and methods disclosed herein may compensate for the continuously moving stage by adjusting a deflection angle and/or direction of a charged particle beam when it exits the particle beam column responsively to the continuous movement of the stage. In this way, targets may be exposed to the charged particle beam on the fly as they move along with the stage without the need to slow or stop the motion of the stage. This may result is an increase in throughput and/or the speed with which chips, wafers, dies, or logic portions thereof may be tested using NCEMs.

Additionally, or alternatively, in some cases, movement of the stage may not be continuous along a row or column of sequentially arranged tiles. For example, the stage may move relatively quickly between target regions but may move slowly as a target region is approached and/or may come to a complete stop when a target region is correctly positioned beneath the charged particle beam column. In these cases, movement of the stage as it decelerates upon approaching a target and/or accelerates when moving from a first target to a second target may be compensated for by adjusting a deflection angle and/or direction of a charged particle beam when it exits the particle beam column responsively to the movement (or lack thereof) of the stage.

Information regarding a position of the stage and/or movement of the stage may be provided by position assessment hardware that may provide an absolute position for the stage and/or particle beam column at any point in time and/or continuously. Additionally, or alternatively, the position assessment hardware may provide a position for the stage relative to the charged particle beam column at any point in time and/or continuously.

Figure 1B:
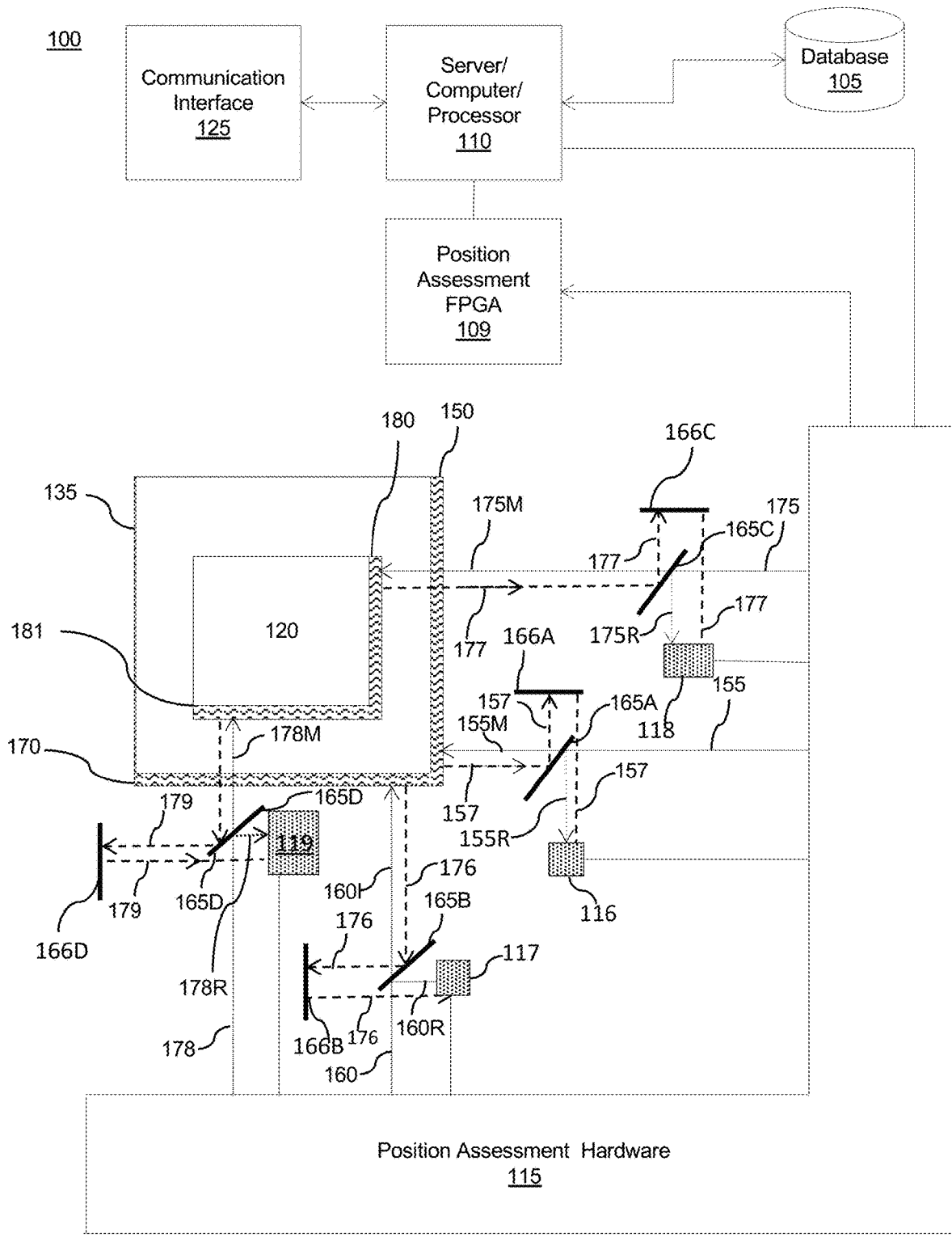
FIG. 1B provides a top view of portions of the first system, in accordance with some embodiments of the present invention.

Turning now to the figures, FIG. 1A provides a side view of a first exemplary system 100 for testing a NCEM-enabled cell vehicle using a non-contact electronic measurement (NCEM) using a first exemplary type of position assessment and FIG. 1B provides a top view of portions of the first exemplary system 100.

System 100 includes an electron beam column 120, a server/computer/processor 110, position assessment hardware (which may include one or more lasers (not shown)) 115, a database 105, a column field programmable gate array (FPGA) 107, a position assessment FPGA 109, a communication interface 125, a NCEM-enabled cell vehicle 130, and a stage 135 that includes a first mirrored surface 150 (also referred to herein as "first stage mirror 150") and a second stage mirror 170 (also referred to herein as "second stage mirror 170").

NCEM-enabled cell vehicle 130 may be any semiconductor device that is tested using a particle beam column like an electron beam column 120. Examples of NCEM-enabled cell vehicle 130 include, but are not limited to a chip, wafer, die, logic block (e.g., a logic portion of a NCEM-enabled cell vehicle), test chip, test structure, and/or a memory pad in a memory product. In some embodiments, NCEM-enabled cell vehicle 130 is a wafer, an example of which is shown in FIG. 12A and discussed below. Often times, NCEM-enabled cell vehicle 130 is divided into one or more sections, or tiles, and each tile may include, for example, one or more NCEM-enabled registration cells, test cells, NCEM-enabled cells, NCEM-enabled cells, and/or product standard cells. More information about NCEM-enabled registration cells, product standard cells, NCEM-enabled cells, and NCEM-enabled cells is provided herein and, in particular, with regard to discussions of FIGS. 5A-5E below.

Electron beam column 120 includes, among other features, an electron beam source 121, a first detector 124A, a second detector 124B, and a set 123 of deflectors 122A, 122B, 122C, and 122D. Electron beam source 121 may be configured to generate an electron beam 140 that may be directed toward an area of interest on NCEM-enabled cell vehicle 130 (e.g., a target 185). Exemplary targets include, but are not limited to, a cell, a device under test (DUT), a NCEM-enabled registration cell, an NCEM-enabled cell, and/or an NCEM-enabled cell on/in the NCEM-enabled cell vehicle 130. Electron beam source 121 may receive instructions from column FPGA 107 regarding how and/or when to emit electron beam 140.

Set of deflectors 123 may cooperatively deflect electron beam 140 along its path through electron beam column 120 so that it is incident on a target 185 in NCEM-enabled cell vehicle 130 while, for example, stage 135 and therefore, NCEM-enabled cell vehicle 130/target 185 is still and/or is actively or passively (e.g., vibrations) moving. One or more deflectors 122A, 122B, 122C, and/or 122D may receive instructions from column FPGA 107 and/or server/computer/processor 110 regarding how and/or when to deflect electron beam 140 by, for example, adjusting a deflection angle θ of electron beam 140 over time as an area of interest of NCEM-ENABLED CELL VEHICLE 130 (e.g., target 185) is scanned with electron beam 140.

Electron detectors 124A and 124B may be configured to detect electrons emanating from NCEM-enabled cell vehicle 130 and/or target 185 that are resultant from an interaction between electron beam 140 and target 185. Detected electrons may form a detected electron signal 145 that may include, for example, secondary electrons, back-scattered electrons, or a combination thereof. Analysis of detected electron signal 145 by, for example, server, computer, processor 110 may be used to determine whether, for example, certain features of the NCEM-enabled cell vehicle 130 in which target 185 is resident are defective or operable via, for example, voltage contrast analysis and/or analysis of an image generated using detected electron signal 145.

In some cases, detected electron signal 145 may be a detected current that may, at times, correspond to detected electron intensity, detected electron power, and/or detected electron energy level. In some instances, these values may be determined for a particular geographic region of target 185, which may be referred to herein as a pixel. The detected current and/or detected electron intensity may be converted into a pixel energy level, and/or a grey level by, for example, server/computer/processor 110. In some cases, the detected current, pixel energy level, and/or grey level may be and/or may correspond to a voltage contrast measurement. An exemplary graph 1300 of analysis of detected electron signal 145 information for different targets 185 is provided in FIG. 14 and discussed below.

Stage 135 may be any stage, or movable platform, configured to accept positioning of NCEM-enabled cell vehicle 130 thereon and configured to move in the X- and/or Y-direction(s) so that NCEM-enabled cell vehicle 130 and target(s) 185 included therein may be exposed to electron beam 140 for the purposes of, for example, measuring a voltage contrast and/or imaging NCEM-enabled cell vehicle 130 as discussed herein. Further information regarding the movement of stage 135 is provided with regard to the discussions of FIGS. 5A-5E, below.

Stage 135 may include one or more mirrored surfaces such as first state mirror 150 and second stage mirror 170. In many embodiments, first and/or second stage mirrors 150 and/or 170 are positioned on the sides of stage 135 and not a portion of stage 135 (e.g., a top) that supports NCEM-enabled cell vehicle 130. First and second stage mirrors 150 and 170 may be arranged and configured to reflect light or other electromagnetic radiation incident thereon that, for the sake of brevity, may be collectively referred to as "light." A reflection of light incident on first stage mirror 150 may be used to determine a position of stage 135 in a first dimension (e.g., along an X-axis) and a reflection of light incident on second stage mirror 170 may be used to determine a position of stage 135 in a second dimension (e.g., along a Y-axis). FIGS. 1A and 1B illustrate an exemplary way light may be incident upon first stage mirror 150 and second stage mirror 170.

Position assessment hardware 115 may be any tool, or combination of tools, configured to acquire and/or determine a position of, and/or movement information for, stage 135 in the X-, Y-, and/or Z-directions with a high level of precision (e.g., 1 μm-0.01 nm) and accuracy. The position of and/or movement information for stage 135 may be extrapolated to NCEM-enabled cell vehicle 130 (and therefore target 185) positioned on, or otherwise affixed to, stage 135 because a position of NCEM-enabled cell vehicle 130 corresponds to the position of stage 135. In some cases, position assessment hardware 115 is and/or includes and/or is an interferometer and/or an optical encoder.

In some embodiments, position assessment hardware 115 produces and/or gathers position and/or motion information for stage 135 by directing a first beam 155 and/or a second beam 160 of electromagnetic radiation (e.g., visible light, infra-red light, and/or radio waves) toward first stage mirror 150 and/or second stage mirror 170, respectively, of stage 135. Characteristics of a reflection of these first and second beams 155 and 160 may then be determined by, for example, photodetectors, position assessment hardware 115, and/or server/computer/processor 110 and used to determine a position of stage 135 at any given point in time. More specifically, position assessment hardware 115 may project first beam 155 toward a first mirror 165A, which may be a partially reflecting and/or a half-silvered mirror arranged and configured to split first beam 155 into a first reference beam 155R and a first measurement beam 155M. First reference beam 155R may be incident on a first photodetector 116 and first measurement beam 155M may be incident upon first stage mirror 150. A first reflected beam 156 may be reflected by first stage mirror 150 toward first mirror 165A which may direct first reflected beam 157 toward a first flat mirror 166A that may reflect first reflected beam 157 toward the first photodetector 116. First photodetector 116 may convert first reflected beam 157 and first reference beam 155R into a digital signal which may then be communicated to position assessment hardware 115, position assessment FPGA 109, and/or server/computer/processor 110, which may compare first reflected beam 157 and first reference beam 155R with one another and determine a position of stage 135 in a first direction (e.g., the X-direction) using the comparison using, for example, a comparison of the phase for first reference beam 155R and first reflected beam 157 and/or interferometry techniques.

Figure 11A:
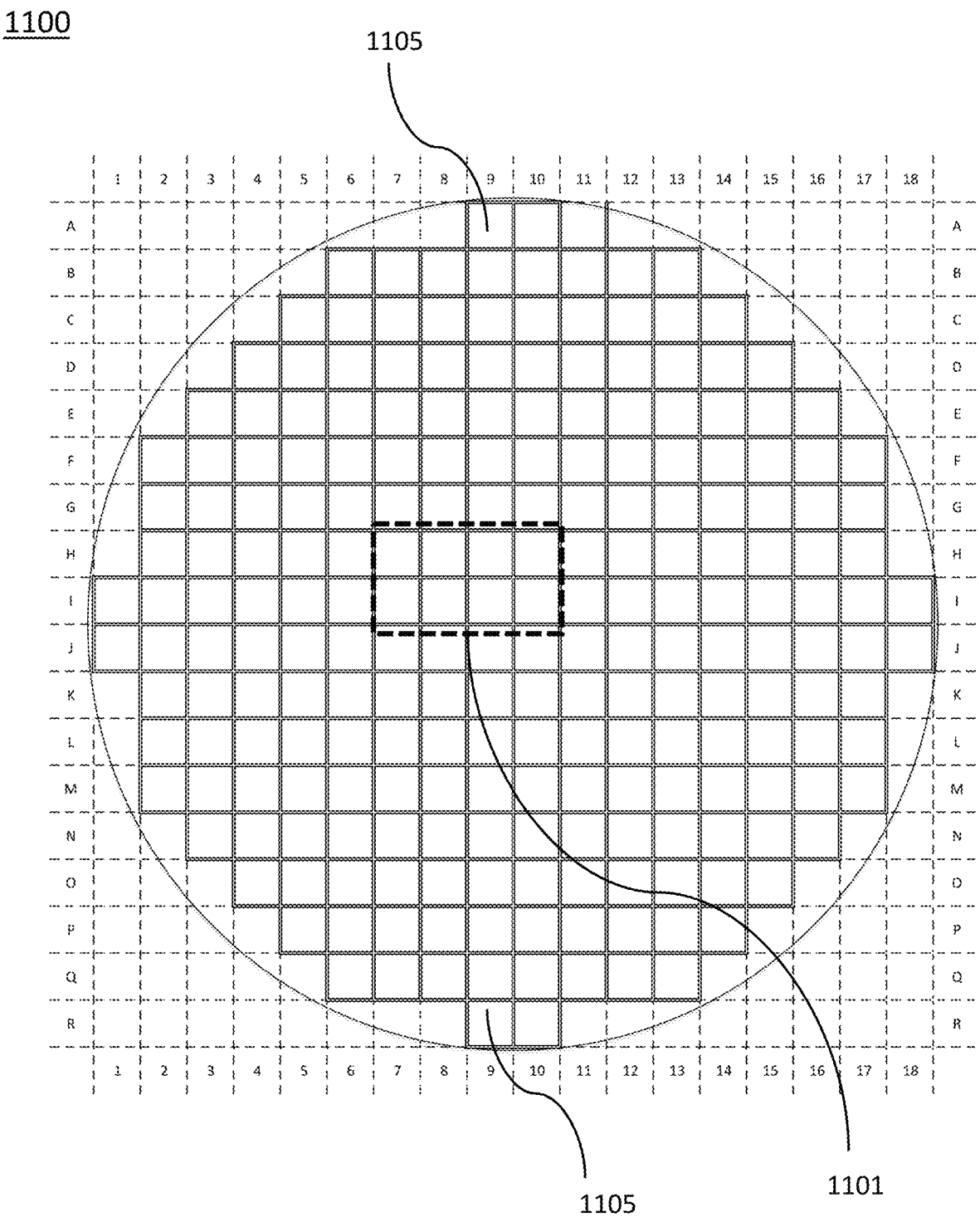
FIG. 11A provides a block diagram of an exemplary wafer, in accordance with some embodiments of the present invention.
Figure 11B:
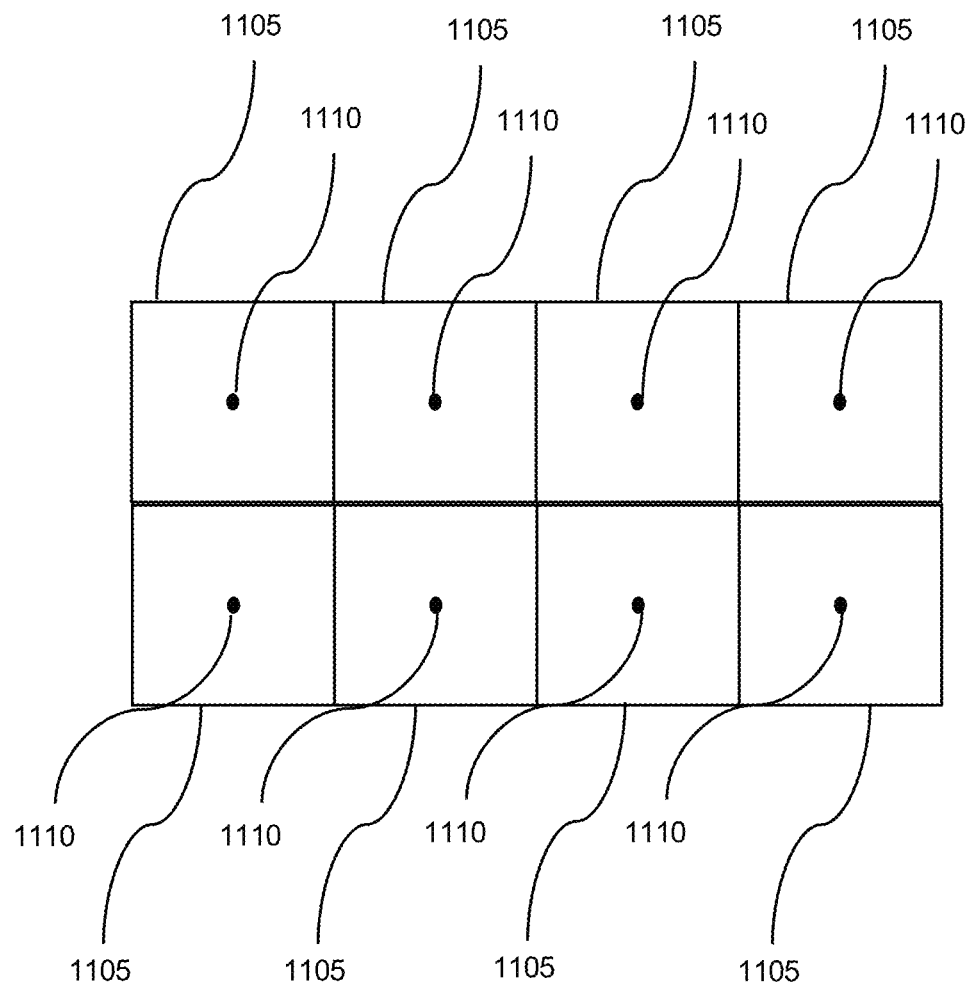
FIG. 11B provides an exemplary array of NCEM-enabled cell vehicles that are present on a wafer, in accordance with some embodiments of the present invention.

As seen in FIG. 11B, position assessment hardware 115 projects second beam 160 toward a second mirror 165B, which may be a partially reflecting and/or half-silvered mirror arranged and configured to split second beam 160 into a second reference beam 160R and a second measurement beam 160M. Second reference beam 160R may be incident on a second photodetector 117 and second measurement beam 160M may be incident upon second stage mirror 170. A second reflected beam 176 may be reflected by second stage mirror 170 toward second mirror 165B which may direct a portion of second reflected beam 176 toward a second flat mirror 166B. Second flat mirror 166B may reflect second reflected beam 176 toward the second photodetector 117. Second photodetector 117 may convert second reflected beam 176 and second reference beam 155R into a digital signal which may then be communicated to position assessment hardware 115, position assessment FPGA 109, and/or server/computer/processor 110, which may compare second reflected beam 176 and second reference beam 160R with one another and determine a position of stage 135 in a second direction (e.g., the Y-direction) using the comparison by, for example, a comparing the phase for second reference beam 160R and second reflected beam 176 and/or using interferometry techniques.

Optionally, a position of electron beam column 120 may be determined in the first direction (e.g., the X-direction) and/or the second direction (e.g., the Y-direction) by using hardware and/or a process similar to that used to determine the position of stage 135. For example, position assessment hardware 115 may project a third beam 175 toward a third mirror 165C, which may be a partially reflecting and/or a half-silvered mirror configured to split third beam 175 into a third reference beam 175R and a third measurement beam 175M. Third reference beam 175R may be incident on a third photodetector 118 and third measurement beam 175M may be incident upon third mirror 180 positioned on an exterior surface of electron beam column 120 and a third reflected beam 177 may be reflected by third mirror 180 toward third mirror 165C, which may direct a portion of third reflected beam 177 toward a third flat mirror 166C. Third flat mirror 166C may reflect third reflected beam 177 toward the third photodetector 118. Third photodetector 118 may convert third reflected beam 177 and third reference beam 175R into a digital signal which may then be communicated to position assessment hardware 115, position assessment FPGA 109, and/or server/computer/processor 110, which may compare third reflected beam 177 and third reference beam 175R with one another and determine a position of electron beam column 120 in the first direction using the comparison.

Position assessment hardware 115 may project a fourth beam 178 toward a fourth mirror 165D, which may be a partially reflecting and/or a half-silvered mirror configured to split fourth beam 178 into a fourth reference beam 178R and a fourth measurement beam 178M. Fourth reference beam 178R may be incident on a fourth photodetector 119 and fourth measurement beam 178M may be incident upon fourth mirror 180 positioned on an exterior surface of electron beam column 120 and a fourth reflected beam 179 may be reflected by fourth mirror 180 toward fourth mirror 165D, which may direct a portion of fourth reflected beam 179 toward a fourth flat mirror 166C. Fourth flat mirror 166C may reflect fourth reflected beam 179 toward the fourth photodetector 119. Fourth photodetector 119 may convert fourth reflected beam 179 and fourth reference beam 178R into a digital signal which may then be communicated to position assessment hardware 115, position assessment FPGA 109, and/or server/computer/processor 110, which may compare fourth reflected beam 179 and fourth reference beam 178R with one another and determine a position of electron beam column 120 in the first direction using the comparison.

In some embodiments, the signals received by first, second, third, and/or fourth detectors 116, 117, 118, and/or 119 may be used to determine an absolute position of electron beam column 120 and/or stage 135, a relative position between electron beam column 120 and stage 135, and/or a relative rate of motion between electron beam column 120 and stage 135 in the X-, Y-, and/or Z-directions. First beam 155, second beam 160, third beam 175, and/or fourth beam 178 may be monochromatic as may be emitted by a laser and/or a combination of wavelengths of electromagnetic radiation by emitted by a source present in position assessment hardware 115. It should be noted that the optical array shown in FIGS. 1A and 1B are exemplary arrangements of mirrors and the position hardware assessment tool. Other arrangements for directing light toward first and second stage mirrors 150 and 170 as well as third, and/or fourth mirrors 180, and/or 181, respectively may also be used.

In some embodiments, information from the first, second, third, and/or fourth detectors 116, 117, 118 and/or 119 may be communicated to server/computer/processor 110 and/or position assessment FPGA 109 to determine an absolute position of stage 135, a position of electron beam column 120, and/or a position of stage 135 relative to the electron beam column 120. When the information is communicated to server/computer/processor 110, server/computer/processor 110 may determine the position of stage 135, a position of electron beam column 120, and/or a position of stage 135 relative to the electron beam column 120 and then provide instructions to column FPGA 107 to adjust the operation of one more deflectors to, for example, direct electron beam 140 toward target 185 as stage 135 moves.

Database 105 may be configured to store instructions for the operation of one more components of the systems described herein and/or execution of one or more processes described herein. In some instances, database 105 may be and/or include a vector database that stores vector coordinates for features included in one or more different NCEM-enabled cell vehicles 130 or types of NCEM-enabled cell vehicles 130 as, for example, a recipe for the NCEM-enabled cell vehicles 130. Additionally, or alternatively, database 105 may be configured to store recipes for one or more different NCEM-enabled cell vehicles 130. A recipe may include information regarding features (e.g., NCEM-enabled registration cells, NCEM-enabled cells, NCEM-enabled cells, and/or product standard cells) included in a NCEM-enabled cell vehicle 130 such as their respective configurations and/or positions. Additionally, or alternatively, database 105 may be configured to store parameters for one more components of system 100, 200, and/or 300. Exemplary parameters include, but are not limited to, rates of motion for stage 135, rates of acceleration for stage 135, typical vibrational movement for stage 135, NCEM-enabled cell vehicle 130, and/or electron beam column 120, beam drift for electron beam column, and/or response times for one more components of system 100, 200, and/or 300 when executing instructions.

Column FPGA 107 may be configured to control an operation of, and/or receive information from, electron beam column 120 and/or features resident therein. For example, column FPGA 107 may be configured to align or adjust an operation of one or more deflector(s) 122A, 122B, 122C, and/or 122D in order to, for example, properly direct electron beam 140 toward target 185. Column FPGA 107 may also be configured to receive information from one or more detector(s) 124A and/or 124B and communicate this information to server/computer/processor 110.

Server/computer/processor 110 may be configured to provide instructions for controlling the operation of one or more features of system(s) 100, 200, and/or 300 and/or receive information from one or more components of system(s) 100, 200, and/or 300. For example, server/computer/processor 110 may be configured to receive information from, and/or provide information to, column FPGA 107, stage 135, position assessment hardware 115, communication interface 125, and/or database 105 to, for example, control an operation thereof. Server/computer/processor 110 may also be configured to receive position information from position assessment hardware 115 and/or photodetectors 116, 117, 118, and/or 119 and, in some cases, may be configured to control the operation of column FPGA 107, stage 135, electron beam column 120, and/or deflector 122 responsively to the received position information.

Server/computer/processor 110 may also be configured to execute one or more steps of the processes described herein using, for example, instructions stored therein and/or in database 105. Server/computer/processor 110 may also be configured to receive information from and/or provide information to communication interface 125 such as one or more results of executing one or more of the processes disclosed herein.

Communication interface 125 may be any interface (e.g., keyboard, optical scanner, touch screen, mouse, display device, radio frequency identification equipment, etc.) configured to receive information from, for example, a user and/or equipment (e.g., a robot). For example, NCEM-enabled cell vehicle 130 may be associated with an identifier (e.g., lot number, manufacturing origin, testing routine, design of experiment, etc.) in the form of an optical bar code or RFID tag, which may be presented to communication interface 125 for the purposes of identifying NCEM-enabled cell vehicle 130 by a user and/or automated process. The NCEM-enabled cell vehicle 130 identifier may then be communicated to server/computer/processor 110 and used by server/computer/processor 110 to query database 105 for information pertaining to the NCEM-enabled cell vehicle 130 such as a recipe of features included in NCEM-enabled cell vehicle 130, coordinates of features of NCEM-enabled cell vehicle 130, and/or vector coordinates of features included in NCEM-enabled cell vehicle 130.

Figure 2A:
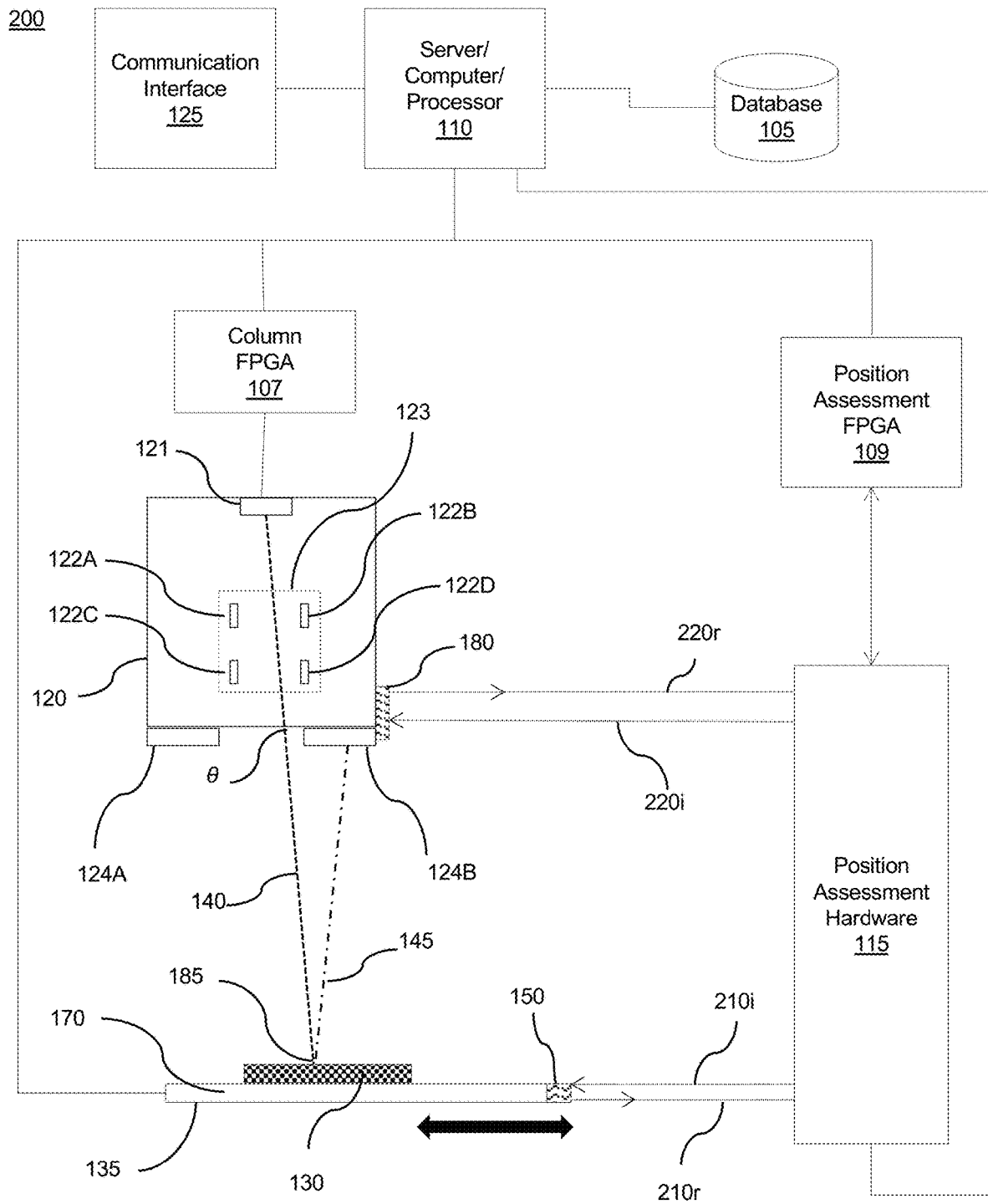
FIG. 2A provides a side view of a second exemplary system for testing a NCEM-enabled cell vehicle using a non-contact electronic measurement (NCEM) using a second exemplary type of position assessment, in accordance with some embodiments of the present invention.
Figure 2B:
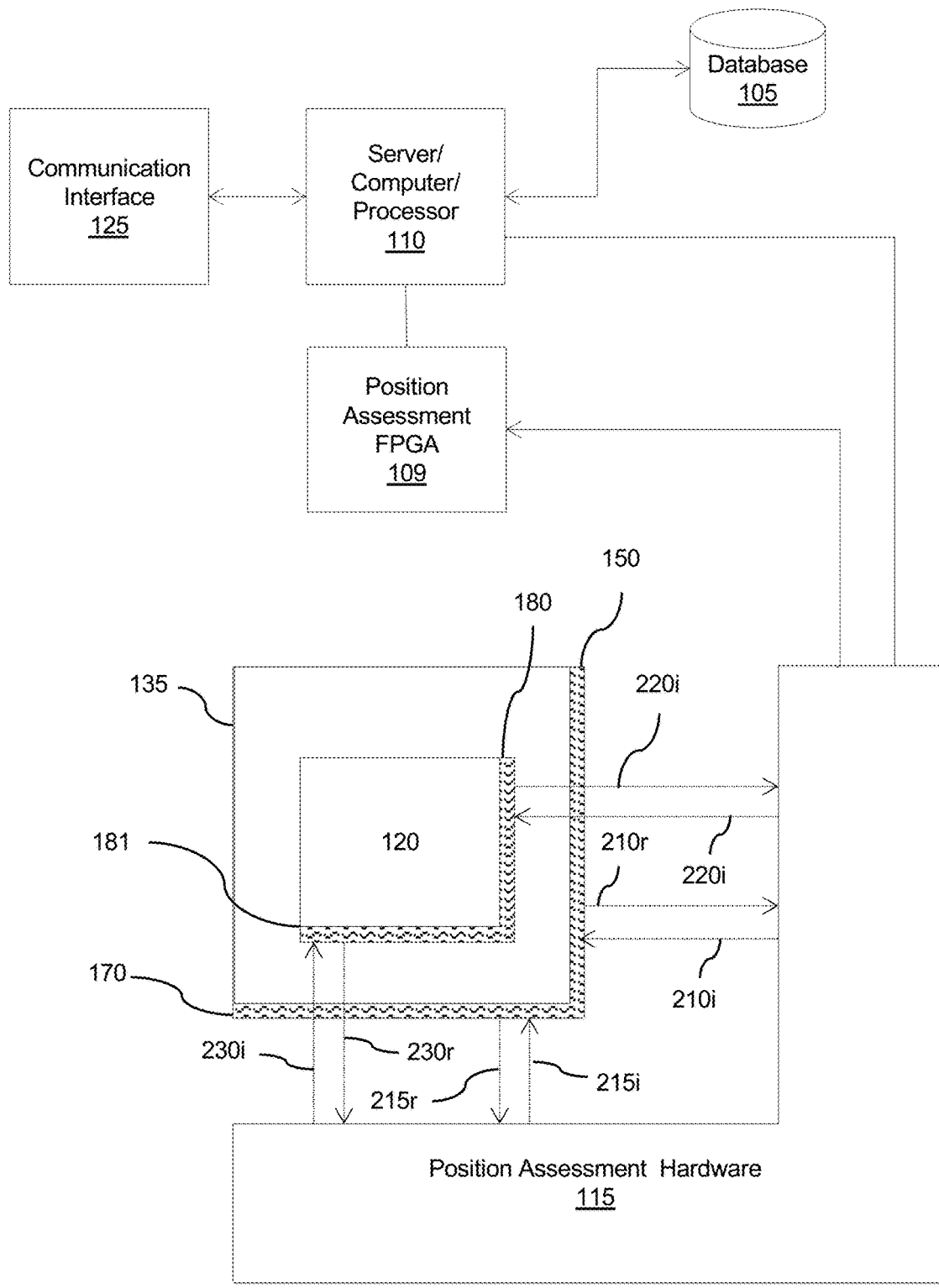
FIG. 2B provides a top view of portions of the second system, in accordance with some embodiments of the present invention.

FIG. 2A provides a side view of a second exemplary system 200 for testing a NCEM-enabled cell vehicle 130 using a non-contact electronic measurement (NCEM) that uses a second exemplary type of position assessment hardware 115 and FIG. 2B provides a top view of portions of second system 200. FIGS. 2A and 2B also show beam paths for light that is incident upon first stage mirror 150, second stage mirror 170, third mirror 180 and fourth mirror 181. An exemplary process 700 for using the second exemplary type of position assessment and determining a position of stage 135 and/or electron beam column 120 using information obtained by executing the second exemplary type of position assessment is discussed below with regard to FIG. 7.

As shown in FIGS. 2A and 2B, an incident first path length beam 210$i$ may be emitted from position assessment hardware 115 and/or a light source (e.g., laser) resident therein and directed toward first stage mirror 150. Incident first path length beam 210$i$ may then reflect off of first stage mirror 150 as reflected first path length beam 210$r$. First reflected first path length beam 210$r$ may be detected by position assessment hardware 115 after reflecting from first stage mirror 150. A time between emission of incident first path length beam 210$i$ and receipt of reflected first path length beam 210$r$ by position assessment hardware 115 may be used to determine a position of stage 135 in a first dimension (e.g., the X-direction) according to, for example, process 700.

As shown in FIG. 2B, a path of a second path length beam signal 215 may be emission of incident second path length beam 215$i$ from position assessment hardware 115, impingement on second stage mirror 170, and reflection of a reflected second path length beam 215$r$ from second stage mirror 170 back to position assessment hardware 115 where it is detected by a detector therein. A time between emission of second path length beam 215$i$ and receipt of reflected second path length beam 215$r$ by position assessment hardware 115 may be used to determine a position of stage 135 in a second dimension (e.g., the Y-direction) according to, for example, process 700.

Optionally, as shown in FIGS. 2A and 2B, a path of a third path length beam 220 may be emission of an incident third path length signal 220$i$ from position assessment hardware, impingement on third mirror 180, and reflection of a reflected third path length beam 220$r$ from third mirror 180 back to position assessment hardware 115 where it is detected by a detector therein. A time between emission of third path length beam 220$i$ and receipt of reflected third path length beam 220$r$ by position assessment hardware 115 may be used to determine a position of electron beam column 120 in a first dimension (e.g., the X-direction) according to, for example, process 700.

Optionally, as shown in FIG. 2B, a path of a fourth path length beam 230 may be emission of an incident fourth path length beam 230$i$ from position assessment hardware toward fourth mirror 181 and reflection of a reflected fourth path length beam 230$r$ from fourth mirror 181 back to position assessment hardware 115 where it is detected by a detector therein. A time between emission of fourth path length beam 230$i$ and receipt of reflected fourth path length beam 230$r$ by position assessment hardware 115 may be used to determine a position of electron beam column 120 in a second dimension (e.g., the Y-direction) according to, for example, process 700.

Figure 3A:
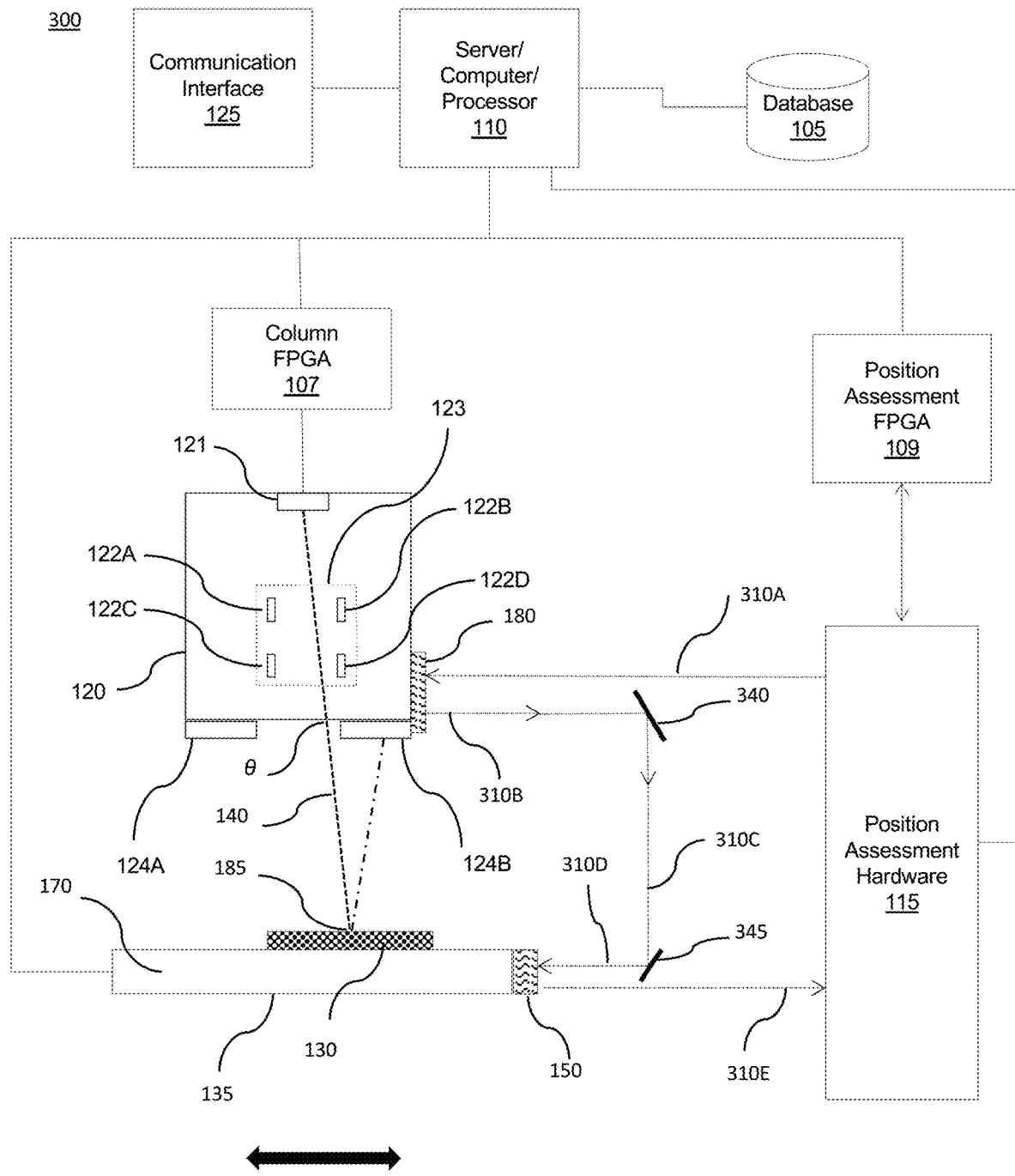
FIG. 3A provides a side view of a third exemplary system for testing a NCEM-enabled cell vehicle using a non-contact electronic measurement (NCEM) using a third exemplary type of position assessment, in accordance with some embodiments of the present invention.
Figure 3B:
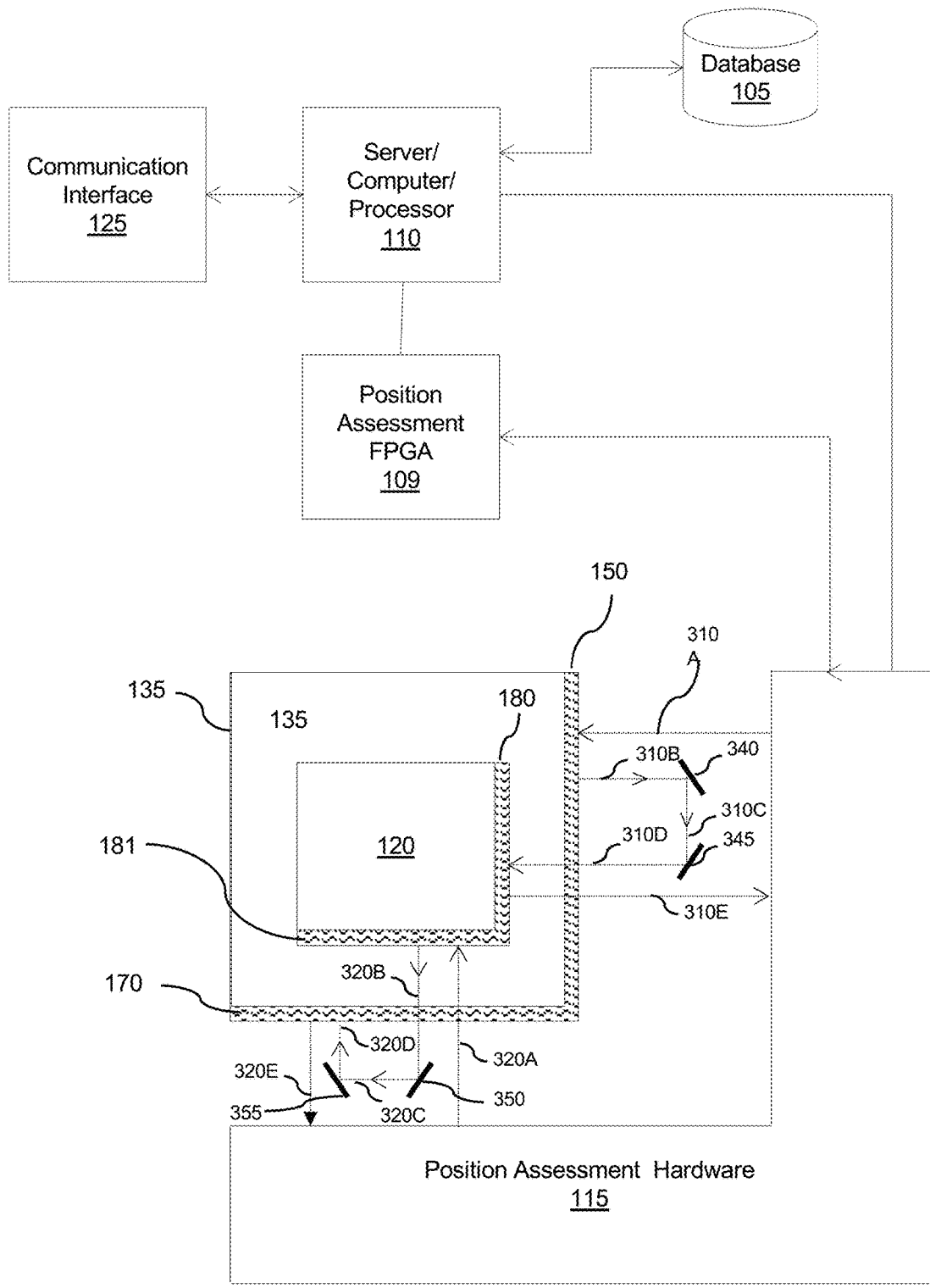
FIG. 3B provides a top view of portions of the third system, in accordance with some embodiments of the present invention.

FIG. 3A provides a side view of a third exemplary system 300 for testing a NCEM-enabled cell vehicle 130 using a non-contact electronic measurement (NCEM) using a third exemplary type of position assessment and FIG. 3B provides a top view of portions of third system 300. An exemplary process 800 for using the third exemplary type of position assessment and determining a position of stage 135 and/or electron beam column 120 using information obtained by executing the third exemplary type of position assessment is discussed below with regard to FIG. 8.

The third exemplary type of position assessment determines a relative position between stage 135 and electron beam column 120 by using a first compound beam 310 and a second compound beam 320 that are incident on mirrors of both stage 135 and electron beam column 120. As shown in FIGS. 3A and 3B, a relative position between the stage 135 and electron beam column 120 in a first direction (e.g., the X-direction) may be determined by projecting a first compound beam 310A toward third mirror 180. A first reflection of first compound beam 311 may be incident upon a first reflection mirror 340, which may reflect a second reflection of first compound beam 312 toward a second reflection mirror 345, which may reflect a third reflection of first compound beam 313 toward first stage mirror 150. A fourth reflection of first compound beam 314 may then be reflected back to position assessment hardware 115 where it may be detected by a detector therein. Another exemplary path of the first compound beam 310, which is not shown in FIG. 3A or 3B, is a reverse of the path shown in FIGS. 3A and 3B, where first compound beam is emitted from position assessment hardware 115, is incident on first stage mirror 150, reflects to second reflection mirror 345, reflects to first reflection mirror 340, reflects to third mirror 180, and then reflects back to position assessment hardware where it is detected by a detector therein.

FIG. 3B also shows the path of first compound beam 310 and also shows the path of a second compound beam 320 so that a relative position between the stage 135 and electron beam column 120 in a second direction (e.g., the Y-direction) may be determined. As shown in FIG. 3B, a first portion of second compound beam 320 is projected toward fourth mirror 181. A first reflection of second compound beam 321 may be incident upon a third reflection mirror 350, which may reflect a second reflection of second compound beam 322 toward a fourth reflection mirror 355, which may reflect a third reflection of second compound beam 323 toward second mirror 170. A fourth reflection of second compound beam 324 may then be reflected back to position assessment hardware 115 where it may be detected by a detector therein. Another exemplary path of the second compound beam 320, which is not shown in FIG. 3A or 3B, is a reverse path where second compound beam 320 is emitted from position assessment hardware 115, is incident on second stage mirror 170, reflects to fourth reflection mirror 355, reflects to third reflection mirror 350, reflects to fourth mirror 181, and then reflects back to position assessment hardware where it is detected by a detector therein.

Figure 4A:
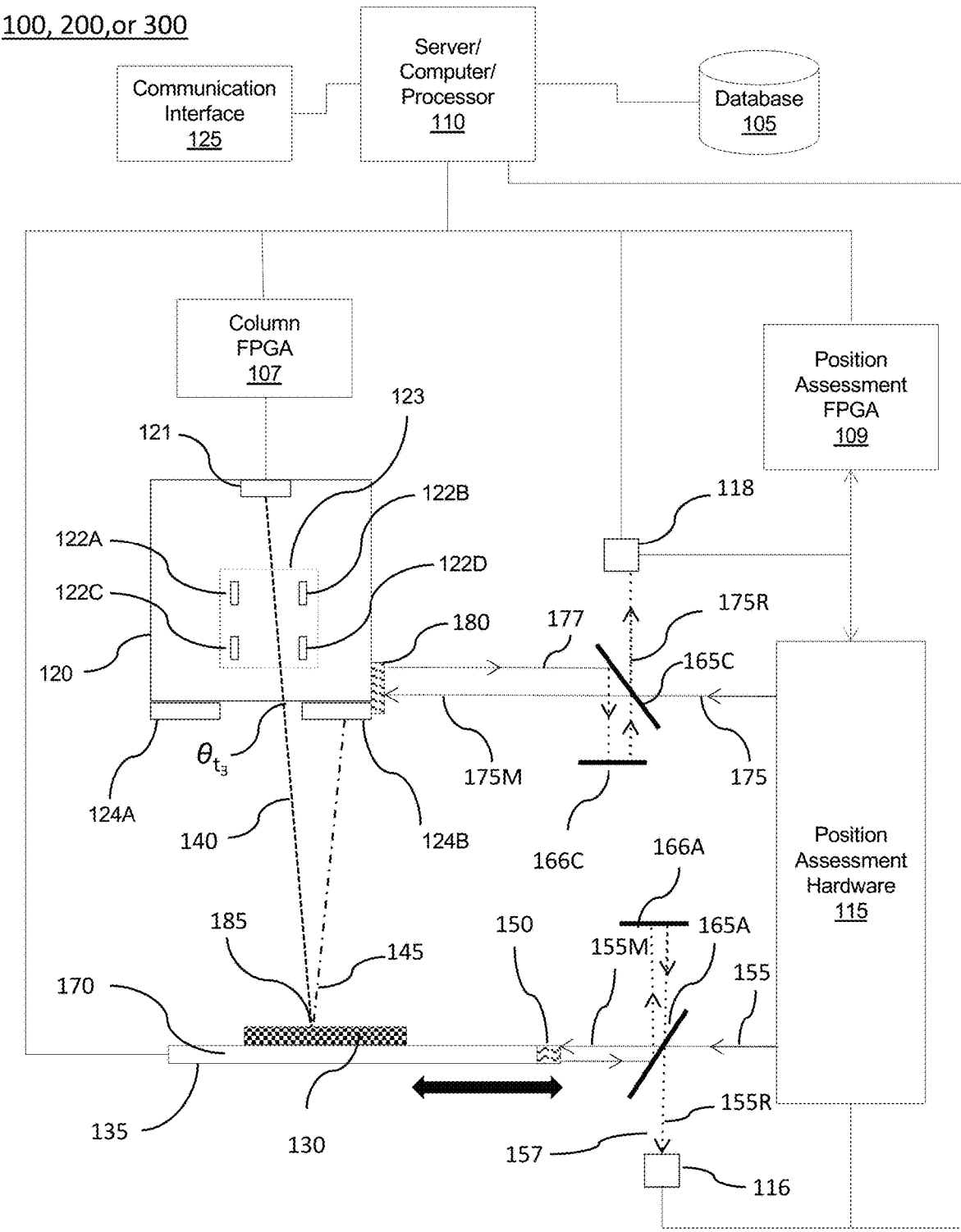
FIGS. 4A-4C provide a side views of the system of FIG. 1A while scanning a target with an electron beam while the target is situated stage that is moving over time, in accordance with some embodiments of the present invention.
Figure 4B:
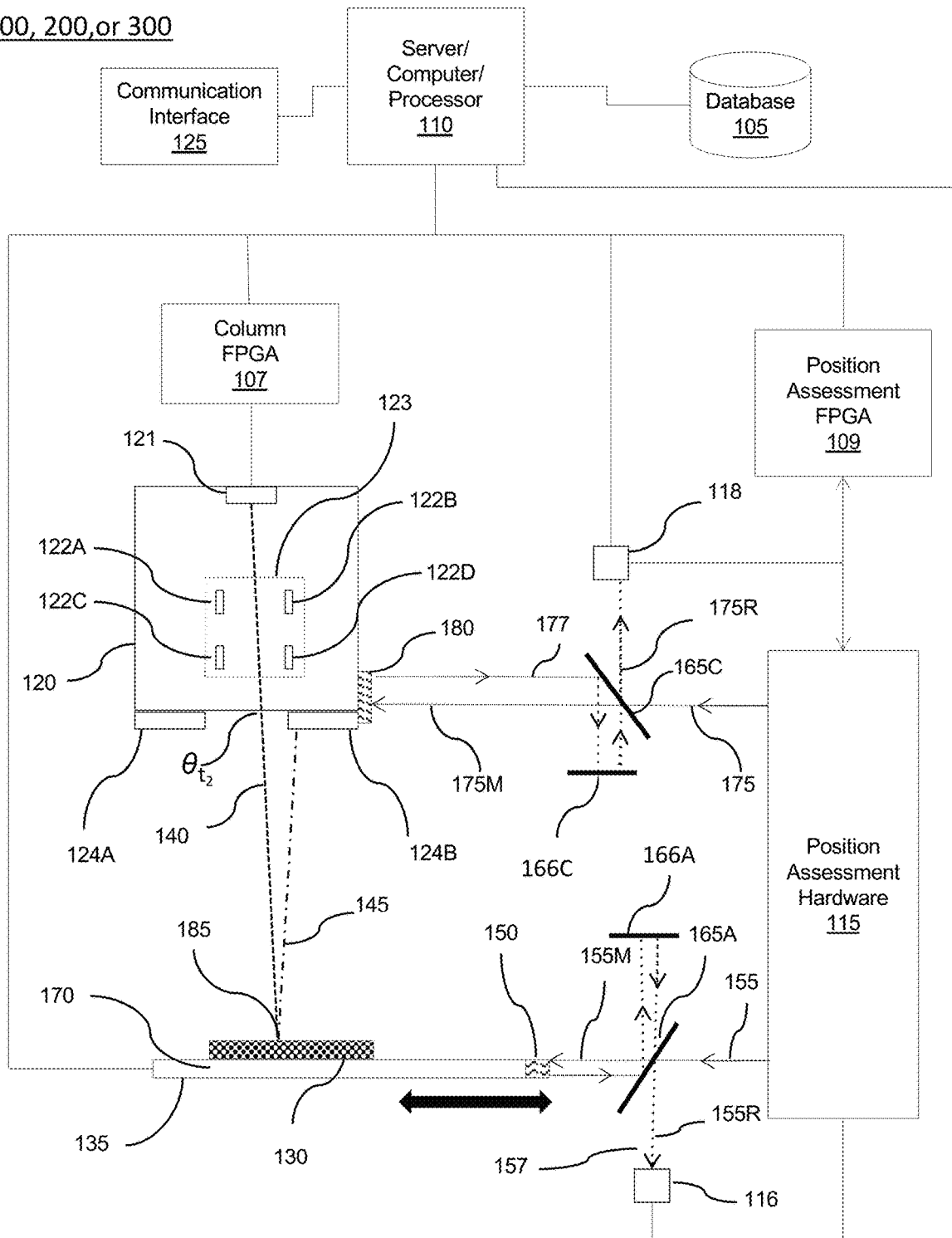
Figure 4C:
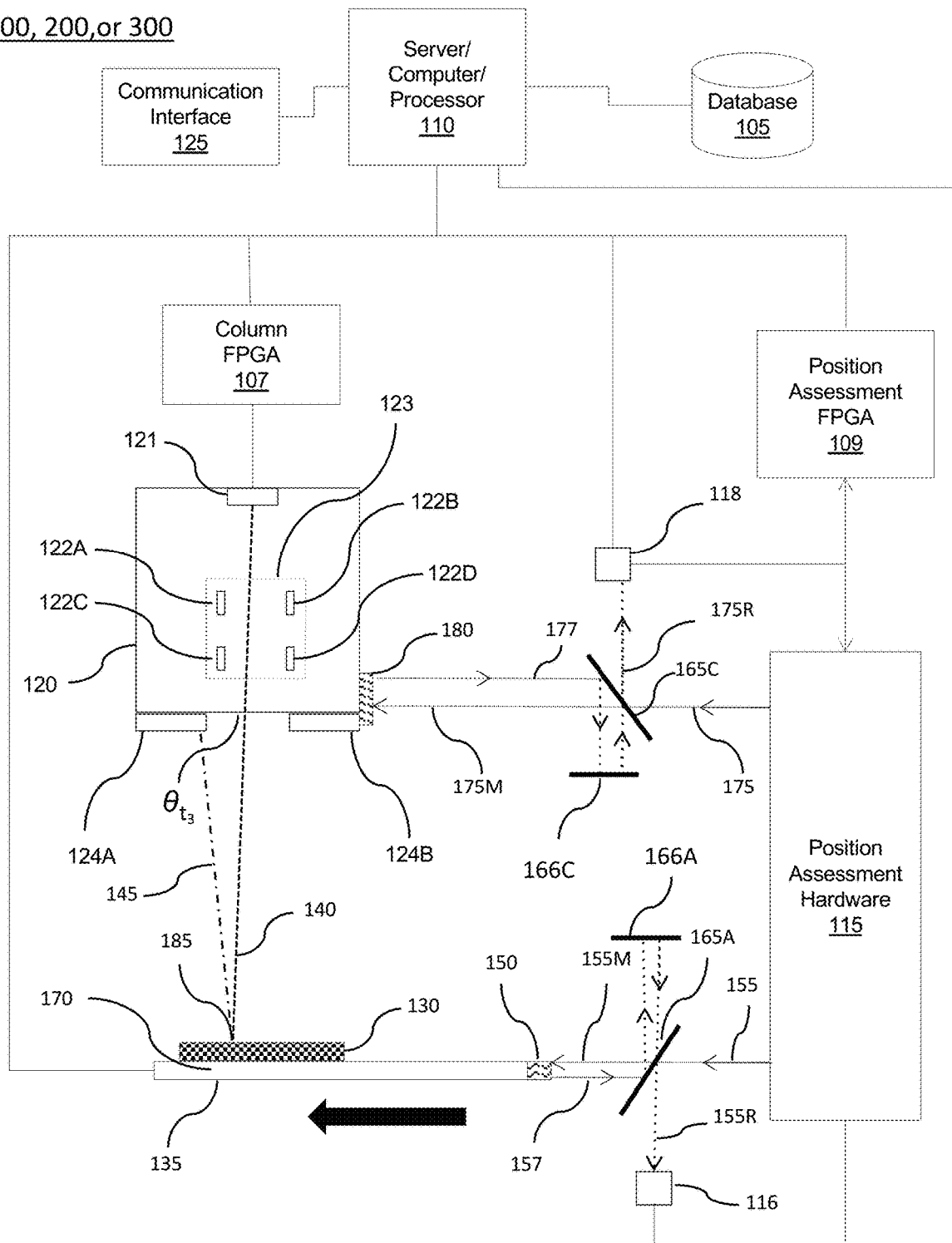
Figure 6:
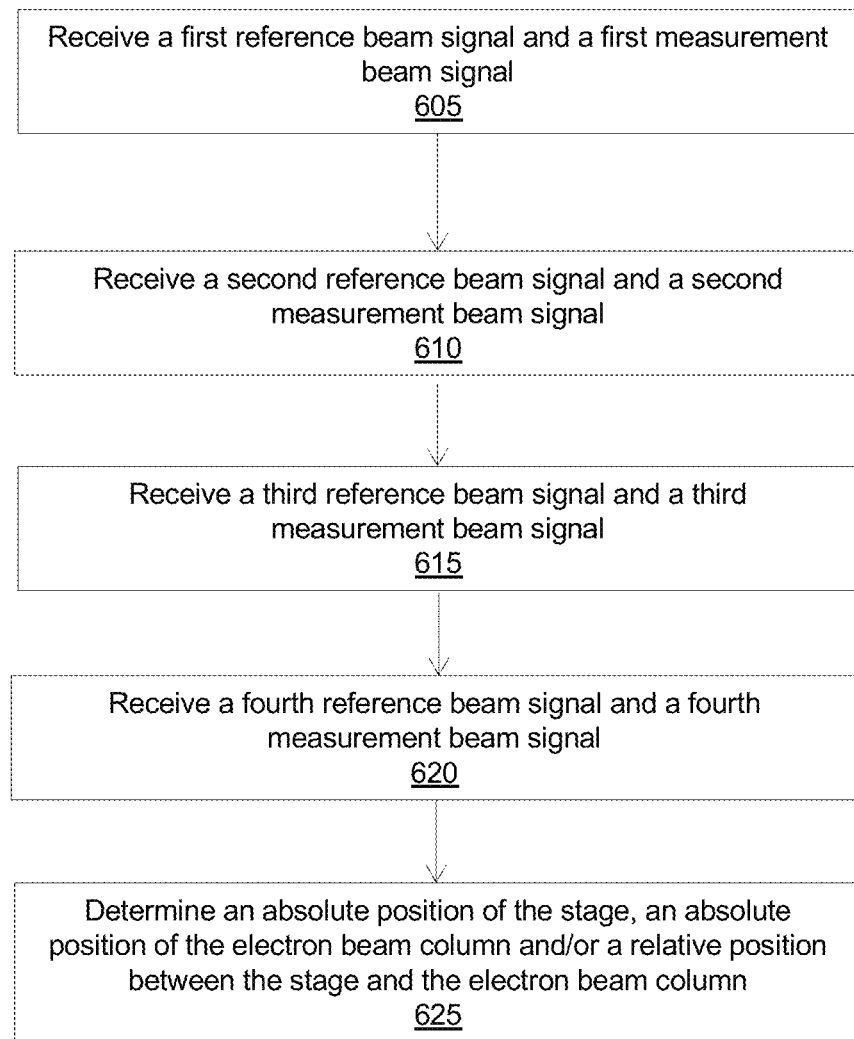
FIG. 6 provides a flowchart illustrating an exemplary process for determining an absolute position of a stage, an absolute position of an electron beam column, and/or a relative position between a stage and an electron beam column, in accordance with some embodiments of the present invention.

FIGS. 4A-4C provide a side view of a portion of system 100, 200, or 300 as stage 135 moves, from right to left, over a time interval between t1-t3 and electron beam 140 scans (e.g., scanning one point at a time, which is sometimes referred to as "step and scan") target 185 of the NCEM-enabled cell vehicle 130 during the time interval. A position of stage 135 and/or electron beam column 120 may be determined using the first, second, and/or third exemplary types of position assessment systems 100, 200, and/or 300, respectively, which are shown in FIGS. 1A/1B, 2A/2B, and 3A/3B, respectively and discussed with regard to process 600, 700, and 800, below and as shown in FIGS. 6, 7, and 8, respectively. The hardware and light beams needed to assess a position of stage 135 and/or electron beam column 120 is not shown in FIGS. 4A-4C to improve the clarity of the figures. A duration of interval t1-t3 may be sufficient to, for example, adequately scan, and/or perform a voltage contrast measurement of, target 185 and detect electrons emanating therefrom as detected electron signal 145. During the scanning, electron beam 140 stays focused on, and/or directed toward, target area 185 while stage 135 moves so that the entirety (or nearly the entirety) of target 185 is scanned and/or all (or most) targets 185 are scanned as stage 135 continues to move over time (i.e., over time interval t1-t3). Maintaining the focus of electron beam 140 on target 185 may be achieved by changing a direction of electron beam 140 (e.g., a deflection angle θ of electron beam 140 exiting electron beam column 120) over time using, for example, one or more of deflector(s) 122A, 122B, 122C, and/or 122D so that electron beam 140 remains incident on target 185 during time interval t1-t3.

For the purposes of illustration, FIG. 4A shows a position of stage 135 at a first point in time ($t_1$) where bean 140 exits electron beam column 121 with a first deflection angle $\theta t_1$ and is incident upon target 185. An exemplary range for first deflection angle $\theta t_1$ is 272-270 degrees relative to an X and Y axis of electron beam column 120 where the Y-axis of electron beam column runs vertically through a center of electron beam column 120 and the X-axis is parallel to a lower edge of electron beam column 120 and stage 135. As shown in FIG. 4A, electron signal 145 is detected by detector 124B. However, it will be understood that a portion of electron signal 145 may also be detected by detector 124A. As stage 135 moves to the left at $t_2$ electron beam 140 is incident upon target 185 with a second deflection angle $\theta t_2$ that decreases in magnitude relative to deflection angle $\theta t_1$. An exemplary range for second deflection angle $\theta t_2$ is 271-269 degrees relative to the X and Y axis of electron beam column 120. As shown in FIG. 4B, electron signal 145 is detected by detector 124B. However, it will be understood that a portion of electron signal 145 may also be detected by detector 124A. As stage 135 moves further to the left at $t_3$ electron beam 140 is directed toward target 185 with a third deflection angle $\theta t_3$ that is smaller in magnitude than $\theta t_2$. An exemplary range for $\theta t_3$ is 268-266 degrees relative to the X and Y axis of electron beam column 120. As shown in FIG. 4C, electron signal 145 is detected by detector 124A. However, it will be understood that portion of electron signal 145 may also be detected by detector 124B.

It is noted that the dimensions shown in FIGS. 4A-4C are not drawn to scale and that, in some embodiments, a difference in deflection angle θ between $t_1$ and $t_3$ may be very small (e.g., 0.0001-0.1 degrees). An exemplary speed of stage 135 is between 100 microns-100 mm per second and an exemplary period of time needed to sufficiently scan target 185 is 90 nanoseconds-50 microseconds. If, for example, a speed of stage 135 is 5 mm per second and the time needed to test target 185 is 3 microseconds, a distance that the stage has moved is very small (i.e., 15 nm). Thus, only a small deflection of beam 140 (e.g., a fraction of a degree) may be necessary to scan target 185 while it is moving along with stage 135.

Figure 5A:
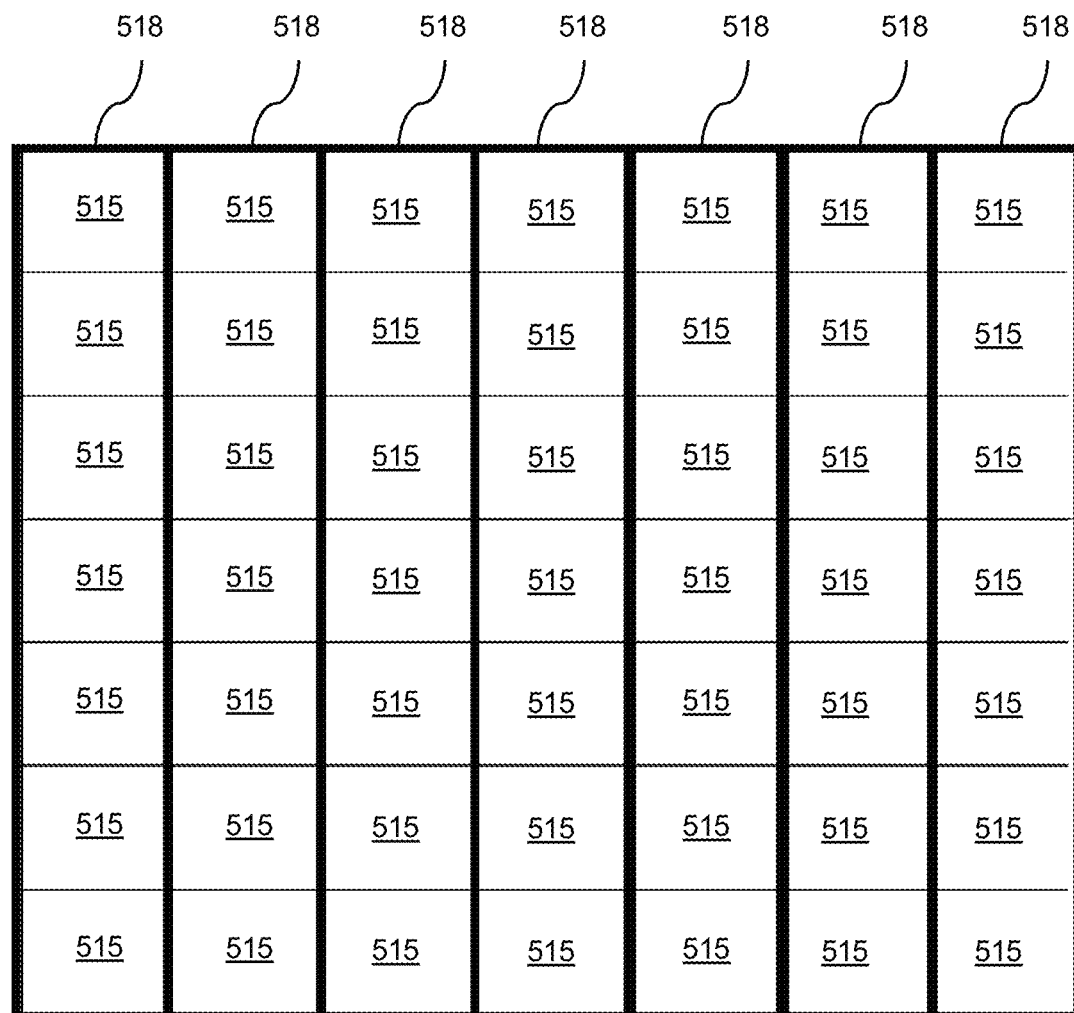
FIG. 5A provides a block diagram of exemplary tiles included within a NCEM-enabled cell vehicle, in accordance with some embodiments of the present invention.

FIG. 5A shows a portion of NCEM-enabled cell vehicle 130 divided into an exemplary array of tiles 515 arranged in columns, or swaths, 518. Although shown as vertical columns, a swath 518 may also be a horizontal row. The number of tiles 515 and the size/proportions of the respective tiles 515 of FIG. 5A are not drawn to scale. In many instances, dimensions of a tile are uniform over a NCEM-enabled cell vehicle 130, but this need not always be the case. Exemplary dimensions for a tile 515 range from 35-65 μm along the length and width. In many cases, the tiles 515 are square but, this need not always be the case.

Often times, a tile 515 may have one or more NCEM-enabled cells, a plurality of product standard cells, and at least one NCEM-enabled registration cell. In some embodiments, a tile 515 may also include one or more NCEM-enabled cells. In some embodiments, features and/or contents of tiles 515 and/or swaths 518 may be uniform (or may be intended to be uniform, with the exception of defects) across an NCEM-enabled cell vehicle 130. In other embodiments, features and/or contents of different tiles 515 and/or swaths 518 may vary (e.g., have different designs or functions) across an NCEM-enabled cell vehicle 130. Information regarding the contents and/or features of the tiles 515 and/or swaths 518 within an NCEM-enabled cell vehicle 130 may be referred to herein as a recipe.

When a NCEM-enabled cell vehicle 130 is subjected to non-contact electrical measurements, or testing, via exposure to a particle beam like electron beam 140, a stage, like stage 135, on which NCEM-enabled cell vehicle 130 is positioned may move NCEM-enabled cell vehicle 130 so that each tile 515 in a swath 518 is, for example, sequentially tested. When an end of a first swath 518 is reached, the stage may be configured to move NCEM-enabled cell vehicle 130 so that a second and, in many cases, adjacent swath 518 of tiles 515 may be subjected to non-contact electrical measurements. For example, when swaths 518 are vertically oriented as shown in FIG. 5A, the stage may move NCEM-enabled cell vehicle 130 in the Y-direction until the last tile 515 in the swath 518 is reached. Then, the stage may move in the X- and/or Y-direction(s) by an increment sufficient to align the particle and/or electron beam with the next swath 518 to be exposed to the NCEM so that the next swath 518 may be tested.

Figure 5B:
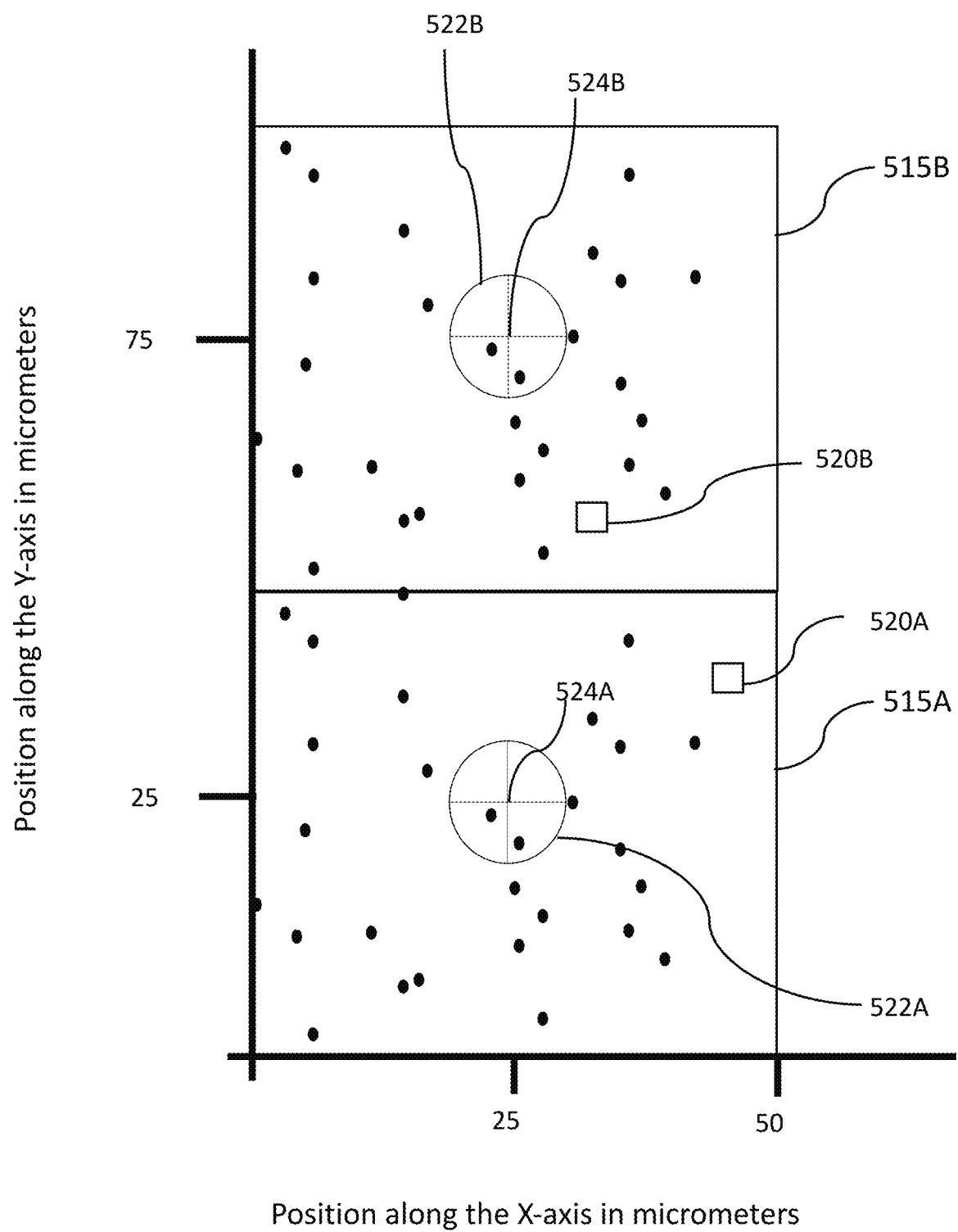
FIG. 5B provides a block diagram of exemplary tiles within a swath, in accordance with some embodiments of the present invention.

FIG. 5B provides a block diagram of two exemplary tiles 515A and 515B included within a swath like swath 518. Each of tile 515A and 515B includes a NCEM-enabled registration cell 520A and 520B (respectively) and a plurality of target NCEM-enabled cells that are shown in FIG. 5B as filled-in circles, or dots, that are shown in exemplary positions through tile 515A and 515B. It will be understood that any number of NCEM-enabled cells may be resident within a tile 515 and that they may be situated at positions other than what is shown in FIG. 5B. For example, when NCEM-enabled cell vehicle 130 is a test chip or test wafer, a density of cells may be much greater than what is shown in FIG. 5B. In addition, although only one NCEM-enabled registration cell 520 is shown in tile 515, a tile may have a plurality of NCEM-enabled registration cells 520.

A NCEM-enabled registration cell 520 may be an area of a tile 515 that is scanned and/or imaged for the purpose of determining a precise position of the tile and/or features of the tile. A NCEM-enabled registration cell 520 may have exemplary dimensions ranging in size from 1-5 μm and may be squarely-shaped or rectangularly-shaped although this need not necessarily be the case. NCEM-enabled registration cell 520 may include one or more NCEM-enabled cells, NCEM-enabled cells, and/or product standard cells and may be positioned anywhere within a tile.

In some embodiments, a NCEM-enabled registration cell 520 may include features that are relatively easy to discern when exposed to an NCEM as, for example, a distinct object (e.g., dark or light square, rectangle and/or line) and/or pattern (e.g., a set of dark lines, a set of dark rectangles, a set of dark lines and rectangles) when a response of the area 520 is detected and, for example, converted into a graph. Distinctiveness of features within data corresponding to an NCEM-enabled registration cell 520 may aid in the identification of these features within a scanned area that is supposed to correspond to the NCEM-enabled registration cell. A position and/or relative position of these easily discernable features may then be determined via analysis of the detected electrons, voltage contrast measurement, and/or a graph as discussed below.

Each tile 515A and 515B may have an exact center point 524A and 524B, respectively, where a dimension of the tile in the X- and Y-directions is precisely 0.5, or one half, of the respective width and height (i.e., displacement in the X- and Y-directions) as shown in FIG. 5B. Each tile 515A and 515B may also have a settling window 522A and 522B, respectively, that is in an approximate center of tile 515 that extends from exact center point 524A and 524B, respectively, in the X- and Y-directions by, for example, a percentage (e.g., 0.001-2%) of the length and/or width of the tile or a set distance within a range of 0.01-1 μm, with approximately 0.5 μm being common for many systems like system 100, 200, and/or 300. In some embodiments, a size and/or dimension of settling window 522 may be responsive to a precision and/or range of motion of electron beam column 120, stage 135, and/or position assessment tool 115.

When tiles 515A and 515B are sequentially scanned a stage like stage 135 may move in the Y-direction from a position of 0 toward an position of 25 micrometers at a relatively fast velocity of, for example, 0.013 m/s and then may decelerate to a velocity of approximately 0.0001 m/s upon approaching a position corresponding settling window 524A until tile 515A is precisely positioned within the field of view of the electron beam column (e.g., exact center point 524A aligns with the center of the field of view of the electron beam column). When settling window 522A is within the center of the field of view of the electron beam column and/or when the velocity of the stage has slowed to below a threshold value (e.g., approximately 0.0001 m/s), scanning of NCEM-enabled registration cell 520A and the NCEM-enabled cells of first tile 515A may commence and/or proceed as described herein. Once all of the NCEM-enabled cells of first tile 515A are scanned or otherwise exposed to the electron beam (while the stage is slowly moving to a stop corresponding to settling window 522A and/or when stopped), the stage may move so that second tile 515B is positioned within the field of view of the electron beam column. This motion may involve accelerating the stage so that it moves approximately 50 micrometers in the Y-direction to the settling window 522B of second tile 515B. When settling window 522B is within the center of the field of view of the electron beam column and/or when the velocity of the stage has slowed to below a threshold value (e.g., approximately 0.0001 m/s), which may indicate that settling window 522B is within the center of the field of view of the electron beam column, scanning of second NCEM-enabled registration cell 520B and the NCEM-enabled cells of second tile 515B may commence as described herein. Once all of the NCEM-enabled cells of second tile 515B are scanned or otherwise exposed to the electron beam, the stage may move so that another tile (not shown) is positioned within the field of view of the electron beam column. This process may continue until all tiles within a swath like swath 518 and/or a NCEM-enabled cell vehicle 130 are exposed to the electron beam or scanned.

Figure 5C:
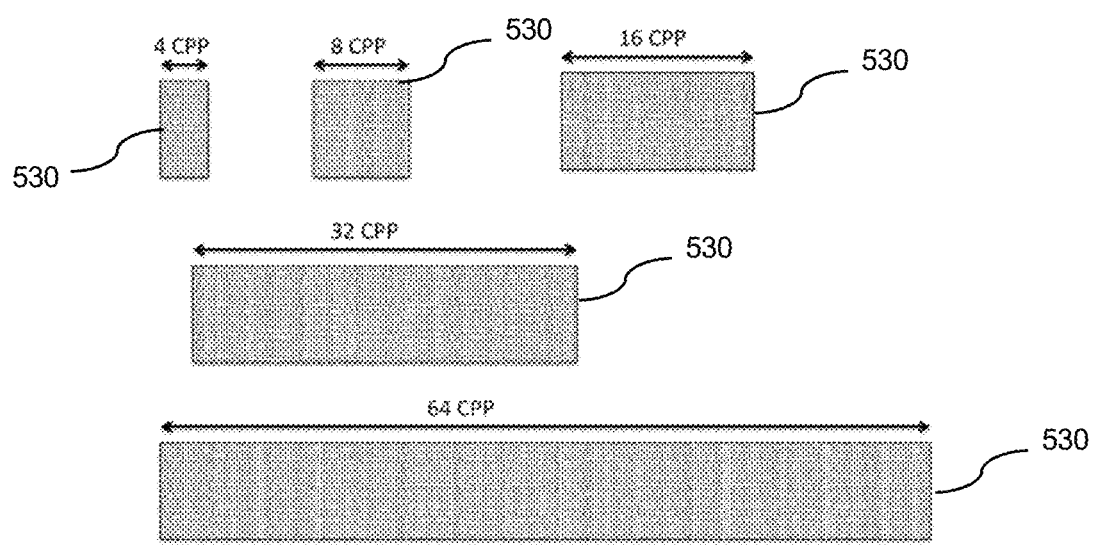
FIG. 5C provides an outline of exemplary NCEM-enabled cells, in accordance with some embodiments of the present invention.

FIG. 5C provides a block diagram of an exemplary logic section 525 of an NCEM-enabled cell vehicle 130 that may be included in a tile like tile 515. Logic section 525 includes NCEM-enabled registration cell 520 as well as a plurality of NCEM-enabled cells 530 of various widths and a plurality of product standard cells 540 of various widths. Product standard cells 540 may be any cell filled with features used to facilitate the operation of logic section 525 as may be defined by, for example, a designer and/or fabricator of logic section 525. For example, product standard cells 540 may include circuits, capacitors, transistors, and so on. In some cases, a product standard cell 540 may be a logic cell.

In FIG. 5C, the NCEM-enabled cells 530 are depicted as shaded cells, or regions. NCEM-enabled cells 530 may be placed wherever a traditional cell would otherwise be placed. However, the invention places no restriction on the distribution of NCEM-enabled cells 530. While they would typically appear in each standard cell row, they need not do so. Placement of NCEM-enabled cells 530 can be regular, semi-regular (e.g., at least one cell every X nm, or every Y cells), pseudo-random, and/or irregular/random. In some cases, two or more, NCEM-enabled cells 530 may be adjacent to each other. At times, one or more of NCEM-enabled cells 530 may be double (or greater) height cells. In some embodiments, a logic section like logic section 525 may include both NCEM-enabled cells 530 and other types of cells.

Figure 5D:
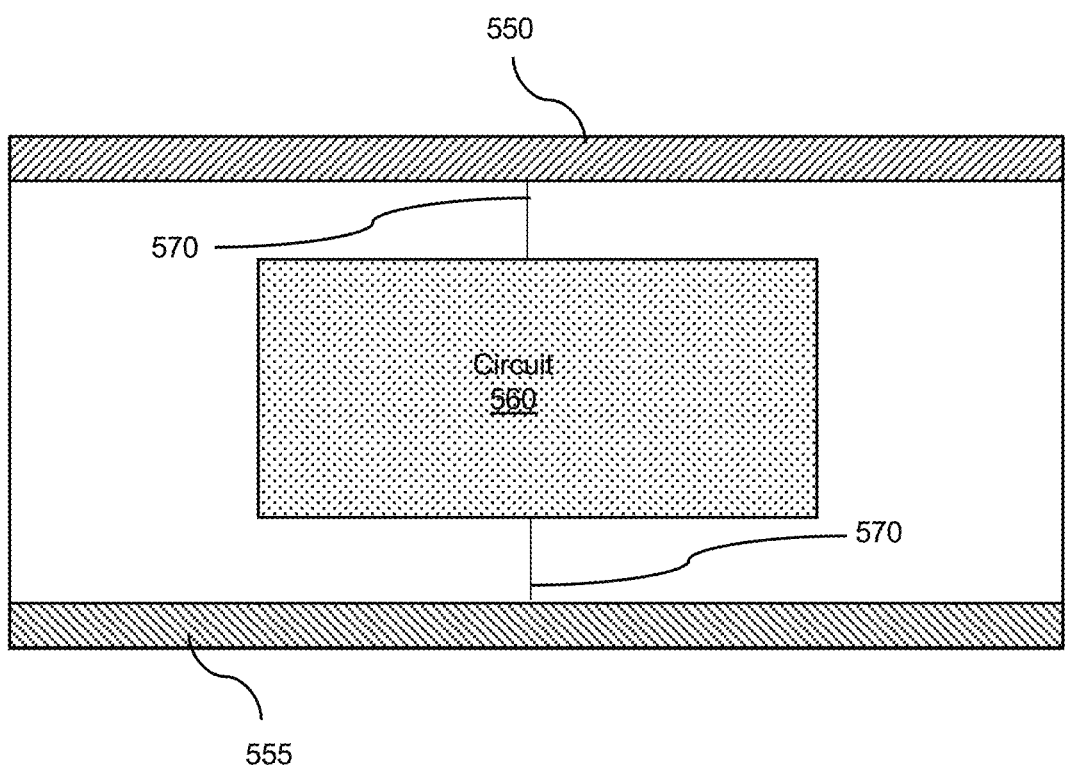
FIG. 5D provides a block diagram of an exemplary NCEM-enabled cell, in accordance with some embodiments of the present invention.

FIG. 5D provides an outline of exemplary NCEM-enabled cells 530 configured for use in connection with certain embodiments of the invention. NCEM-enabled cells 530 may include certain features necessary for compatibility with the logic cells, or product standard cells, that are used to form circuits on a chip. For example, NCEM-enabled cells 530 may include one or more test features or circuits that may be responsive to a non-contact electronic measurement method such as an electron beam that may be embodied as electron beam 140. An example of internal features of an NCEM-enabled cell 530 is provided in FIG. 5E and discussed below.

The NCEM-enabled cells 530 may be configured to occupy space between other (typically necessary) features of a NCEM-enabled cell vehicle such as product standard cells 540. NCEM-enabled cells 530 may be of a height that is consistent with product standard cells in a library of product standard cells (or an integer multiple of that height) and may include power/ground rails that, for example, extend horizontally across the cells (often, though not necessarily, at the top and bottom of each cell).

The NCEM-enabled cells 530 disclosed herein may be of different widths; examples of which are shown in FIG. 5D. For example, NCEM-enabled cells 530 may be available in various widths that may, for example, be multiples of the minimum contacted poly pitch (CPP) permitted by the fabrication process for NCEM-enabled cell vehicle 130. By way of illustration and not limitation, FIG. 5D shows NCEM-enabled cells 530 that are 4 CPP, 13 CPP, 16 CPP, 32 CPP, and 64 CPP in width, but it will be appreciated that an NCEM-enabled cell 530 may be any appropriate width.

Figure 5E:
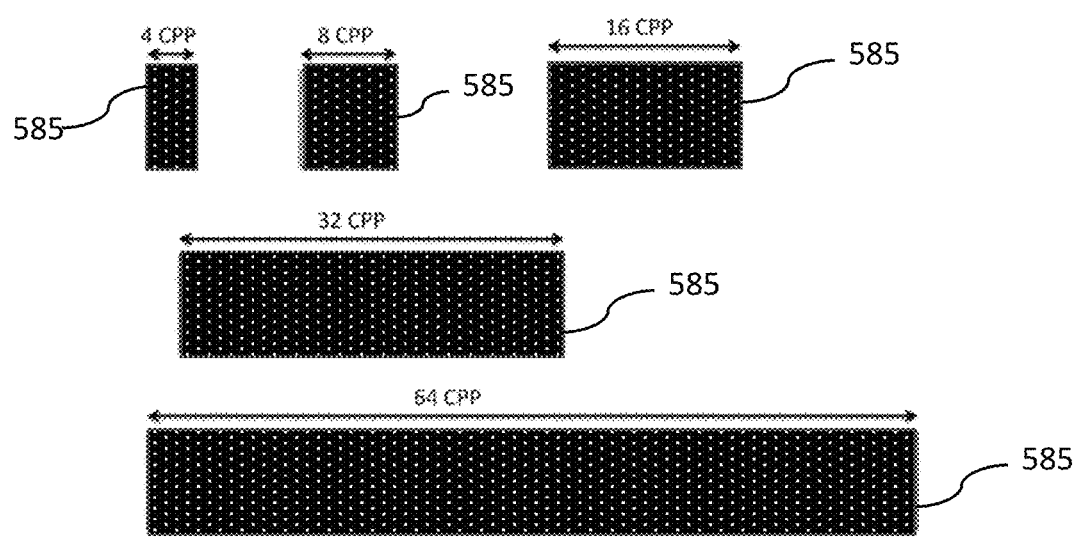
FIG. 5E provides an outline of exemplary registration NCEM-enabled fill cells, in accordance with some embodiments of the present invention.

FIG. 5E provides an outline of exemplary registration NCEM-enabled fill cell 585. Reference NCEM-enabled fill cell 585 may be incorporated in a tile in a manner similar to NCEM-enabled cells 530 and may be randomly, periodically, or pseudo-randomly positioned within a tile. An exemplary layout of a tile that includes reference NCEM-enabled fill cell 585 is provided by FIG. 5L and discussed below.

Registration NCEM-enabled fill cell 585 disclosed herein may be of different widths; examples of which are shown in FIG. 5E. For example, registration NCEM-enabled fill cell 585 may have various widths that may, for example, be multiples of the minimum contacted poly pitch (CPP) permitted by the fabrication process. By way of illustration, FIG. 5E shows registration NCEM-enabled fill cell 585 that are 4 CPP, 8 CPP, 16 CPP, 32 CPP, and 64 CPP in width, but it will be appreciated that a registration NCEM-enabled fill cell 585 may be any appropriate width.

Registration NCEM-enabled fill cell 585 may be configured to have easily discernable and/or registerable features when subjected to non-contact electrical measurements. For example, registration NCEM-enabled fill cell 585 may have solid edges, components with regularly-shaped (e.g., square or rectangular) perimeters, and/or portions thereof may be uniformly filled with material so that they show up well when subject to a non-contact electronic measurement (e.g., voltage contrast and/or image) as, for example, regions with high or low detected electron intensity.

Figure 5F:
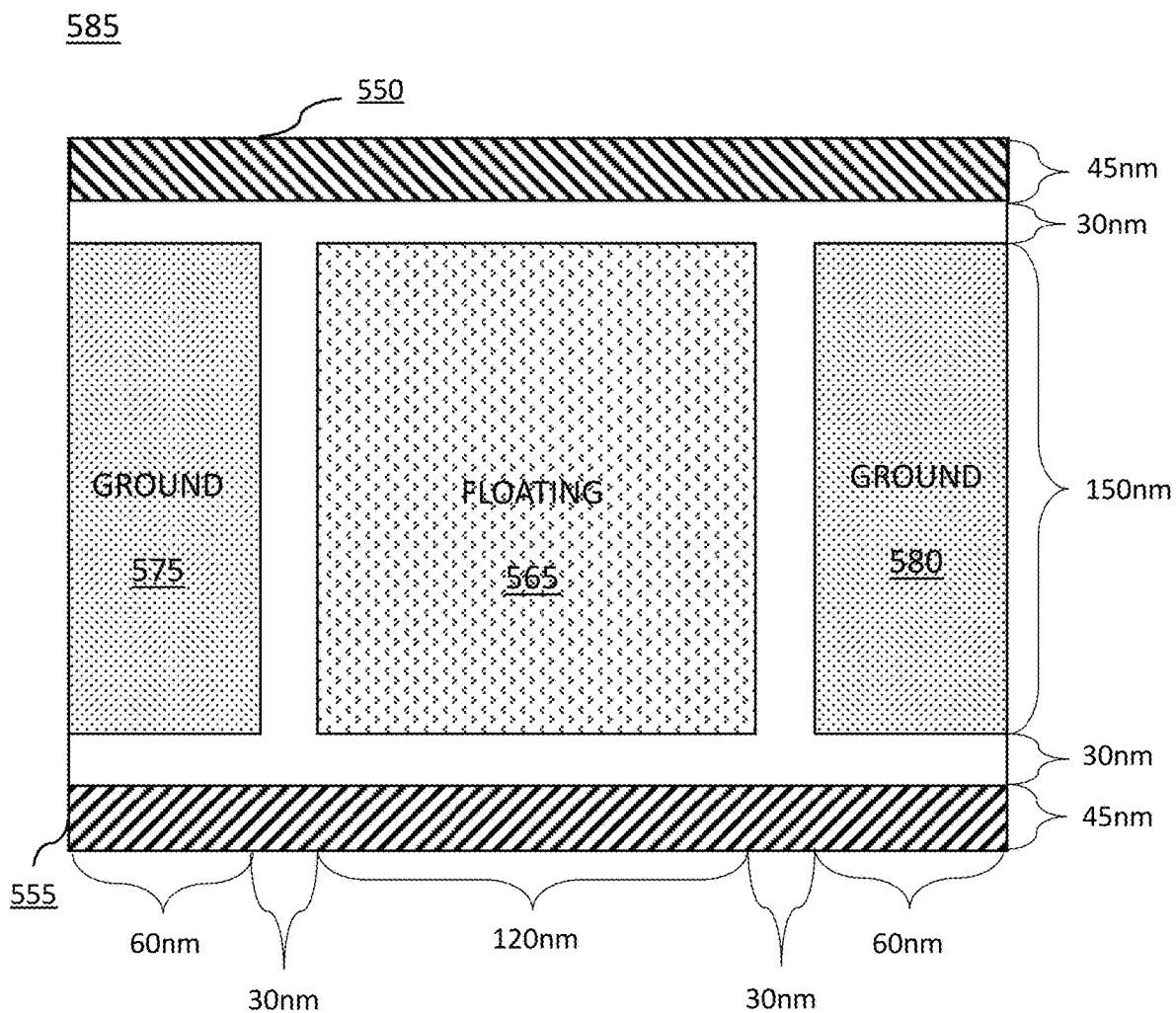
FIG. 5F provides a block diagram of components included within an exemplary registration NCEM-enabled fill cell, in accordance with some embodiments of the present invention.

FIG. 5F provides a block diagram of an exemplary registration NCEM-enabled fill cell 585 that includes power rail 430, ground rail 435, a floating component 565, a first ground component 575, and a second ground component 580. First ground 575 and/or second ground 580 may be configured to abut an edge (e.g., a left-side or right-side edge) of registration NCEM-enabled fill cell 585 and may be electrically grounded. Floating component 565 may not be electrically coupled to power rail 430 and/or ground rail 435 and may not have any other electrical connection to the tile, NCEM-enabled cell vehicle housing the registration NCEM-enabled cell. Exemplary dimensions along an X- and Y-axis for a registration NCEM-enabled fill cell 585 are also provided in FIG. 5F where along the X-axis an exemplary width of first ground 575 is 60 nm, an exemplary width of a space between first ground 575 and floating component 565 is 30 nm, an exemplary width of floating component 565 is 120 nm, an exemplary width of a space between floating component 565 and second ground 575 is 30 nm, and an exemplary width of second ground 580 is 60 nm. Along the Y-axis an exemplary length of power rail 430 is 45 nm, an exemplary length of a space between power rail 430 and first and/or second ground 575 or 580 is 30 nm, an exemplary length of first and/or second ground 575 and/or 580 is 150 nm, an exemplary length of a space between first and/or second ground 575 and/or 580 is 30 nm, and an exemplary length of ground rail is 45 nm.

In some embodiments, registration NCEM-enabled fill cell 585 may be configured to enable testing in one or two dimensions that may show bright contrasts (e.g., relatively high or low detected electron intensity) between the components of registration NCEM-enabled fill cell 585 and/or a space between two components (e.g., first ground 575, second ground 580, floating component 565, power rail 430, and/or ground rail 435) of registration NCEM-enabled fill cell 585. For example, a particle beam 140 may be projected toward registration NCEM-enabled fill cell 585 along the X- and/or Y-axis so that it intersects with ground 575, ground 580, and/or floating component 565 and a resultant detected electron beam may be analyzed to determine a position of an edge of the ground 575, ground 580, and/or floating component 565 exposed to the particle beam 140. In a voltage-contrast embodiment, floating component 565 may be configured to provide a dark spot with clearly defined edges (e.g., configured so that a number of detected electrons emitted in response to interaction with the particle beam 140 is low). First and/or second ground 575 and/or 580 may be configured to provide a relatively bright response (i.e., stronger/more intense detected electron signal) than floating component 565.

Figure 5G:
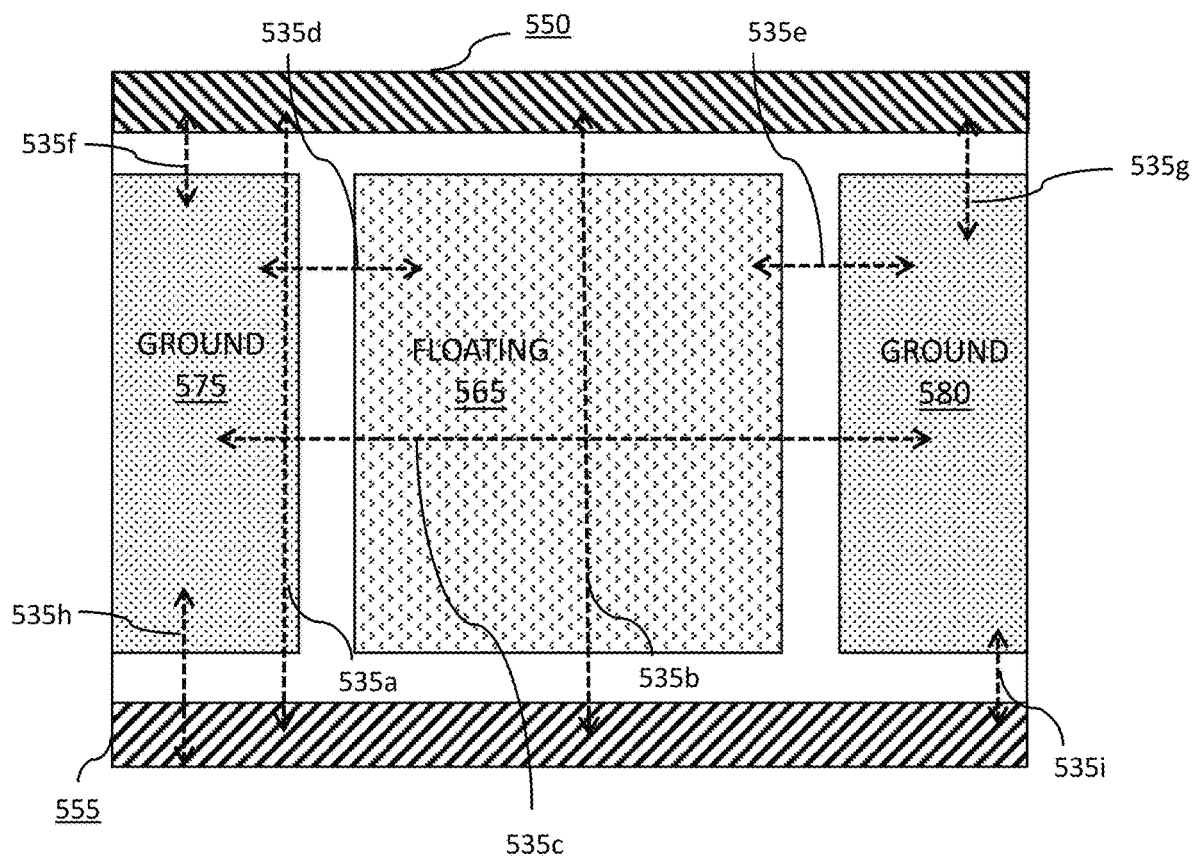
FIG. 5G provides a block diagram of components included within an exemplary registration NCEM-enabled fill cell with exemplary particle beam scanning pathways superimposed thereon, in accordance with some embodiments of the present invention.

FIG. 5G provides a block diagram of exemplary registration NCEM-enabled fill cell 585 with exemplary particle beam scanning pathways 535 superimposed thereon. The exemplary particle beam scanning pathways 535 include a first particle beam scanning pathway 535a, a second particle beam scanning pathway 535b, a third particle beam scanning pathway 535c, a fourth particle beam scanning pathway 535*d*, a fifth particle beam scanning pathway 535*e*, a sixth particle beam scanning pathway 535*f*, a seventh particle beam scanning pathway 535*g*, an eighth particle beam scanning pathway 535*h*, and a ninth particle beam scanning pathway 535*i*. In some embodiments, not all the pathways 535 shown in FIG. 5G are used. For example, in some instances, only scanning pathway 535*b* and/or 535*c* may be used to register the NCEM-enabled registration cell in the X and/or Y directions.

Figure 5H:
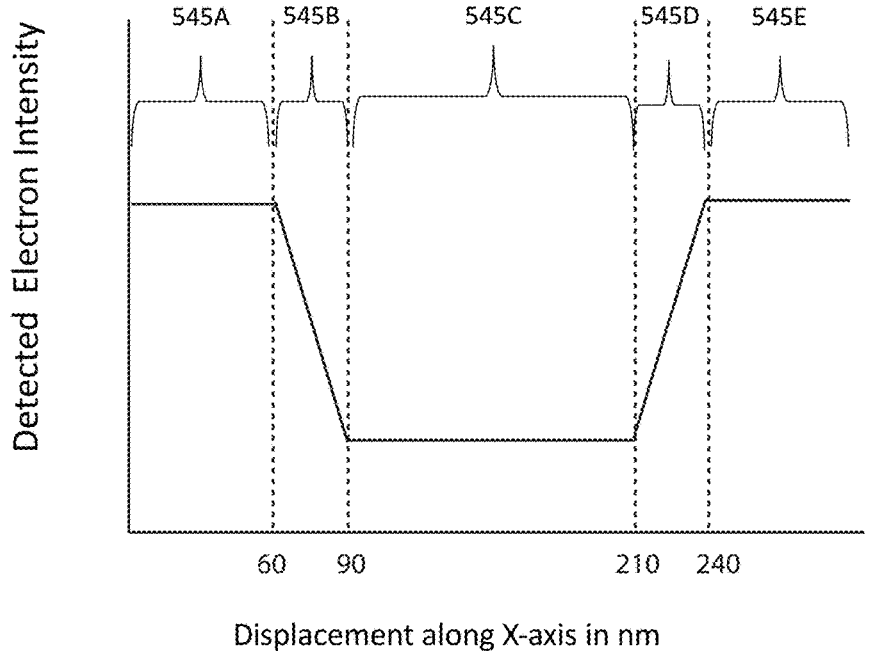
FIGS. 5H-5K provide a series of graphs of detected electron intensity as a function of displacement along the X or Y axis, in accordance with some embodiments of the present invention.

FIGS. 5H-5G provide a series of graphs 501-504, respectively, of detected electron intensity as a function of displacement along the X- or Y-axis. In particular, FIG. 5H provides a graph 501 of detected electron intensity as a function of displacement along the X axis that may show an indication of a response of exemplary registration NCEM-enabled fill cell 585 shown in FIGS. 5F and 5G to a particle beam 140 scanned along the X-axis on a path like scan path 535*c* shown in FIG. 5G. Graph 501 shows a relatively high detected electron intensity for X-axis a first region 545A corresponding to first ground 575 that is positioned between 0-60 nm. From there, the detected electron intensity drops to a minimum value between 60 nm and 90 mm in a second region 545B that corresponds to a space on the registration NCEM-enabled cell between first ground 575 and floating component 565. The minimum value for detected electron intensity is maintained through a third region 545C between 90 nm and 185 nm, which corresponds to a position of floating component 565. Between 185 nm and 240 nm the secondary voltage intensity increases to the high detected electron intensity value in a fourth region 545D that corresponds to a space on the registration NCEM-enabled cell between floating component 565 and second ground 580. The high detected electron intensity value is maintained from 240 nm to 300 nm in a fifth region 545E that corresponds to second ground 580.

Figure 5I:
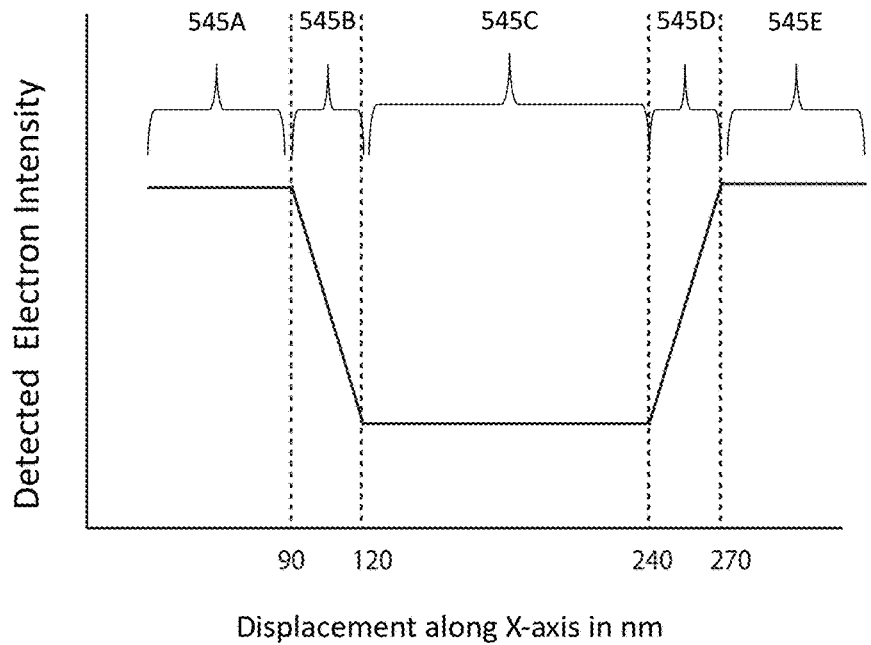

FIG. 5I provides a graph 502 of detected electron intensity as a function of displacement along the X axis that shows an indication of a response of exemplary registration NCEM-enabled fill cell 585 shown in FIGS. 5F and 5G to a particle beam 140 scanned along the X-axis on a path like scan path 535*c* shown in FIG. 5G. The detected electron intensity values shown in graph 502 are displaced on the X-axis by 70 nm relative to the values shown in graph 502. This difference in displacement between graphs 501 and 502 may indicate that the registration NCEM-enabled cell (and consequently a tile housing the registration NCEM-enabled cell) has shifted approximately 30 nm along the X-axis and/or that there is a difference of 30 nm between a theoretical position for the registration NCEM-enabled cell (i.e., a calculated position for the registration NCEM-enabled cell based on a recipe for a tile and/or NCEM-enabled cell vehicle) and an actual position of the registration NCEM-enabled cell.

Figure 5J:
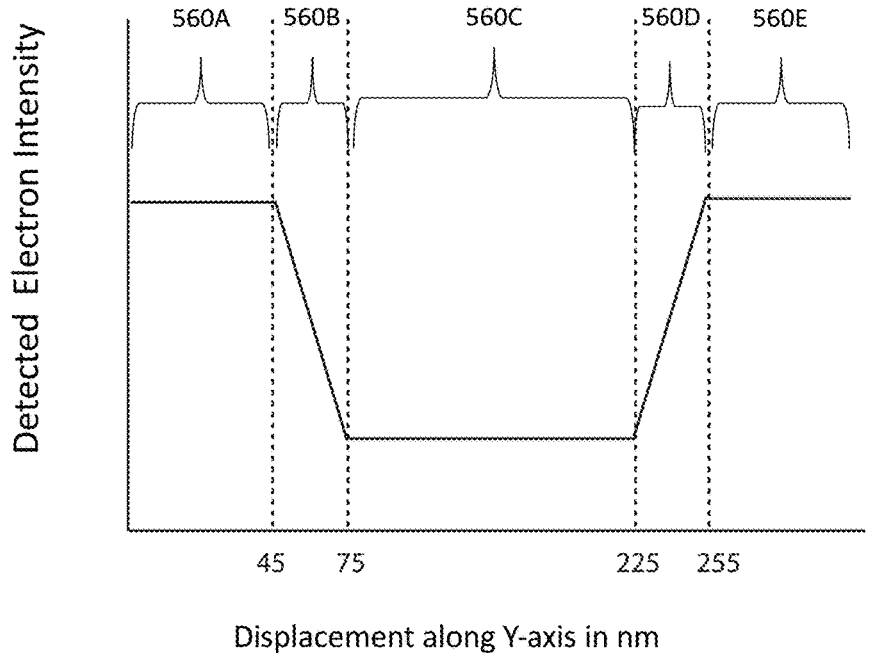

FIG. 5J provides a graph 503 of detected electron intensity as a function of displacement along the Y-axis that may show an indication of a response of exemplary registration NCEM-enabled fill cell 585 shown in FIGS. 5G and 5G to a particle beam scanned along the Y-axis on a path like scan path 535*b* shown in FIG. 5G.

Graph 503 shows a relatively high detected electron intensity along the Y-axis in a first region 560A corresponding to power rail 430 that is positioned between 0-45 nm. From there, the detected electron intensity drops to a minimum value between 45 nm and 75 mm in a second region 560B that corresponds to a space on the registration NCEM-enabled cell between power rail 430 and floating component 565. The minimum value for detected electron intensity is maintained through a third region 560C between 75 nm and 225 nm, which corresponds to a position of floating component 565. Between 225 nm and 255 nm the secondary voltage intensity increases to the high detected electron intensity value in a fourth region 560D that corresponds to a space on the registration NCEM-enabled cell between floating component 565 and ground rail 435. The high detected electron intensity value is maintained from 255 nm to 300 nm in a fifth region 560E that corresponds to ground rail 435 580.

Figure 5K:
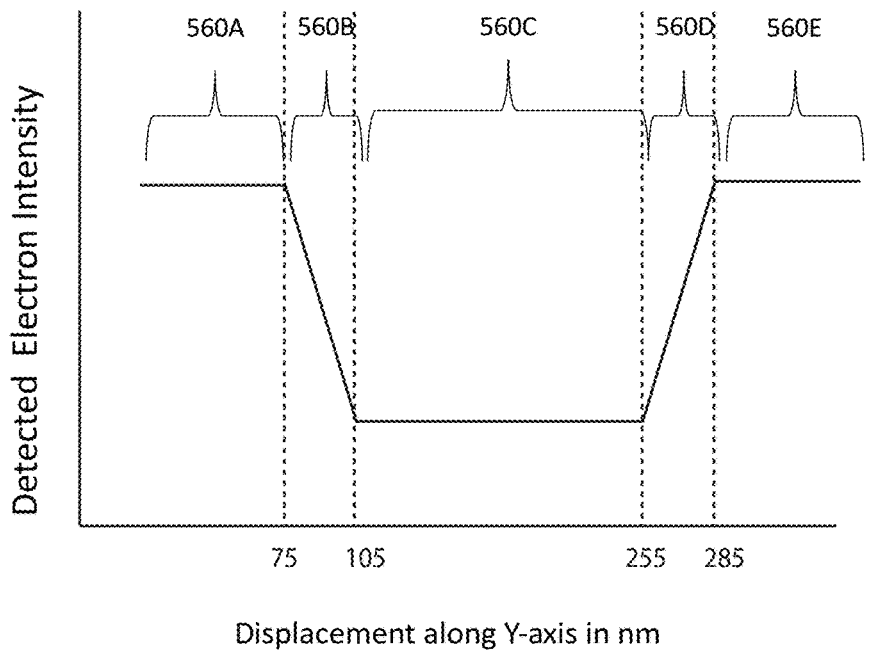

FIG. 5K provides a graph 504 of detected electron intensity as a function of displacement along the y-axis that shows an indication of a response of exemplary registration NCEM-enabled fill cell 585 shown in FIGS. 5F and 5G to a particle beam 140 scanned along the y-axis on a path like scan path 535*c* shown in FIG. 5K. The detected electron intensity values shown in graph 504 are displaced on the Y-axis by 30 nm relative to the values shown in graph 504. This difference in displacement between graphs 503 and 504 may indicate that the registration NCEM-enabled cell (and consequently a tile housing the registration NCEM-enabled cell) has shifted approximately 50 nm along the y-axis and/or that there is a difference of 50 nm between a theoretical position for the registration NCEM-enabled cell (i.e., a calculated position for the registration NCEM-enabled cell based on a recipe for a tile and/or NCEM-enabled cell vehicle) and an actual position of the registration NCEM-enabled cell.

Figure 5L:
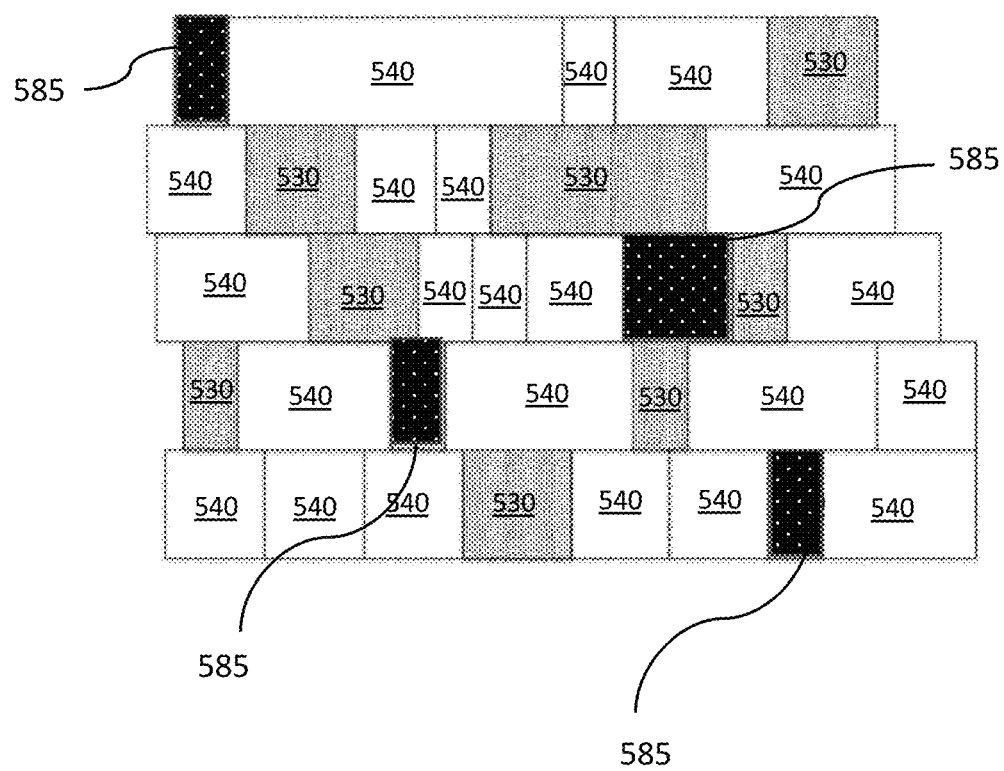
FIG. 5L provides a block diagram of an exemplary standard cell logic section 601 that includes both NCEM-enabled fill cells and registration NCEM-enabled fill cells, in accordance with some embodiments of the present invention.

FIG. 5L provides a block diagram of an exemplary standard cell logic section 521 that includes both NCEM-enabled cells 530 and registration NCEM-enabled fill cell 585 of various widths/sizes. The NCEM-enabled cells 530 are depicted in FIG. 5L as lightly shaded cells and the registration NCEM-enabled fill cell 585 are depicted in FIG. 5L as darkly shaded cells. Registration NCEM-enabled cell-enabled fill cell 585 may be placed wherever an NCEM-enabled cell and/or traditional cell would otherwise be placed. However, in some embodiments, registration NCEM-enabled fill cell 585 may be at an outer edge of a logic section to facilitate locating the registration NCEM-enabled fill cell 585 and/or position determination for a NCEM-enabled cell vehicle thereof that includes a registration NCEM-enabled fill cell 585. The invention places no restriction on the distribution of NCEM-enabled cells 530 or registration NCEM-enabled fill cell 585.

FIG. 6 provides a flowchart illustrating an exemplary process 600 for determining an absolute position of a stage, such as stage 135, an absolute position of an electron beam column such as electron beam column 120, and/or a relative position between a stage and an electron beam column. Some motion of the stage may be active, or intentional, as may occur when the stage is moving a NCEM-enabled cell vehicle 130 as part of, for example, an inspection process. The active motion may be continuous or variable and is typically in the X- and/or Y-direction(s). Motion of the stage and/or electron beam may also be passive (e.g., environmental and/or induced by operation of the stage, electron beam column, and/or other equipment). Such motion may be occur in the X-, Y- and/or Z-direction(s) and may be difficult to predict. This motion may be due to, for example, vibrations of the stage and/or hardware supporting the stage and/or other components of the system executing process 600. Process 600 may be executed by any of the systems and/or system components disclosed herein such as system 100.

In step 605, a first reference beam signal that may correspond to a first reference beam like first reference beam 155R and a first measurement beam signal that may correspond to a first measurement beam like first measurement beam 155M may be received by, for example, a processor like server/computer/processor 110 and/or position assessment FPGA 109 from a detector like detector like detector 116 that has converted the optical signals of the first reference and first measurement beams into the first reference beam digital signal and first measurement beam digital signal, respectively. The first reference and first measurement beam may be resultant from a first light beam (or other type of electro-magnetic radiation) like beam 155 that may have been directed toward a first beam-splitting mirror, like beam-splitting mirror 165A that is positioned between a light source as may be resident in position assessment hardware 115 and a mirror resident on the stage like first stage mirror 150. The first light beam may be split by the first beam-splitting mirror into the first reference beam and the first measurement beam as shown in, for example, FIGS. 1A and 1B. The first reference beam may be directed toward a photodetector by the first beam-splitting mirror and may then be received by first detector. The first measurement beam may be incident on the first mirror and reflected back toward a first flat mirror like first flat mirror 166A. The first flat mirror may then direct a portion of the first measurement beam toward the first photodetector where it may be received and communicated to the processor.

In step 610, a second reference beam signal that may correspond to a second reference beam like second reference beam 160R and a second measurement beam signal that may correspond to a second measurement beam like second measurement beam 160M may be received by, for example, a processor like server/computer/processor 110 and/or position assessment FPGA 109 from a detector like detector like detector 117 that has converted the optical signals of the first reference and first measurement beams into the first reference beam signal and first measurement beam signal, respectively. The second reference and second measurement beam may be resultant from a second light beam (or other type of electro-magnetic radiation) like beam 160 that may have been directed toward a second beam-splitting mirror, like beam-splitting mirror 165B that is positioned between a light source as may be resident in position assessment hardware 115 and a mirror resident on the stage like second stage mirror 170. The second light beam may be split by the second beam-splitting mirror into the second reference beam and the second measurement beam. The second reference beam may be directed toward a second photodetector like second photodetector 117 by a second flat mirror like second flat mirror 166B and may then be received by the second detector where it may be received and communicated to the processor.

Optionally, in step 615, a third reference beam signal that may correspond to a third reference beam like third reference beam 175R and a third measurement beam signal that may correspond to a third measurement beam like third measurement beam 175M may be received by, for example, a processor like server/computer/processor 110 and/or position assessment FPGA 109 from a detector like detector like detector 118 that has converted the optical signals of the third reference and third measurement beams into the third reference beam digital signal and third measurement beam digital signal, respectively. The third reference and third measurement beam may be resultant from a third light beam (or other type of electro-magnetic radiation) like beam 175 that may have been directed toward a third beam-splitting mirror, like beam-splitting mirror 165C that is positioned between a light source as may be resident in position assessment hardware 115 and a mirror resident on the electron beam column like mirror 180. The third light beam may be split by the third beam-splitting mirror into the third reference beam and the third measurement beam. The third reference beam may be directed toward a third photodetector like third detector 118 by the third beam-splitting mirror and may then be detected by the third detector. The third measurement beam may be incident on the third mirror of the electron beam column and reflected back toward a third flat mirror like third flat mirror 166C which may then direct the third reflected beam toward the third photodetector where it may be received and communicated to the processor.

In many cases, when step 615 is performed, a fourth reference beam signal that may correspond to a fourth reference beam like fourth reference beam 178R and a fourth measurement beam signal that may correspond to a fourth measurement beam like fourth measurement beam 178M may be received by, for example, a processor like server/computer/processor 110 and/or position assessment FPGA 109 from a detector like detector like detector 119 that has converted the optical signals of the fourth reference and fourth measurement beams into the fourth reference beam digital signal and fourth measurement beam digital signal, respectively (step 620). The fourth reference and fourth measurement beam may be resultant from a fourth light beam (or other type of electro-magnetic radiation) like beam 178 that may have been directed toward a fourth beam-splitting mirror, like fourth beam-splitting mirror 165D that is positioned between a light source as may be resident in position assessment hardware 115 and a mirror resident on the electron beam column like mirror 181. The fourth light beam may be split by the fourth beam-splitting mirror into the fourth reference beam and the fourth measurement beam. The fourth reference beam may be directed toward a photodetector like photodetector 119 by the fourth beam-splitting mirror and may then be received by the fourth detector. The fourth measurement beam may be incident on the fourth mirror of the electron beam column and reflected toward a fourth flat mirror like fourth flat mirror 166D as a fourth reflected beam like fourth reflected beam 179. The fourth flat mirror may then direct the fourth reflected beam toward the fourth photodetector where it may be received and communicated to the processor.

Then, in step 625, an absolute position of the stage may be determined using, for example, the signals received in steps 605 and 610; an absolute position of the electron beam column be determined using, for example, the signals received in steps 615 and 620; and/or a relative position between the electron beam column and stage may be determined using the signals received in steps 605, 610, 615, and 620.

When an absolute position of the stage is determined, execution of step 625 may include a comparison between the first reference beam and the first reflected beam to determine the difference therebetween. Often times, the difference will be a difference in phase between the first reference beam and the first reflected beam. This phase difference may be used to determine an absolute position of the first mirror and therefore, the stage, in a first direction (e.g., X-direction). Execution of step 625 may further include a comparison between the second reference beam and the second reflected beam to determine the difference (e.g., phase difference) therebetween. This difference may be used to determine an absolute position of the second mirror and therefore, the stage, in a second direction (e.g., Y-direction).

When an absolute position of the electron beam column is determined, execution of step 625 may include a comparison between the third reference beam and the third reflected beam to determine the difference (e.g., phase difference) therebetween. This difference may be used to determine an absolute position of the third mirror and therefore, electron beam column, in a first direction (e.g., X-direction). Execution of step 625 may further include a comparison between the fourth reference beam and the fourth reflected beam to determine the difference (e.g., phase difference) therebetween. This difference may be used to determine an absolute position of the electron beam column in a second direction (e.g., Y-direction).

When a relative position between the electron beam column and stage is determined, execution of step 625 may include comparing the absolute position of the stage in the first and/or second directions along with the absolute position of the electron beam in the first and/or second directions to determine a position of the stage relative to the electron beam column in the first and/or second directions.

Figure 7A:
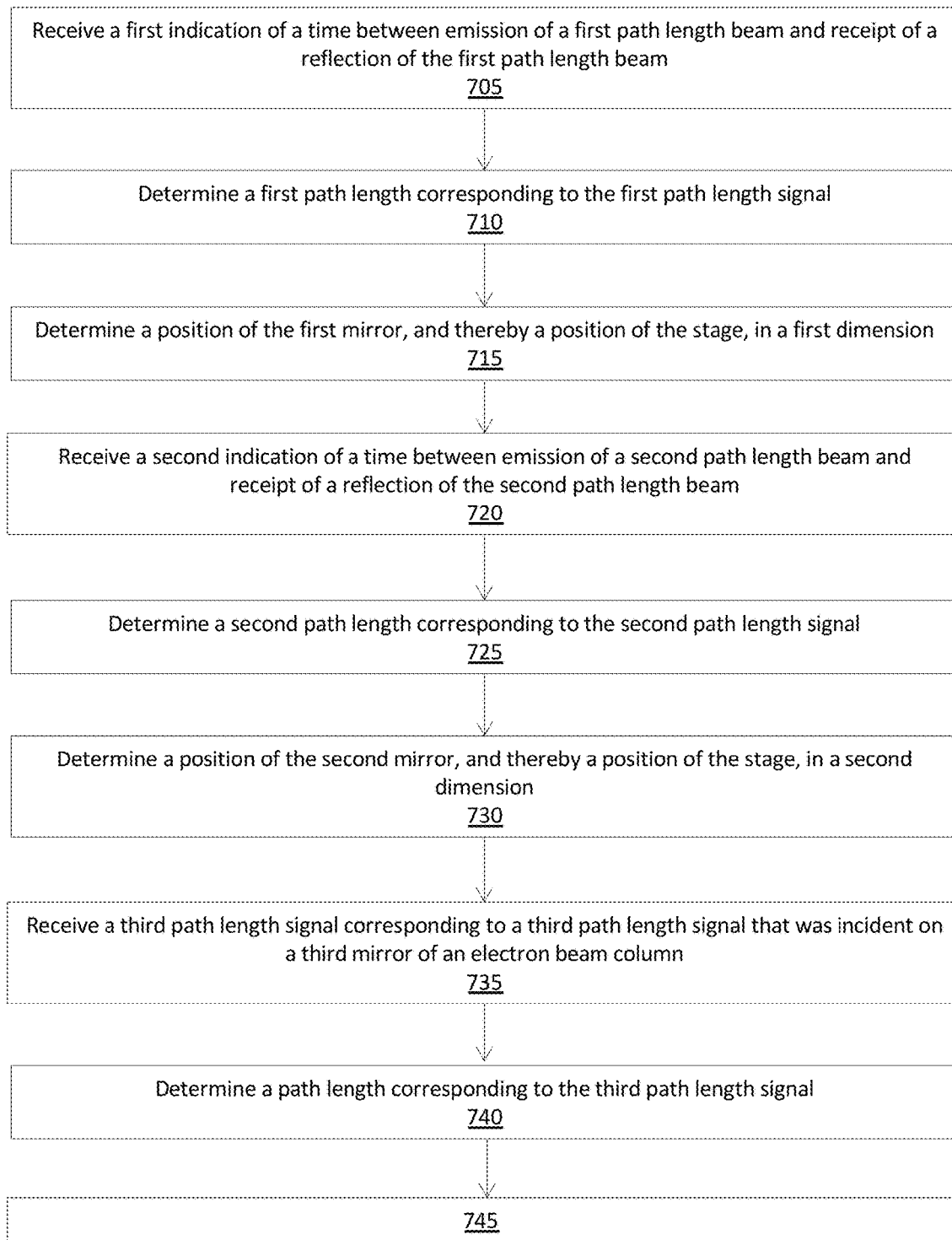
FIGS. 7A and 7B provide a flowchart illustrating an exemplary process for determining an absolute position of a stage, an absolute position of an electron beam column, and/or a relative position between a stage and an electron beam column, in accordance with some embodiments of the present invention.
Figure 7B:
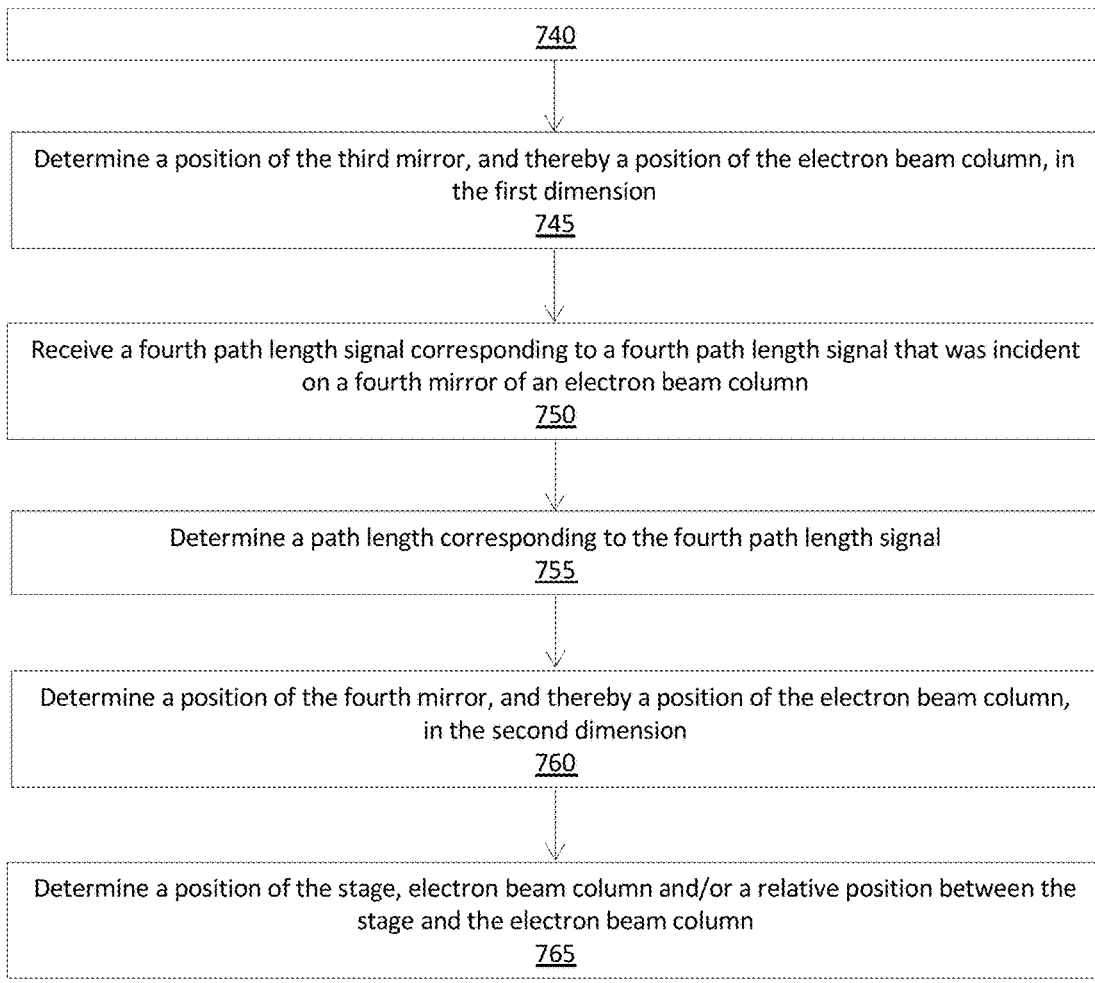

FIGS. 7A and 7B provide a flowchart illustrating an exemplary process 700 for determining an absolute position of a stage, such as stage 135, an absolute position of an electron beam column such as electron beam column 120, and/or a relative position between a stage and an electron beam column. Some motion of the stage may be active, or intentional, as may occur when the stage is moving a NCEM-enabled cell vehicle 130 as part of, for example, an inspection process. The motion may be continuous or variable and is typically in the X- and/or Y-direction(s). Motion of the stage and/or electron beam may also be passive (e.g., environmental and/or induced by operation of the stage, electron beam column, and/or other equipment). Such motion is typically vibrational and may be difficult to predict. Process 700 may be executed by any of the systems and/or system components disclosed herein such as system 200.

In step 705, a first indication of a time between emission of a first path length beam like first incident path length beam 210*i* and receipt of a reflection of the first path length beam 210*r* by, for example, a processor like server/computer/processor 110 and/or position assessment FPGA 109 from, for example, position assessment hardware like position assessment hardware 115 may be received. A path of the first path length beam signal may be incident first path length beam 210*i* is emitted from position assessment hardware, impinges on a first mirror resident on the stage like first stage mirror 150, reflects, as reflected first path length beam 210*r* from the first mirror back to position assessment hardware where it is detected by a detector therein.

In step 710, a path length corresponding to the first path length signal may be determined using the first indication of the length of time between emission of the first path length signal and receipt of a reflected first path length signal (also referred to herein as a first time duration) received in step 705. Step 710 may be executed by, for example, calculating a distance traveled by the light (i.e., pathlength) by inputting the first time duration and the speed of light into Equation 1, below.

$$d = s * t \quad \text{Equation 1}$$

Where:
s=speed of light (299,792,458 m/s)
d=distance, or path length; and
t=time.

This distance may then be used to determine a relative and/or absolutes position of the first mirror, and therefore the stage, in a first dimension (e.g., the X-direction) (step 715). In some embodiments, execution of step 715 may include determining a distance the stage is from the position assessment hardware.

In step 720, a second indication of a time between emission of a second path length beam like second path length beam 215 and receipt of a reflection of the second path length beam may be received by, for example, a processor like server/computer/processor 110 and/or position assessment FPGA 109 from, for example, position assessment hardware like position assessment hardware 115. A path of the second path length beam signal may be emission of incident second path length beam 215*i* from position assessment hardware, impingement on a second mirror resident on the stage like second stage mirror 170, and reflection of a reflected second path length beam 215*r* from the second mirror back to position assessment hardware where it is detected by a detector therein.

In step 725, a path length corresponding to the second path length signal may be determined using the second indication of the length of time between emission of the second reference path length signal and receipt of a reflected second reference path length signal received in step 720 by, for example, inputting the second time duration and the speed of light into Equation 1. This distance may then be used to determine a relative and/or absolute position of the second mirror, and therefore the stage, in a second dimension (e.g., the Y-direction) (step 730). In some embodiments, execution of step 730 may include determining a distance the stage is from the position assessment hardware.

Optionally, in step 735, a third indication of a time between emission of a third path length beam like third path length beam 220 and receipt of a reflection of the third path length beam may be received by, for example, a processor like server/computer/processor 110 and/or position assessment FPGA 109 from, for example, position assessment hardware like position assessment hardware 115. A path of the third path length beam 220 may be emission of an incident third path length signal 220*i* from position assessment hardware, impingement on a third mirror resident on an electron beam column like third mirror 180, and reflection of a reflected third path length beam 220*r* from the third mirror back to position assessment hardware where it is detected by a detector therein.

Optionally, in step 740, a path length corresponding to the third path length signal may be determined using the third indication of the length of time between emission of the third reference path length signal and receipt of a reflected third reference path length signal (also referred to herein as a third time duration) received in step 735 by, for example, inputting the third time duration and the speed of light into Equation 1. This distance may then be used to determine a relative and/or absolute position of the third mirror, and therefore the electron beam column, in a first dimension (e.g., the X-direction) (step 745). In some embodiments, execution of step 745 may include determining a distance the stage is from the position assessment hardware.

In step 750, a fourth indication of a time between emission of a fourth path length beam like fourth path length beam 230 and receipt of a reflection of the fourth path length beam may be received by, for example, a processor like server/computer/processor 110 and/or position assessment FPGA 109 from, for example, position assessment hardware like position assessment hardware 115. A path of the fourth path length beam like fourth path length beam 230 may be emission of an incident fourth path length beam 230i from position assessment hardware, impingement on a fourth mirror resident on an electron beam column like fourth mirror 181, and reflection of a reflected fourth path length beam 230r from the fourth mirror back to position assessment hardware where it is detected by a detector therein.

In step 755, a path length corresponding to the fourth path length signal may be determined using the fourth indication of the length of time between emission of the fourth reference path length signal and receipt of a reflected fourth reference path length signal received in step 750 by, for example, inputting the fourth time duration and the speed of light into Equation 1. This distance may then be used to determine a position of the fourth mirror, and therefore the electron beam column, in a second dimension (e.g., the Y-direction) (step 760). In some embodiments, execution of step 760 may include determining a distance between the electron beam column and the position assessment hardware and/or a relative distance between the electron beam column and the position assessment hardware. Optionally, in step 765, a relative position between the stage and the electron beam column may be determined using, for example, the positions determined in steps 715, 730, 745, and/or 760.

FIG. 8 provides a flowchart illustrating an exemplary process 800 for determining a position of a stage like stage 135 relative to an electron beam column like electron beam column 120 as a NCEM-enabled cell vehicle and/or portions thereof is tested using an electron beam emanating from the electron beam column. Some motion of the stage may be intentional as may occur when the stage is moving a NCEM-enabled cell vehicle 130 as part of, for example, an inspection process. The motion may be active and/or passive as explained herein. Process 800 may be executed by any of the systems and/or system components disclosed herein such as system 300.

In step 805, a first indication of a first time duration extending between emission of a first compound beam like first portion of first compound beam 310 and receipt of a reflection of the first compound beam by, for example, a processor like server/computer/processor 110 and/or position assessment FPGA 109 from, for example, position assessment hardware like position assessment hardware 115. An exemplary path of the first compound beam signal may be emission from position assessment hardware, impingement on a first mirror resident on the stage, such as first stage mirror 150, reflection to a first reflection mirror like first reflection mirror 340 toward a second reflection mirror like second reflection mirror 345, reflection from the second reflection mirror toward a third mirror positioned on an electron beam column like third mirror 180, and reflection from the third mirror back to position assessment hardware where it is detected by a detector therein. Another exemplary path of the first compound beam signal is the reverse of the path just described.

In step 810, a path length for the first compound signal may be determined using the first indication of the length of time between emission of the first compound signal and receipt of a reflected first compound signal received in step 805. Step 810 may be executed by, for example, calculating a distance traveled by the light (i.e., pathlength) by inputting the first time duration and the speed of light into Equation 1. This distance may then be used to determine a position of the first mirror, and therefore the stage, relative to the third mirror, and therefore the electron beam column, in a first dimension (e.g., the X-direction) (step 815).

In step 820, a second indication of a second time duration extending between emission of a second compound beam like second compound beam 320 and receipt of a reflection of the second compound beam by, for example, a processor like server/computer/processor 110 and/or position assessment FPGA 109 from, for example, position assessment hardware like position assessment hardware 115. An exemplary path of the second compound beam signal may be emission from position assessment hardware, impingement on a fourth mirror resident on the electron beam like fourth mirror 181, reflection to third reflection mirror 350, reflection toward fourth reflection mirror 355, reflection from the fourth reflection mirror 355 toward a second mirror positioned on a stage like second stage mirror 170, and reflection from the second mirror of the stage back to position assessment hardware where it is detected by a detector therein.

In step 825, a path length for the second compound signal may be determined using the second indication of the length of time between emission of the second compound signal and receipt of a reflected second compound signal received in step 820. Step 825 may be executed by, for example, calculating a distance traveled by the light (i.e., path length) by inputting the second time duration and the speed of light into Equation 1. This distance may then be used to determine a position of the second mirror, and therefore the stage, relative to the fourth mirror, and therefore the electron beam column, in a second dimension (e.g., the Y-direction) (step 830).

Figure 9B:
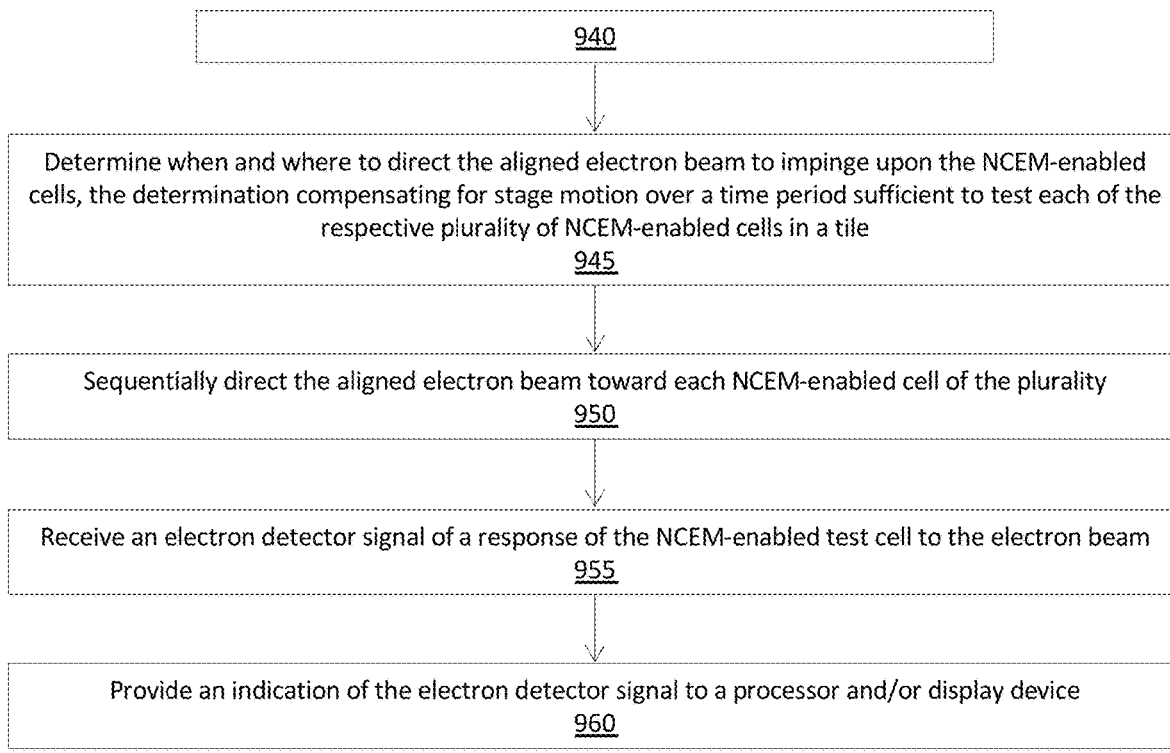

FIGS. 9A and 9B provide a flowchart illustrating an exemplary process 900 for registering a position of a tile, like tile 515, and, in some instances, an NCEM-enabled cell vehicle like NCEM-enabled cell vehicle 130 that includes the tile. Process 900 registers an actual position of the tile using a NCEM-enabled registration cell resident within the tile. Following registration of the tile, one or more tests on one or more NCEM-enabled cells included within the tile may be performed when a target within the tile is exposed to a non-contact electronic measurement via, for example, an electron beam or electron beam like electron beam 140. In some cases, the measurement may be made while the tile (via the NCEM-enabled cell vehicle it is associated with) moves on a stage, like stage 135. The motion of the stage may be continuous along a swath like swath 518 and then change briefly so that, for example, an adjacent swath of tiles may be exposed to the electron beam. For example, a stage may move so that all tiles in a columnar swath oriented in the Y-direction are exposed to the electron beam. Then, when the end of the swath is reached, the stage may move in the X- and/or Y-direction to align an adjacent swath oriented in the Y-direction to the electron beam after which the stage may move in the Y-direction so that the tiles in the adjacent swath may be exposed to the electron beam via the continuous motion of the stage in the Y-direction from one side of the NCEM-enabled cell vehicle to the other. Process 900 may be performed by, for example, system 100, 200, or 300 or any component or combination of components thereof.

In step 905, a recipe for a NCEM-enabled cell vehicle may be received by a processor like, for example, server/computer/processor 110 from, for example, a database like database 105. The recipe may include information regarding how the NCEM-enabled cell vehicle is divided into tiles like tile 515. For example, the recipe may include a position and/or a specification (e.g., composition, dimensions, electrical properties, etc.) of various features of the NCEM-enabled cell vehicle. These features include, but are not limited to, a position and/or contents of a each tile within the NCEM-enabled cell vehicle, a position and/or contents of a NCEM-enabled registration cell like NCEM-enabled registration cell 520 for one or more tiles, a position and/or contents of NCEM-enabled cells like NCEM-enabled cells 530, product standard cells, memory cells, and/or test cells within one or more tiles, and/or a position and/or contents of same. For example, the recipe may indicate a characteristic, position, and/or dimension of one or more tiles and a position of NCEM-enabled registration cell(s) and/or NCEM-enabled cell(s) in the X-, Y-, and/or Z-planes and/or a position of the one or more NCEM-enabled registration cell(s) and/or NCEM-enabled cells within a subject tile relative to other features of the NCEM-enabled cell vehicle. At times, the recipe may be and/or may include a vector map of contents of the respective NCEM-enabled cell vehicle and/or tile. In some embodiments, the recipe may be received responsively to a query or other request generated by a computing device like server/computer/processor 110. At times, this query or request may be generated responsively to receiving a request from a user and/or receiving information (e.g., part number, type, manufacturing lot, etc.) regarding the NCEM-enabled cell vehicle via, for example, communication interface 125.

Optionally, one or more parameters of a system and/or device executing process 900 and/or used to perform an NCEM measurement and/or provide information to a processor executing process 900 (e.g., electron beam column 120, stage 135, position assessment hardware 115, etc.) may be included in, and/or received with, the recipe received in step 905 and/or may be known to a processor executing process 900 and/or may be used to determine an expected position for a tile. Exemplary parameters include, but are not limited to, a rate of motion for a stage upon which the NCEM-enabled cell vehicle and/or tile is positioned, a degree of beam drift for the electron beam column, how the stage's rate of motion may change when approaching and/or leaving a target region, and/or how long it takes for a stage to change direction as may occur when beginning to scan a new swath and/or tile. In some embodiments, information regarding the electron beam column (e.g., beam drift) may also be received in step 905.

In step 910, an expected, or calculated, position of a tile, a NCEM-enabled registration cell, and/or features included therein (e.g., test cells, NCEM-enabled cells, NCEM-enabled cells, product standard cells, and/or wires) may be determined using the received recipe, system parameters, and/or vector data included in the recipe. The expected position of the tile, the NCEM-enabled registration cell, and/or features included therein may be an absolute expected position and/or a position relative to the electron beam column and/or stage.

Step 910 may be executed for all tiles of a NCEM-enabled cell vehicle. Often times, execution of step 910 includes determining an expected position of a NCEM-enabled registration cell. For embodiments where parameters of a system and/or device are received and/or known, information regarding, for example, a typical rate of motion for a stage supporting the tile that is to be exposed to an electron beam may be used to determine an expected position of a tile. Additionally, or alternatively, a known quantity of beam drift may be used to determine an expected position of a tile and/or NCEM-enabled registration cell that may be an absolute expected position and/or a position relative to the electron beam column and/or may be used to perform step 920 while the stage is moving.

Optionally, in step 915, position and/or motion information for a stage like stage 135, that the NCEM-enabled cell vehicle that includes the tile is positioned upon may be received. This information may be received over time (e.g., continuously, periodically, and/or as-needed) while the stage is moving during NCEM testing of the NCEM-enabled cell vehicle and/or a target therein. Position and/or motion information may include, but is not limited to, a position in the X-, Y-, and/or Z-direction(s), a position of the stage relative to the electron beam column, and/or a rate of motion in the X-, Y-, and/or Z-direction.

In some embodiments, the position and/or motion information of step 915 may include a position for an electron beam column like electron beam column 120 that directs an electron beam toward the tile in step 920. In these embodiments, position and/or motion information for the stage (and therefore the NCEM-enabled cell vehicle) may be relative to a position of the electron beam column instead of being an absolute position and/or absolute rate of motion for the stage. In some embodiments, position and/or movement information may include detected vibrations and/or a resonant frequency of the stage and/or electron beam column. Additionally, or alternatively, position and/or movement information may include a relative difference in position between the NCEM-enabled cell vehicle and the electron beam column and/or electron beam.

Movement of the stage, NCEM-enabled cell vehicle may be determined using any equipment and/or process capable of detecting minute (e.g., 10-0.1 nm) movements of the stage and/or NCEM-enabled cell vehicle The position information received in step 915 may be information provided by position assessment hardware, such as position assessment hardware 115, and/or may be a position and/or rate of motion determined by a computer like server/computer/processor 110 using information received from the position assessment hardware. In some cases, the information received in step 915 may be light (e.g., laser) and/or radio interferometry information. In some instances, the information received in step 915 may be continuously received over time to, for example, facilitate determination of a position of the NCEM-enabled registration cell as it is moving and/or scanning of the NCEM-enabled registration cell or other portions of NCEM-enabled cell vehicle. In these instances, the position and/or motion information may establish a feedback loop with a processor or controller (e.g., column FPGA 107) controlling the operation of an electron beam column (e.g., electron beam column 120) so that a deflection angle of an electron beam emanating from the electron beam column may be responsive to the position and/or motion information received in step 915 while the NCEM-enabled registration cell is scanned. In some cases, the position and/or motion information may be acquired by position assessment hardware like position assessment hardware 115 via a process shown and described above with regard to FIGS. 1A, 1B, and/or 4A-4C. In some embodiments, execution of step 915 is optional.

A particle beam, like electron beam 140, may then be directed toward a region of the tile corresponding to the expected position of the NCEM-enabled registration cell for a time period sufficient to test the NCEM-enabled registration cell and/or receive a response (e.g., detected electrons) of the NCEM-enabled registration cell to the electron beam as the NCEM-enabled registration cell (along with the rest of the NCEM-enabled cell vehicle) may move with the stage (step 920). In some embodiments, scanning the NCEM-enabled registration cell may involve changing, or adjusting, a feature the electron beam and/or an deflection angle of the electron beam over time as it hits the NCEM-enabled registration cell so that the electron beam stays focused on the NCEM-enabled registration cell for a time period sufficient to scan the NCEM-enabled registration cell while it is moving along with the stage. For example, a deflection angle for the electron beam scanning the NCEM-enabled registration cell may be continuously adjusted over a period of time sufficient to fully scan the NCEM-enabled registration cell as the tile including the NCEM-enabled registration cell moves along with the stage. An example of how the scanning and/or adjustment of the deflection angle of the electron beam may be performed while the stage is moving is shown in FIGS. 4A-4C and is described above with regard to the discussion of FIGS. 4A-4C.

In some embodiments, the stage may not be intentionally moving via, for example, activation and/or operation of hardware configured to move the stage. In these embodiments, the stage may be relatively stationary but may still be subject to vibrations or other small movements caused by, for example, environmental disturbances of the stage and/or electron beam column. In these embodiments, position information may still be received and used to adjust a deflection angle of the of the beam so that it is incident on the NCEM-enabled registration cell in a manner that facilitates the scanning of the NCEM-enabled registration cell.

In step 925, an indication of a response of the NCEM-enabled registration cell to the electron beam (e.g., detected electron signal like detected electron signal 145) may be received. In some embodiments, the indication may be a result of a voltage contrast measurement of detected electrons that were incident on the NCEM-enabled registration cell. In some cases, the indication received in step 925 may be a graph of detected electron intensity as a function of position (like graphs 501, 502, 503, and/or 504) of the region of the tile corresponding to a graph of detected electron intensity as a function of position corresponding to the expected position for the NCEM-enabled registration cell determined in step 1010.

The received indication may then be analyzed to determine an actual position of the NCEM-enabled registration cell and/or features within the NCEM-enabled registration cell (step 930). In some cases, execution of step 930 may include determining that the NCEM-enabled registration cell and by extension, the NCEM-enabled cell vehicle associated with the NCEM-enabled registration cell has shifted from the expected position determined in step 910 in the X-, Y-, and/or Z-directions. A difference between the expected and actual positions of the NCEM-enabled registration cell may then be determined and this change may be applied to other features of the tile to determine the actual position of the tile and/or NCEM-enabled cells included therein (step 935).

In some embodiments, a difference between the expected and actual positions of the NCEM-enabled registration cell may be used to determine a degree of beam drift (i.e., a change in the deflection angle of the electron beam over time that may be a function of, for example, an operation of the electron beam column and/or stage). In these embodiments, a determination of beam drift may include execution of process 900 a plurality (e.g. 50, 500, 5,000, etc.) of times so that a plurality of differences between the expected and actual positions of the NCEM-enabled registration cell may be determined and then used to calculate a degree of beam drift over time. In some embodiments, the beam drift may be a parameter of the system that is received in step 905. Additionally, or alternatively, a beam drift determination via execution of process 900 and/or portions thereof may incorporate and/or be used to update a known amount of beam drift for the system that, in some instances, may be stored in database 105 and/or added to a recipe.

In some cases, the indication received in step 925 may be a graphs showing detected electron intensity as a function of position along the X- and/or Y-axis for the region of the tile corresponding to the expected position for the NCEM-enabled registration cell determined in step 910. In these instances, execution of step 930 may include performing a comparative analysis between a graph of detected electron intensity as a function of position that shows the actual positions for features scanned in step 920 with a graph of detected electron intensity as a function of position for the expected position (as may be determined in step 910) of corresponding features of the NCEM-enabled registration cell to determine whether the expected position of the features of the NCEM-enabled registration cell aligns with the actual position of the features of the scanned area (i.e., the region of the tile corresponding to the expected NCEM-enabled registration cell). A result of this comparative analysis may indicate, for example, whether the expected position of the NCEM-enabled registration cell aligns with the raster-scanned area and/or whether the tile has shifted from and/or is not aligned with its expected position). Any difference between the expected and actual positions of the features of the NCEM-enabled registration cell may be extrapolated to the remainder of the tile and/or NCEM-enabled cell vehicle in which the NCEM-enabled registration cell/tile resides to determine, for example, an actual position of the tile and/or features within the tile such as NCEM-enabled cells (step 935). In some instances, there may be no difference between the expected and actual positions of the features within the NCEM-enabled registration cell. In these instances, the expected and actual positions of the NCEM-enabled registration cell are aligned and no further alignment and/or adjustment of a deflection angle for the electron beam may be needed to properly expose the tile and/or features (e.g., NCEM-enabled cells) included therein to the electron beam. This may enable the accurate targeting of the electron beam to interact with features within the tile outside of the NCEM-enabled registration cell for testing thereof as is explained herein. In other instances, there may be a difference between the expected and actual positions of the features within the NCEM-enabled registration cell. In these cases, the expected and actual positions of the NCEM-enabled registration cell are not aligned and, as such, an alignment and/or adjustment of a deflection angle for the electron beam may be performed so that the electron beam is properly aligned to be incident on the target regions of the tile (e.g., NCEM-enabled cells) (step 940). This adjustment of the deflection angle may compensate for changes in stage position and/or electron beam column position that, in some cases, were previously unknown and may enable the accurate targeting of the electron beam to interact with features within the tile outside of the NCEM-enabled registration cell for testing thereof as is explained herein.

In step 945, when and where to direct the aligned electron beam to impinge on the NCEM-enabled cells within the tile may be determined. This determination may compensate for, beam drift, stage motion, and/or other factors over a time period sufficient to expose each NCEM-enabled cell within a tile to the electron beam.

In step 950, the electron beam may then be separately and sequentially directed to a position corresponding to an actual position of individual NCEM-enabled cells resident in the tile for a time period sufficient to test the individual NCEM-enabled cells. The actual position of the respective individual NCEM-enabled cells may be determined using the determined actual position of the tile and/or NCEM-enabled cells in step 935, position information received in step 915, and/or the recipe received in step 905. In some embodiments, when the tile is positioned on a moving stage, execution of step 950 may include changing, or adjusting, a deflection angle of the electron beam over time as it hits each individual NCEM-enabled cell so that the electron beam stays focused on a target individual NCEM-enabled cell while it is moving along with the stage. For example, a deflection angle for the electron beam may be continuously adjusted over a period of time sufficient to test the individual NCEM-enabled cell as it moves along with the stage. An example of how the adjustment of the deflection angle of the electron beam may be performed while the stage is moving is described above with regard to FIGS. 4A-4C.

In some embodiments, only the NCEM-enabled cells (as opposed to the entire tile) are exposed to the electron beam. This may increase throughput because, for example, not all regions of a tile are exposed to the electron beam thereby saving, for example, time, processing power, and/or energy used to operate the equipment to scan the entire tile and interpret results of this scanning. In addition, selectively exposing only the NCEM-enabled cells to the electron beam may preserve the operability of the product standard cells of the tile because they are not damaged by exposure to the electron beam.

In step 955, an indication of a response of the NCEM-enabled cell to the electron beam 140 may be received. The indication may be, for example, a magnitude of detected electron intensity, an indication of voltage contrast and/or a count of detected electrons received as a function of position. In step 960, the indication may be provided to a processor and/or a display device for viewing by a user as, for example, a graph of voltage contrast and/or detected electron intensity.

In some embodiments, execution of step 910, 930, and/or 940 may include receiving position information for a stage and/or an electron beam column generating the electron beam that is directed toward the tile/NCEM-enabled registration cell. The position information may be received from position assessment hardware like position assessment hardware 120.

Figure 10A:
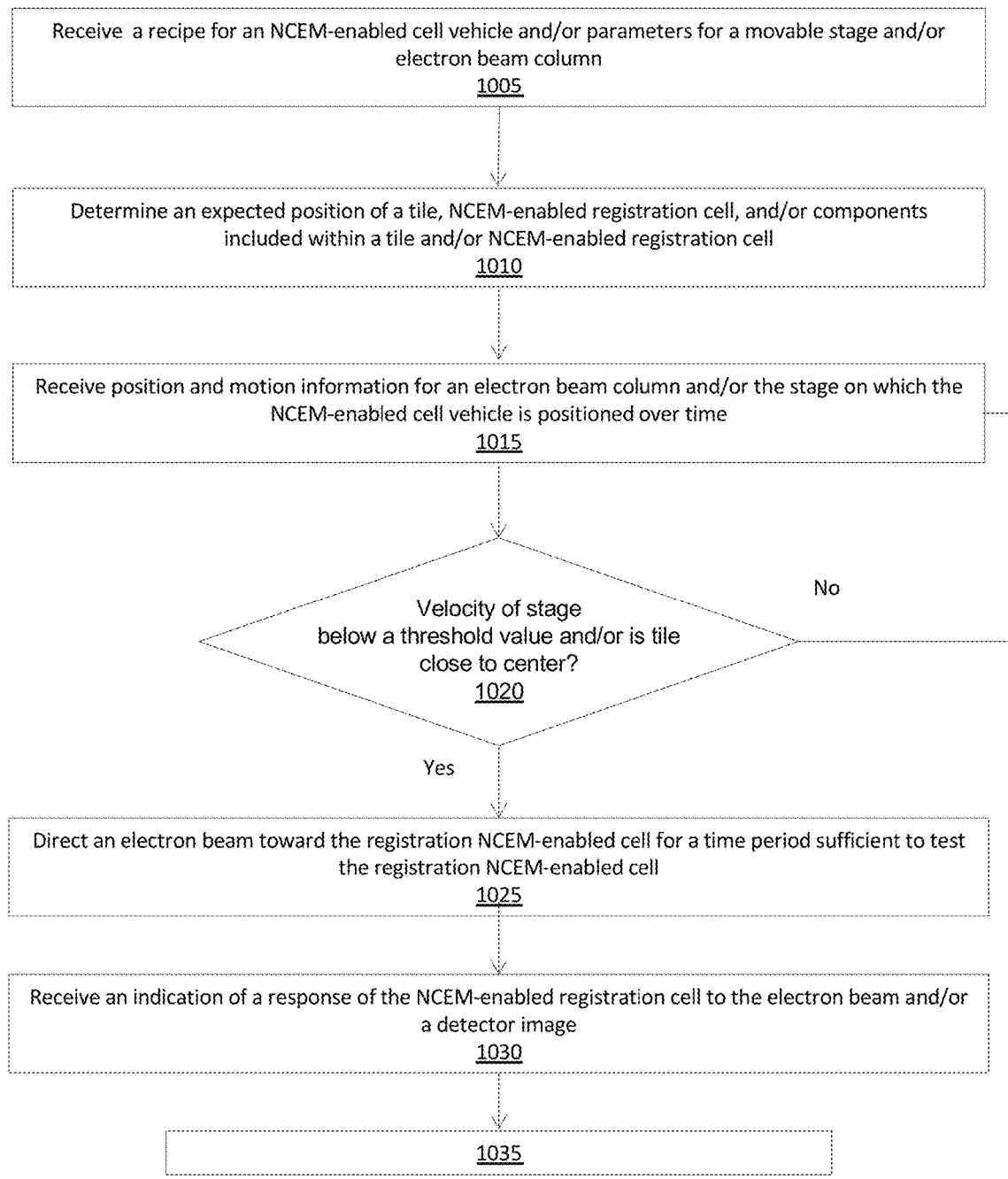
FIGS. 10A and 10B provide a flowchart illustrating an exemplary process for registering a position of a tile using a NCEM-enabled registration cell and performing a test on one or more NCEM-enabled fill included within the tile, in accordance with some embodiments of the present invention.
Figure 10B:
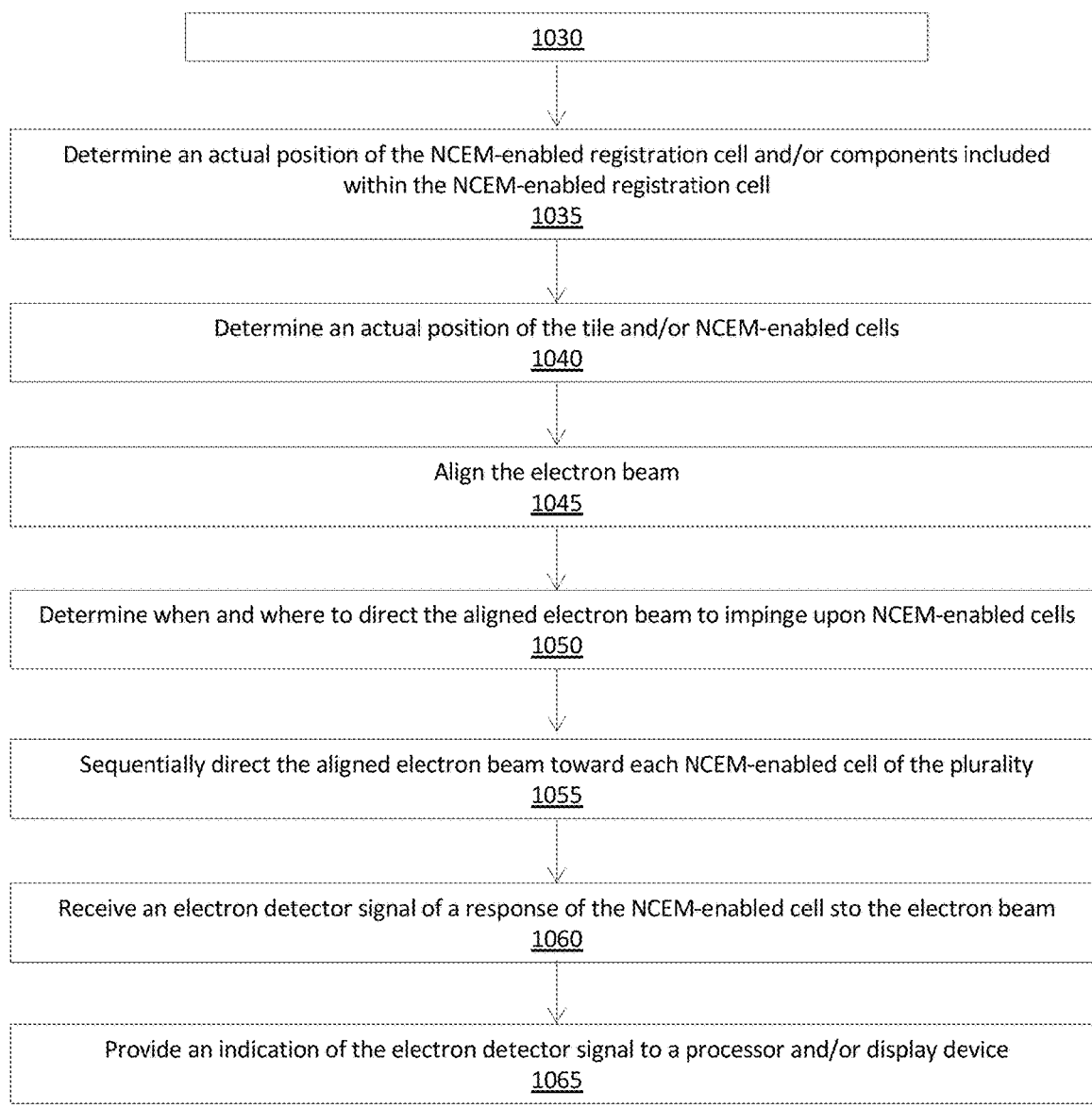

FIGS. 10A and 10B provide a flowchart illustrating an exemplary process 1000 for registering a position of a tile, like tile 515, and, in some instances an NCEM-enabled cell vehicle thereof that includes the tile. Process 1000 registers the position of the tile using a NCEM-enabled registration cell resident within the tile like NCEM-enabled registration cell 520. Following registration of the tile, one or more tests on one or more NCEM-enabled cells included within the tile that may, in some instances, be executed as the tile (via the NCEM-enabled cell vehicle it is associated with) moves on a stage, like stage 135, and is exposed to a non-contact electronic measurement via an electron beam like electron beam 140. Unlike with process 900, the motion of the stage may not be continuous along a swath like swath 518 so that each tile in a swath may be individually focused on. Stated differently, the stage may sequentially move the NCEM-enabled cell vehicle so that each tile may be individually scanned with an electron beam like electron beam 140. In this way, once all target regions, or test sites, (e.g., NCEM-enabled cells like NCEM-enabled cells 530) within a particular tile are exposed to the electron beam, the stage may move NCEM-enabled cell vehicle so that the next tile within a swath may be exposed the electron beam for testing. Process 1000 may be performed by, for example, system 100, 200, or 300, or any component or combination of components thereof.

In step 1005, a recipe for a NCEM-enabled cell vehicle may be received by a processor like, for example, server/computer/processor 110. The recipe received in step 1005 may be similar to the recipe received in step 905 and may include information regarding how the NCEM-enabled cell vehicle thereof is divided into tiles like tile 515, a position of an exact center point of each tile like exact center point 524, and/or a position of a settling window of each tile like settling window 522. In some embodiments, information regarding the electron beam column (e.g., beam drift) may also be received in step 1005.

Optionally, one or more parameters of a system and/or device executing process 1000 and/or used to perform an NCEM measurement and/or provide information to a processor executing process 1000 (e.g., electron beam column 120, stage 135, position assessment hardware 115, etc.) may be included in the recipe received in step 1005 and/or may be known to a processor executing process 1000 and/or may be used to determine a size of a tile, a size of a swath, an expected position of an exact center of a tile, an expected position of a settling window of a tile, and/or an expected position for a tile. Exemplary parameters include, but are not limited to, a rate of motion for a stage upon which the NCEM-enabled cell vehicle and/or tile is positioned, a size of an area the electron beam can scan (this area may be used to set tile size and/or dimensions), a degree of beam drift for the electron beam column, how the stage's rate of motion may change when approaching a target region, and/or how long it takes for a stage to change direction such as when scan a first column is scanned in the Y-direction and moving in the X-direction to prepare to scan a second column in the Y-direction.

In step 1010, an expected, or calculated, position of a tile, a NCEM-enabled registration cell, and/or features included therein (e.g., NCEM-enabled cells, NCEM-enabled cells, test cells, product standard cells, and/or wires) may be determined using the received recipe, vector data included in the recipe, and/or system parameters. The expected position of the tile, the NCEM-enabled registration cell, and/or features included therein may be an absolute expected position and/or a position relative to an electron beam column. In some embodiments, determining the expected position of a tile, a NCEM-enabled registration cell, and/or features included therein may include determining a position of the exact center and/or settling window of the tile using the recipe and/or parameters relative to, for example, a field of view for the electron beam column. Additionally, or alternatively, determining the expected position of a tile, a NCEM-enabled registration cell, and/or features included therein may include determining a rate of speed for the stage and when the stage may position a tile so that the exact center and/or settling window of the tile is positioned within a field of view for the electron beam column.

Step 1010 may be executed for some or all tiles of a NCEM-enabled cell vehicle. Often times, execution of step 1010 includes determining an expected position of a NCEM-enabled registration cell. For embodiments where parameters of a system and/or device are received and/or known, information regarding, for example, a typical rate of motion for a stage supporting the tile that is to be exposed to an electron beam may be used to determine an expected position of a tile. Additionally, or alternatively, a known quantity of beam drift and/or stage velocity may be used to determine an expected position of the tile and/or NCEM-enabled registration cell that may be an absolute expected position and/or a position relative to an electron beam column and/or may be used to perform step 1020 while the stage is moving.

In step 1015, position and/or motion information for a stage like stage 135, that the NCEM-enabled cell vehicle that includes the tile is positioned upon may be received. This information may be received over time while the stage is moving during NCEM testing of the NCEM-enabled cell vehicle. Position and/or motion information may include, but is not limited to, a position in the X-, Y-, and/or Z-direction and/or a rate of motion in the X-, Y-, and/or Z-direction. In some embodiments, the position information for the stage (e.g., absolute position of the stage and/or position of the stage relative to the electron beam column) may be received over time so that an absolute and/or relative velocity of the stage may be determined over time. The received position information may be a result of execution of process 600, 700, and/or 800 as discussed above with regard to FIGS. 6, 7, and 8 respectively.

In some embodiments, the position and/or motion information of step 1015 may include a position for an electron beam column like electron beam column 120 that directs an electron beam toward the tile in step 1025. In these embodiments, position and/or motion information for the stage (and therefore the NCEM-enabled cell vehicle) may be relative to a position of the electron beam column instead of being an absolute position and/or absolute rate of motion for the stage. In some embodiments, position and/or movement information may include detected vibrations and/or a resonant frequency of the stage and/or electron beam column. Additionally, or alternatively, position and/or movement information may include a relative difference in position between the NCEM-enabled cell vehicle and the electron beam column and/or electron beam.

In step 820, it may be determined whether a velocity of the stage is below a certain threshold (as may be the case when the stage slows down as the settling window approaches a center of the field of view for the electron beam column) and/or if a position of the tile is such that the settling window or exact center is in the correct position to begin scanning a NCEM-enabled registration cell of the tile (i.e., at, or near, a center of a field of view of the electron beam column). In many embodiments, the stage may move quickly between tiles until the exact center of the tile is within a certain range of the center of the field of view of the electron beam column after which the stage may slow down so that the exact center of the tile may be precisely positioned to align with the center of the field of view of the electron beam column. When the velocity of the stage decreases, this may be an indication that the exact center like 524 of the tile is within a settling window like settling window 522 of the field of view of the electron beam column. When the velocity of the stage is not below a certain threshold and/or if a position of the tile is such that the settling window or exact center is not in the correct position (e.g., sufficiently close to the center of the field of view for the electron beam column) to begin scanning a NCEM-enabled registration cell of the tile, step 1015 may be repeated.

When the velocity of the stage is below a certain threshold and/or if a position of the tile is such that the settling window or exact center of the tile is in the correct position (e.g., sufficiently close to a center of a point of view of the electron beam column), an instruction to scan a region of the tile corresponding to the expected position of the NCEM-enabled registration cell with an electron beam like electron beam 140 for a time period sufficient to scan the region and/or receive a response (e.g., detected electrons) of the region to the electron beam may be provided to the electron beam column (step 1025).

In some embodiments, scanning the region of the tile corresponding to the expected position of the NCEM-enabled registration cell may involve changing, or adjusting, a feature the electron beam and/or an deflection angle of the electron beam over time so that the electron beam stays focused on the region of the tile corresponding to the expected position of the NCEM-enabled registration cell while it is slowing down to bring a center of the tile into the electron beam column's point of view and/or increasing in speed as the tile goes from a complete stop (or nearly complete stop) to begin moving to the next tile to be exposed to the electron beam (e.g., the next tile in a swath). For example, a deflection angle for the electron beam scanning the NCEM-enabled registration cell may be continuously adjusted over a period of time sufficient to fully scan the NCEM-enabled registration cell as the tile including the NCEM-enabled registration cell moves along with the stage and/or is subject to vibration. This continuous adjustment may be made using the position information received in step 1015. An example of how the scanning and/or adjustment of the deflection angle of the electron beam may be performed while the stage is moving is shown in FIGS. 4A-4C and is described above with regard to the discussion of FIGS. 4A-4C. When the stage is not intentionally, or actively, moving, the scan may be performed in a typical manner by scanning along the NCEM-enabled registration cell in the X- and/or Y-directions until the entirety of the NCEM-enabled registration cell has been scanned. However, even when the stage is not actively moving, the stage and/or the electron beam column may still be subject to vibrations or other movement that may be accounted for and/or incorporated into an instruction to scan the region of the tile corresponding to the expected position of the NCEM-enabled registration cell using continuously received position information.

In some instances, the stage may not be intentionally moving via, for example, activation and/or operation of hardware configured to move the stage. In these embodiments, the stage may be relatively stationary but may still be subject to vibrations or other small movements caused by, for example, environmental disturbances of the stage and/or electron beam column. In these instances, position information may still be received and used to adjust a deflection angle of the of the beam so that it is incident on the NCEM-enabled registration cell in a manner that facilitates the scanning of the NCEM-enabled registration cell that compensates for passive movement of the stage and/or electron beam column.

In step 1030, an indication of a response of the NCEM-enabled registration cell to the electron beam (e.g., a detected electron signal like detected electron signal 145) may be received. In some embodiments, the indication may be a voltage contrast measurement of detected electrons that were incident on the NCEM-enabled registration cell. In some embodiments, the indication received in step 1030 may be similar to the indication received in step 925.

The received indication may then be analyzed to determine an actual position of the NCEM-enabled registration cell and/or features within the NCEM-enabled registration cell (step 1035). In some cases, execution of step 1035 may include determining that the NCEM-enabled registration cell and by extension, the tile and/or NCEM-enabled cell vehicle associated with the NCEM-enabled registration cell has shifted from the expected position determined in step 1010 in the X-, Y-, and/or Z-directions. A difference between the expected and actual positions of the NCEM-enabled registration cell may then be determined and this difference may be applied to other features of the tile to determine the actual position of the tile and/or NCEM-enabled cells included therein (step 1040). In some cases, execution of steps 1035 and/or 1040 may be similar to execution of steps 930 and/or 935, respectively.

In some embodiments, a difference between the expected and actual positions of the NCEM-enabled registration cell may be used to determine a degree of beam drift (i.e., a change in the deflection angle of the electron beam over time that may be a function of, for example, an operation of the electron beam column and/or stage). In these embodiments, a determination of beam drift may include execution of process 1000 a plurality (e.g. 50, 500, 5,000, etc.) of times so that a plurality of differences between the expected and actual positions of the NCEM-enabled registration cell may be determined and then used to calculate a degree of beam drift over time. In some embodiments, the beam drift may be a parameter of the system that is received in step 1005. Additionally, or alternatively, a beam drift determination via execution of process 1000 and/or portions thereof may incorporate and/or be used to update a known amount of beam drift for the system.

In some cases, the indication received in step 1030 may be a graph of detected electron intensity as a function of position (like graphs 501, 502, 503, and/or 504) of the region of the tile corresponding to a graph of detected electron intensity as a function of position for the expected position for the NCEM-enabled registration cell determined in step 1010. In these instances, execution of step 1035 may include performing a comparative analysis between the graph of detected electron intensity as a function of position received in step 1030 with a graph of detected electron intensity as a function of position corresponding to the expected position (as may be determined in step 1010) of features of the NCEM-enabled registration cell. A result of this comparison may be used to determine whether the expected position of the features of the NCEM-enabled registration cell aligns with the actual position of the features of the scanned area (i.e., whether the NCEM-enabled registration cell aligns with and/or has shifted from its expected position). Any difference between the expected and actual positions of the features of the NCEM-enabled registration cell may be extrapolated to the remainder of the tile and/or NCEM-enabled cell vehicle in which the NCEM-enabled registration cell/tile resides to determine, for example, an actual position of the tile and/or features within the tile such as NCEM-enabled cells (step 1040). In some instances, there may be no difference between the expected position of the features within the NCEM-enabled registration cell and the actual position of the features within the NCEM-enabled registration cell. In these instances, the expected and actual positions of the NCEM-enabled registration cell are aligned and no further alignment and/or adjustment of a deflection angle for the electron beam may be needed to properly expose the tile and/or features (e.g., NCEM-enabled cells) included therein to the electron beam. This may enable the accurate targeting of the electron beam to interact with features within the tile outside of the NCEM-enabled registration cell for testing thereof as is explained further with regard to step 1055, below. In other instances, there may be a difference between the expected position of the features within the NCEM-enabled registration cell and the actual position of the features within the NCEM-enabled registration cell. In these cases, the expected and actual positions of the NCEM-enabled registration cell are not aligned and, as such, an alignment and/or adjustment of a deflection angle for the electron beam may be performed so that the electron beam is incident on the target regions of the tile (e.g., NCEM-enabled cells) (step 1045). This adjustment of the deflection angle may compensate for changes in stage position and/or electron beam column position that may have been previously unknown and may enable the accurate targeting of the electron beam to interact with features within the tile outside of the NCEM-enabled registration cell for testing thereof as is explained further with regard to step 1055, below.

In step 1050, when and where to direct the aligned electron beam to impinge on the NCEM-enabled cells within the tile may be determined. This determination may compensate for the stage motion over a time period sufficient to expose each NCEM-enabled test cell within a tile to the electron beam.

In step 1055, the electron beam may then be separately and sequentially directed to a position corresponding to an actual position of individual NCEM-enabled cells resident in the tile for a time period sufficient to test the individual NCEM-enabled cells. The actual position of the respective individual NCEM-enabled cells may be determined using the determined actual position of the tile and/or NCEM-enabled cells in step 1035 and/or the recipe received in step 1005. In some embodiments, when the tile is positioned on a moving stage, execution of step 1050 may include changing, or adjusting, a deflection angle of the electron beam over time as it hits each individual NCEM-enabled cell so that the electron beam stays focused on a target individual NCEM-enabled cell while it is moving along with the stage. For example, a deflection angle for the electron beam may be continuously adjusted over a period of time sufficient to test the individual NCEM-enabled cell as it moves along with the stage. An example of how the adjustment of the deflection angle of the electron beam may be performed while the stage is moving is described above with regard to FIGS. 4A-4C.

In some embodiments, only the NCEM-enabled cells are exposed to the electron beam. This may increase throughput because, for example, not all regions of a tile are exposed to the electron beam thereby saving, for example, time, processing power, and/or energy used to operate the equipment. In addition, selectively exposing only the NCEM-enabled cells to the electron beam may preserve the operability of the product standard cells of the tile because they are not damaged by exposure to the electron beam.

In step 1060, an indication of a response of the NCEM-enabled cell to the electron beam may be received. The indication may be, for example, a magnitude of detected electron intensity, an indication of voltage contrast and/or a count of detected electrons received as a function of position. In step 1065, the indication may be provided to a processor and/or a display device for viewing by a user as, for example, a graph of voltage contrast, pixel energy level, and/or detected electron intensity.

In some embodiments, execution of step 1010, 1030, and/or 1040 may include receiving position information for a stage and/or an electron beam column generating the electron beam that is directed toward the tile/NCEM-enabled registration cell. The position information may be received from position assessment hardware like position assessment hardware 120.

FIG. 11A provides a block diagram of an exemplary wafer 1100 that may be an NCEM-enabled cell vehicle that includes a plurality of dies 1105 (not all of which are labeled) arranged in a grid that has coordinates along the Y-axis labeled with letters from A-R that represent 18 sequential (from top to bottom) rows of dies present on wafer 1100 and coordinates along the Y-axis labeled with numbers from 1-18 that represent 18 sequential (from left to right) columns of dies 1105 present on wafer 1100. Each die 1105 of wafer 1100 may be identified by its row and column coordinates. For example, dies A9 and A10 are the only dies in the first row (row A) and die B6 is the first die in the second row (row B) of wafer 1100. In some embodiments, each die 1105 on wafer 1100 is identical. Alternatively, there may be two or more different groups, or arrays, of dies 1105 wherein dies 1105 within the group/array are identical to one another (within the group/array) but the dies of the different groups/arrays on the same wafer may not be identical to one another. Stated differently, a wafer 1100 may include, for example, two arrays of dies 1105 and dies 1105 of the first group may be different from the dies 1105 of the second group.

FIG. 11B provides an exemplary array 1101 of dies 1105 that are present on wafer 1100. The dies 1105 of array 1101 correspond to dies H7, H8, H9, H10, I7, I8, I9, and I10 of wafer 1100. Each die 1105 of array 1101 should identical to each other. However, in order to test if this is true, a target region 1110 is selected for each die 1105 for testing to determine if the target regions 1110 for each die 1105 respond to the test in the same way. Each target region 1110 corresponds to the same features within each die 1105 and will be in the same position for each die 1105 so that test results from each target region 1110 (and therefore die 1105) may be compared with one another. In some embodiments, target region 1110 may be an NECM-enabled cell, an NCEM-enabled cell, a product standard cell, and/or a DUT as discussed herein. Additionally, or alternatively, a target region 1110 may be a plurality (e.g., 3, 4, 5, etc.) of regions, points, and/or or cells of a die 1105 that are the same (i.e., repeated) for each die 1105. The target region 1110 for each die 1105 may then be tested via, for example, exposure to an electron beam like electron beam 140 to determine a reaction (e.g., emitted electrons) of each target region 1110 to the particle beam. These reactions may then be compared with one another to determine if there are one or more outlying reactions that may indicate a defect in a target region 1110 and/or die 1105.

The arrangement of array 1101 shown in FIG. 11B is only one example of how an array of dies may be arranged and/or situated for testing. In some cases, an array of dies 1105 may include every other die 1105 in a row and/or column to form a checkerboard-like array 1101 or pattern. Alternatively, an array 1101 may be every other row or column of dies 1105 or along a diagonal line. Alternatively, an array 1101 may be any shape (e.g., square, triangle, circle) or size wafer 1100 can accommodate.

Although array 1101 of FIG. 11B refers to dies 1105 smaller, an array may comprise smaller, repeatable portions of a die (e.g., a chip or a cell) that may be tested in a manner similar to the testing of die 1105. Additionally, or alternatively, although only one target region 1110 is shown for each die 1105, this need not always be the case because a die 1105 may have a plurality (e.g., 3, 5, 9, 20, 40, etc.) of target regions 1110.

Figure 12:
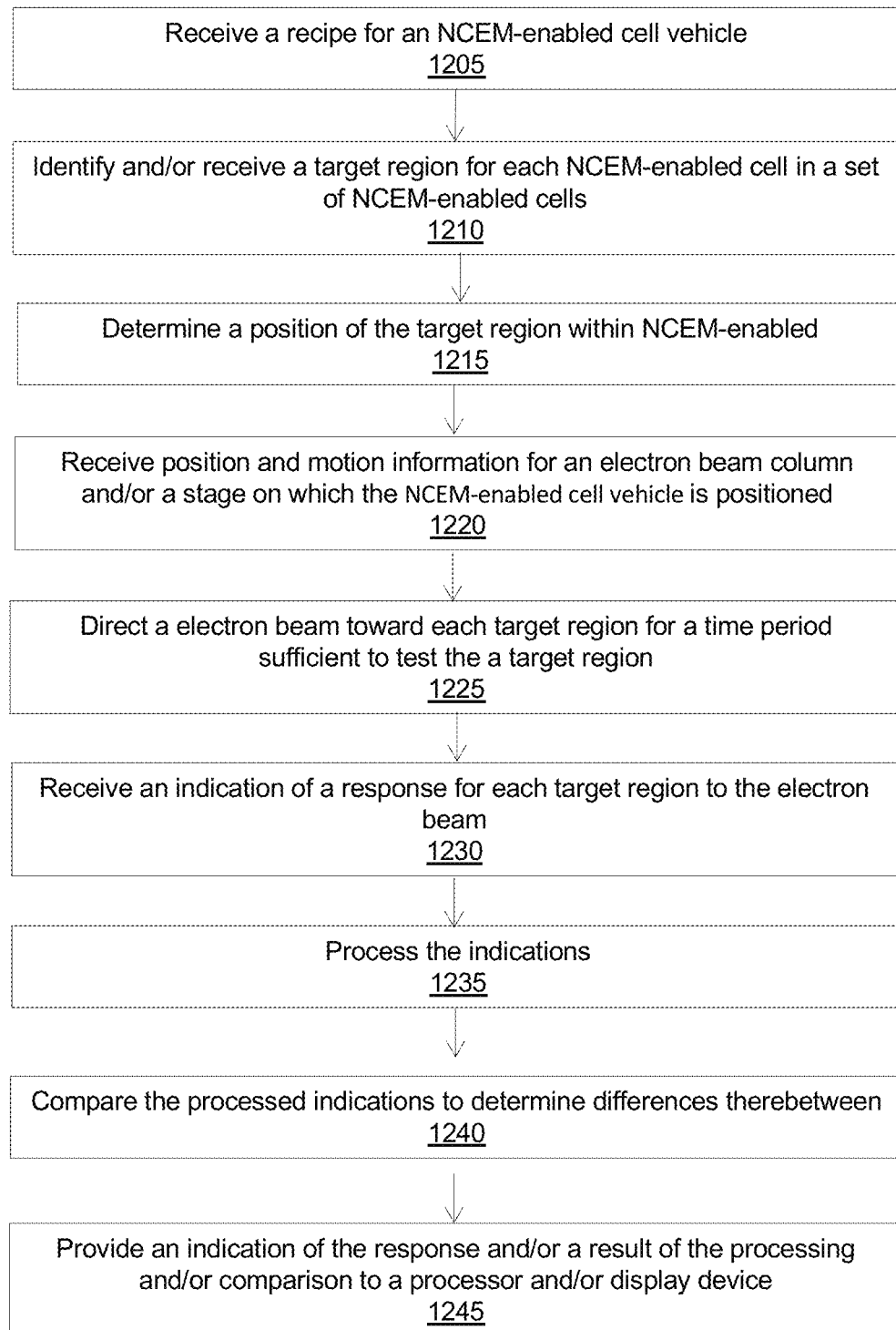
FIG. 12 provides a flowchart illustrating a process for performing a comparative analysis of different NCEM-enabled cell vehicles for the purpose of error detection, in accordance with some embodiments of the present invention.

FIG. 12 provides a flowchart illustrating a process 1200 for performing a comparative analysis of different NCEM-enabled cell vehicles or portions (e.g., tiles) thereof. In some embodiments, process 1200 may be executed for the purpose of error detection. Process 1200 may be performed by, for example, system 100, 200, 300, or any component, or combination of components, thereof.

In step 1205, a recipe for a NCEM-enabled cell vehicle may be received by, for example, a computer or processor like server/computer/processor 110. In some embodiments, the recipe may be for a wafer like wafer 1100. The recipe may include, for example, descriptions and/or positions of features (e.g., product standard cells, NCEM-enabled cells, and/or DUTs) included in the wafer, die, and/or chip. In some embodiments, execution of step 1205 may be similar to execution of step 905.

In step 1210, a plurality of target regions of interest on the NCEM-enabled cell vehicle like target region 1110 of a set of two or more NCEM-enabled cell vehicles thereof present on a wafer may be identified and/or received. Exemplary target positions may correspond to, for example, a DUT, a product standard cell like product standard cells 340, and/or NCEM-enabled cells like NCEM-enabled cells 530. Often times, a type, recipe, and/or layout of components within a target region for each portion of a NCEM-enabled cell vehicle is the same so that the target regions of different portions of the NCEM-enabled cell vehicle may be compared with one another. In some cases, the identification and/or determination of a target region may be performed using the recipe received in step 1205.

In step 1215, a position (e.g., X and Y coordinates) for each target region of step 1310 may be determined using, for example, the recipe. In some embodiments, the determination of a position for each target region of step 1215 may incorporate execution of a portion of process 900 so that an actual position of the NCEM-enabled cell vehicle and/or target region may be determined. This may assist with achieving proper alignment between a target region and an electron beam during execution of step 1225, discussed below.

Optionally, in step 1220, position and/or motion information for a stage, like stage 135, on which that the NCEM-enabled cell vehicle that set of two or more NCEM-enabled cell vehicles is positioned upon may be received. In some embodiments, execution of step 1220 may resemble execution of step 915, described above.

In step 1225, an electron beam, like electron beam 140, may be directed toward each target region for a time period sufficient to test the target region using, for example, a voltage contrast measurement. Often times, step 1225 may be executed so that target regions of different target regions of the NCEM-enabled cell vehicle are sequentially exposed to the target beam. In some embodiments, execution of step 1225 may bear similarities to the execution of step 920. An indication of a response of each target region to the electron beam may then be received (step 1230). Exemplary responses include, but are not limited to, a voltage contrast measurement, a detected electron count, and/or a grey level. In some instances, the indications received in step 1230 may be referred to as a plurality of indications.

In step 1235, the indications from the target regions of different NCEM-enabled cell vehicles may be processed so that they may be compared with one another to determine differences therebetween (step 1240). Exemplary differences include, but are not limited to, outlying amplitude and/or frequency fluctuations, a high level of noise, and an outlying Y-intercept value. In step 1245, an indication of the response and/or a result of the processing and/or comparison may be provided to a processor like server/computer/processor 110 and/or a display device as, for example, one or more numerical values, one or more graphs, and/or one or more graphics.

In some cases, the processing of step 1235 may include calculating a mean and/or a median value for each of the plurality of indications. In some embodiments, these values may be provided to a processor and/or display device as, for example, numerical values in a table and/or displayed on a graph so that the processor and/or user may perform the comparison and potentially find one or more outlying values. These outlier values may indicate that a target region corresponding to an outlying value for a mean and/or median is defective and/or is otherwise different from a processed value for a majority of target regions.

Additionally, or alternatively, the processing of step 1235 may include comparing a phase of a signal for the plurality of indications to determine if one or more indications is out of phase, or phase shifted, when compared with the indications for the phases for the signals corresponding to the remaining target regions. Additionally, or alternatively, the processing of step 1235 may include comparing an amplitude for the indications to determine if an amplitude of one or more indications is higher or lower than the majority of amplitudes for the plurality of indications.

Additionally, or alternatively, the processing of step 1235 may include comparing a frequency of a signal of the indications to determine if one or more indications have a frequency that is different from (e.g., faster or slower) than the majority of frequencies.

Additionally, or alternatively, the processing of step 1235 may include application of statistical techniques (e.g., linear regression, curve fitting, etc.) and/or mathematical modeling to the indications to determine if there are any outlying indications including, but not limited to, outlying amplitude and/or frequency fluctuations, a high level of noise, and/or an outlying Y-intercept value, etc.

Figure 13:
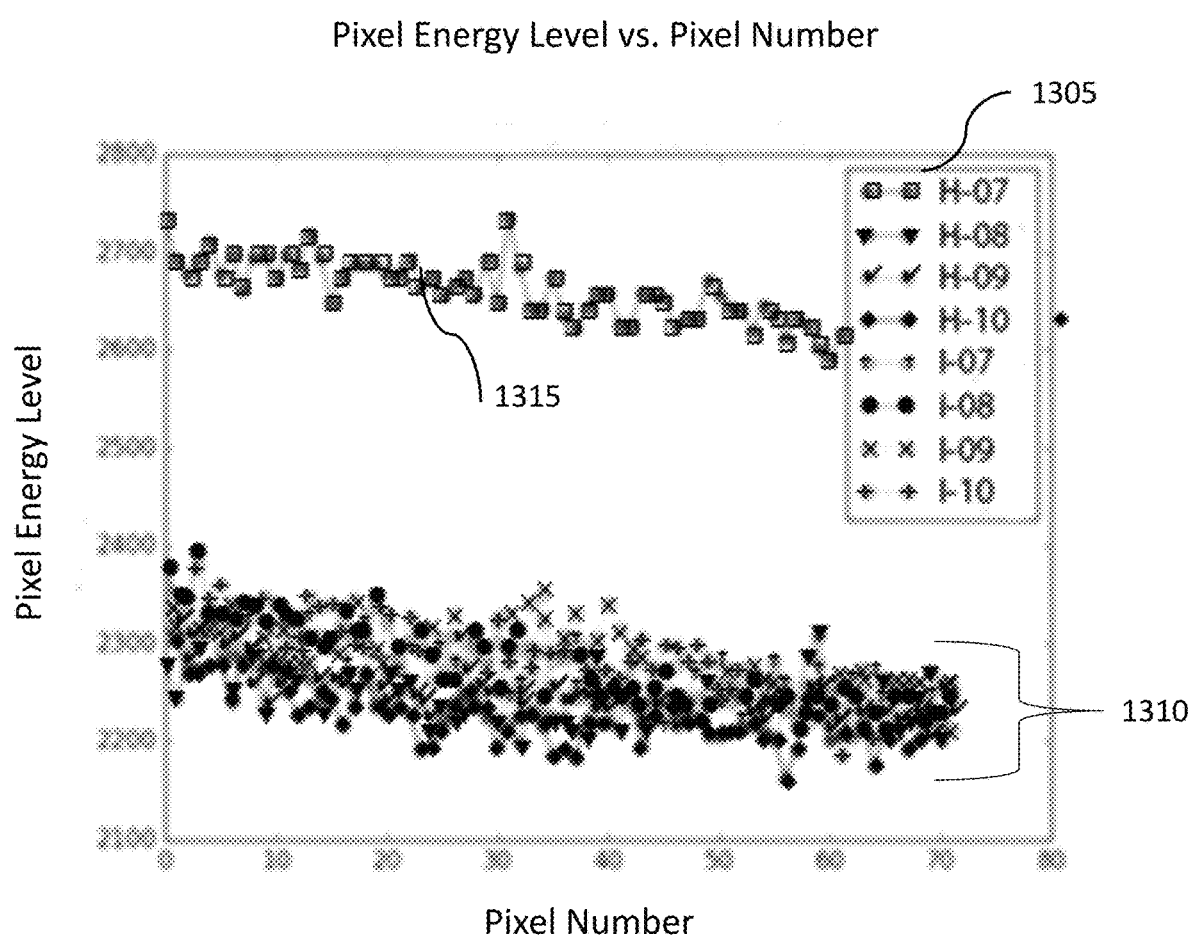
FIG. 13 provides an exemplary graph of pixel grey count for a plurality of target regions as a function of pixel number, in accordance with some embodiments of the present invention.

In some cases, the processing of step 1235 may include the generation of a scatter plot that graphs a value of the indication (e.g., a grey level or detected electron count) for each target region as a function of pixel number, time, and/or position. FIG. 13 provides an exemplary graph 1300 of pixel grey count for a plurality of target regions as a function of pixel number that shows a scatter plot of an indication for each of the plurality of target regions. In this example, the indications shown on graph 1300 correspond to array 1101 of target regions 1101 H7, H8, H9, H10 and I7, I8, I9, and I10 as explained and shown above with regard to FIG. 11B. The pixel number of the X-axis of graph 1300 corresponds to particular position, or pixel, within the target and pixel count increases from 0-70 as the electron beam is directed to different pixels (often sequentially arranged pixels) of the target region. In some instances, each pixel count may correspond to a length of time (e.g., 5-0.05 microseconds) that the electron beam is incident on each pixel, or sequentially placed location, of the target. In these instances, a duration of time the electron beam is incident on each pixel of the target is typically uniform (i.e., the same duration).

As may be seen in graph 1300, the scatter plots representing indications for target regions dies H8, H9, H10 and I7, I8, I9, and I10 are grouped together and, in some cases, nearly overlap into a group of scatter plots 1310. Group of scatter plots 1310 has a pixel grey level in the range of approximately 2200-2400 as a function of pixel count. However, there is one outlier scatter plot 1315 (shown in graph 1300 as a brown scatter plot) that corresponds to die H7 whose grey level is considerably higher (between approximately 2750 and 2600) as a function of pixel count than the scatter plots included in group of scatter plots 1310. Thus, scatter plot 1315 is an outlier when compared with the scatter plots of the other dies/target regions and is possible that the outlying nature depicted by scatter plot 1315 represents a defective target region within die H7. This may indicate that die H7 may be defective. In some cases, a target region associated with scatter plot 1315 (i.e., die H7) may be flagged for further follow up and/or analysis. Additionally, or alternatively, die H7 may be flagged as damaged, defective, or otherwise as an outlier.

We claim:

1. A computer-readable medium storing a set of instructions thereon, which when executed by a processor cause the processor to:
   receive a recipe for a die included in a wafer, the die including a plurality of chips, each chip of the plurality of chips being divided into a plurality of tiles, each tile including a non-contact electronic measurement (NCEM)-enabled NCEM-enabled registration cell and a plurality of NCEM-enabled fill cells, the recipe including a position for the die within the wafer, a position of the NCEM-enabled registration cell, and a position of each NCEM-enabled cell of the plurality NCEM-enabled cells;
   determine an expected position of a NCEM-enabled registration cell included a tile of the plurality of tiles;
   direct an electron beam toward the NCEM-enabled registration cell;
   receive an indication of a response of the NCEM-enabled registration cell to the electron beam;
   determine an actual position of the NCEM-enabled registration cell using the response;
   align the electron beam using the actual position of the NCEM-enabled registration cell;
   direct the aligned electron beam toward an NCEM-enabled fill cell of the plurality of NCEM-enabled fill cells;
   receive a response of the NCEM-enabled fill cell to the aligned electron beam; and
   provide an indication of the response to a processor.

2. The computer-readable medium of claim 1, wherein the NCEM-enabled registration cell comprises:
   a substrate;
   a power rail electrically coupled to a power supply and mechanically coupled to the substrate;
   a ground rail electrically coupled to a ground and mechanically coupled to the substrate; and
   a floating feature mechanically, but not electrically, coupled to the substrate, the floating feature being configured to provide an easily distinguishable feature when exposed to a non-contact electrical measurement.

3. A computer-readable medium storing a set of instructions thereon, which when executed by a processor cause the processor to:
   receive a recipe for a die included in a wafer, each die of the plurality of chips being divided into a plurality of tiles, each tile including a NCEM-enabled registration cell and a plurality of non-contact electronic measurement (NCEM)-enabled fill cells, the recipe including a position for the die within the wafer and a position for each of the NCEM-enabled fill cell of the plurality of NCEM-enabled fill cells;
   determine an expected position of a NCEM-enabled registration cell included in a tile of the plurality of tiles;
   scan the NCEM-enabled registration cell using an electron beam;
   receive an indication of a response of the NCEM-enabled registration cell to the scanning;
   determine an actual position of the NCEM-enabled registration cell using the response;
   align the electron beam using the actual position of the NCEM-enabled registration cell;
   sequentially direct the aligned electron beam toward each of NCEM-enabled fill cells of the plurality of NCEM-enabled fill cells within the tile of the plurality of tiles;

receive an indication of a response of each of the NCEM-enabled fill cells to the aligned electron beam; and provide an indication of the response to a processor.

4. The method of claim 3, wherein responses of NCEM-enabled fill cells to the electron beam are received from a plurality of tiles of in an array of chips included in the wafer, each respective tile and chip of the array being configured to be identical to one another and the set of instructions, which when executed by the processor further cause the processor to:

compare the received responses to one another to determine whether there are any outlying responses; and provide a result of the comparison to a processor.

5. A computer-readable medium storing a set of instructions thereon, which when executed by a processor cause the processor to:

receive a recipe for a die included in a wafer, the die including a plurality of chips, each of the chips being divided into a plurality of tiles, each tile including a NCEM-enabled registration cell and a plurality of non-contact electronic measurement (NCEM)-enabled fill cells, the recipe including a position for the die within the wafer, contents of the wafer, and a position for the contents of the wafer;

receive a selection of an array of chips included in the wafer to test using a non-contact electronic measurement (NCEM), each chip of the array being configured to be identical to one another;

identify a target region in each of the chips included in the array, direct an electron beam toward the target region for each chip in the array;

receive an indication of a response of each target region to the electron beam;

compare the received indications to one another to determine whether there are any outlying indications; and provide a result of the comparison to a processor.

* * * * *